(12) United States Patent
Mansouri et al.

(10) Patent No.: US 12,502,834 B2
(45) Date of Patent: Dec. 23, 2025

(54) MULTI-STAGE WASH SYSTEM FOR VAT POLYMERIZATION-BASED 3D PRINTED PARTS

(71) Applicant: SprintRay Inc., Los Angeles, CA (US)

(72) Inventors: Amir Mansouri, Los Angeles, CA (US); Hossein Bassir, Los Angeles, CA (US); Huijian Tian, Los Angeles, CA (US); Shukun Ye, Los Angeles, CA (US); Aayush Patel, Los Angeles, CA (US); Hang Ye, Los Angeles, CA (US)

(73) Assignee: SprintRay, Inc., Los Angeles, CA (US)

( * ) Notice: Subject to any disclaimer, the term of this patent is extended or adjusted under 35 U.S.C. 154(b) by 34 days.

(21) Appl. No.: 18/113,544

(22) Filed: Feb. 23, 2023

(65) Prior Publication Data

US 2023/0202110 A1 Jun. 29, 2023

Related U.S. Application Data

(63) Continuation-in-part of application No. 17/678,996, filed on Feb. 23, 2022, now Pat. No. 11,833,756, (Continued)

(51) Int. Cl.
*B29C 64/35* (2017.01)
*B08B 3/02* (2006.01)
(Continued)

(52) U.S. Cl.
CPC ............... *B29C 64/35* (2017.08); *B08B 3/02* (2013.01); *B08B 3/04* (2013.01); *B08B 3/104* (2013.01);
(Continued)

(58) Field of Classification Search
CPC ................................... B01D 5/0042
See application file for complete search history.

(56) References Cited

U.S. PATENT DOCUMENTS 3,599,872 A 8/1971 Guth
3,674,650 A * 7/1972 Fine .................... B01D 24/047
203/DIG. 16
(Continued)

FOREIGN PATENT DOCUMENTS

EP 0691099 A2 1/1996
GB 2151464 A 10/1984
(Continued)

*Primary Examiner* — Natasha N Campbell
(74) *Attorney, Agent, or Firm* — Jafari Law Group, Inc.

(57) ABSTRACT

The invention is a system for drying, recycling, and washing off residual resin from 3D-printed objects. Some aspects of the invention include a system for recycling solvents used to clean the 3D-printed objects in a washing chamber. The recycling system may include one or more solvent reservoirs that store a solvent for cleaning residual 3D-printing material off of 3D-printed objects, a wash chamber adapted to clean the 3D-printed objects, and a solvent recycling module. The solvent recycling module receives a saturated solvent from the one or more solvent reservoirs, evaporates or condenses the saturated solvent to remove residual 3D-printing material from the saturated solvent, and returns clean solvent to the one or more solvent reservoirs of the system.

19 Claims, 63 Drawing Sheets

Related U.S. Application Data which is a continuation of application No. 17/142,942, filed on Jan. 6, 2021, now Pat. No. 11,279,089.

(60) Provisional application No. 62/957,645, filed on Jan. 6, 2020.

(51) Int. Cl.

| | | |
|---|---|---|
| *B08B 3/04* | (2006.01) | |
| *B08B 3/10* | (2006.01) | |
| *B29C 64/245* | (2017.01) | |
| *B29C 64/386* | (2017.01) | |
| *B33Y 30/00* | (2015.01) | |
| *B33Y 40/20* | (2020.01) | |
| *B33Y 50/00* | (2015.01) | |

(52) U.S. Cl.
CPC .......... *B29C 64/245* (2017.08); *B29C 64/386* (2017.08); *B08B 2220/04* (2013.01); *B33Y 30/00* (2014.12); *B33Y 40/20* (2020.01); *B33Y 50/00* (2014.12)

(56) References Cited

U.S. PATENT DOCUMENTS

| | | |
|---|---|---|
| 5,248,456 A | 9/1993 | Evans, Jr. et al. |
| 2002/0179425 A1* | 12/2002 | Dableh ................ B01D 5/0036 203/1 |
| 2005/0233261 A1 | 10/2005 | Slaughter |
| 2009/0283109 A1 | 11/2009 | Moussa et al. |
| 2010/0059091 A1 | 3/2010 | Meissner |
| 2011/0186081 A1 | 8/2011 | Dunn et al. |
| 2013/0075957 A1 | 3/2013 | Swanson et al. |
| 2018/0179682 A1 | 6/2018 | Kim et al. |
| 2018/0215096 A1 | 8/2018 | McMahon |
| 2020/0078831 A1* | 3/2020 | Converse ................ B29C 64/20 |
| 2020/0103857 A1 | 4/2020 | Wynne et al. |
| 2020/0324479 A1* | 10/2020 | Friedrich ................ B08B 3/10 |
| 2022/0001621 A1 | 1/2022 | Schultheiss |

FOREIGN PATENT DOCUMENTS

| | | |
|---|---|---|
| GB | 8427019 | 12/1986 |
| JP | 2004298117 | 10/2004 |

\* cited by examiner

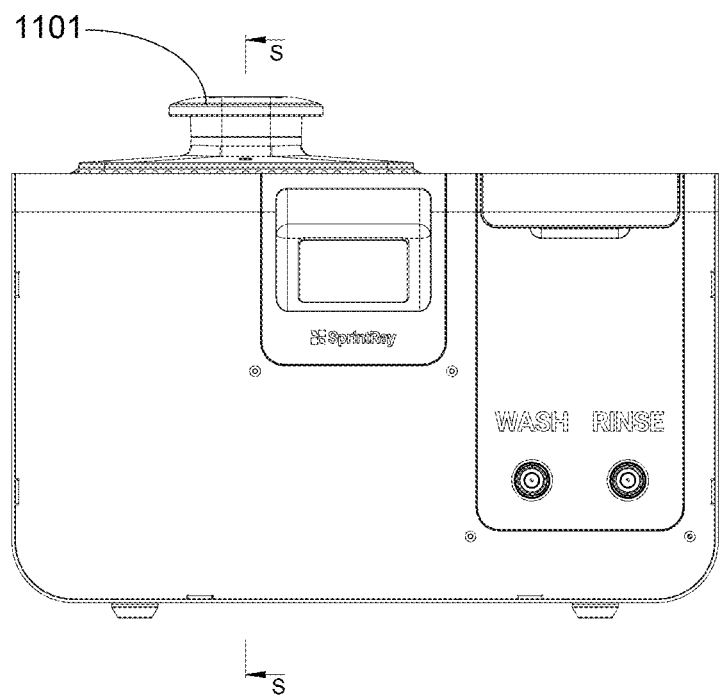
FIG. 12A
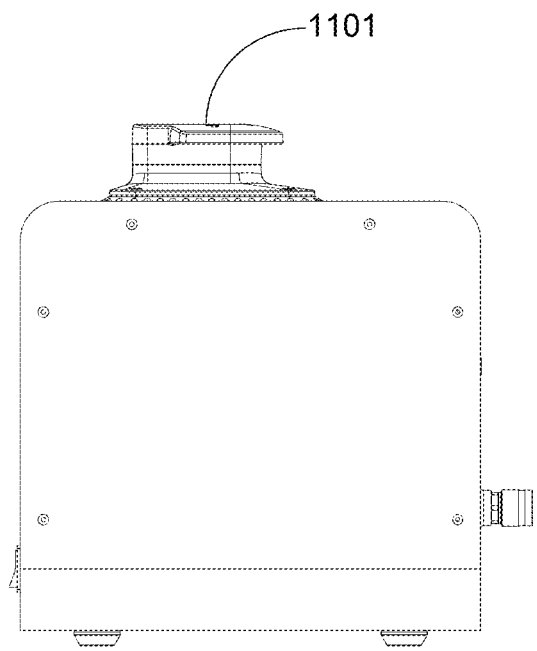 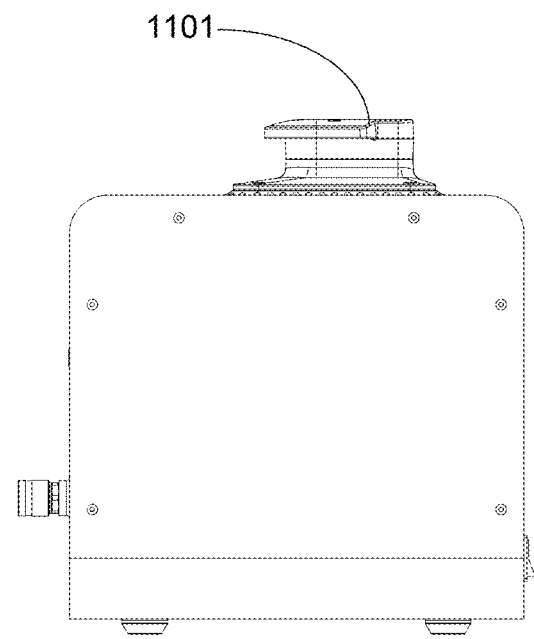
FIG. 12B          FIG. 12C

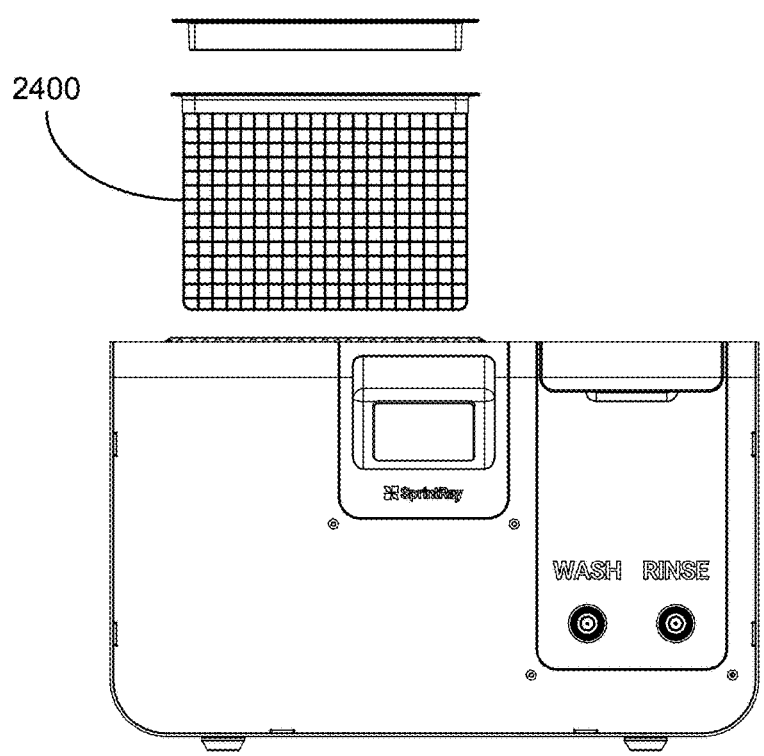
FIG. 25A
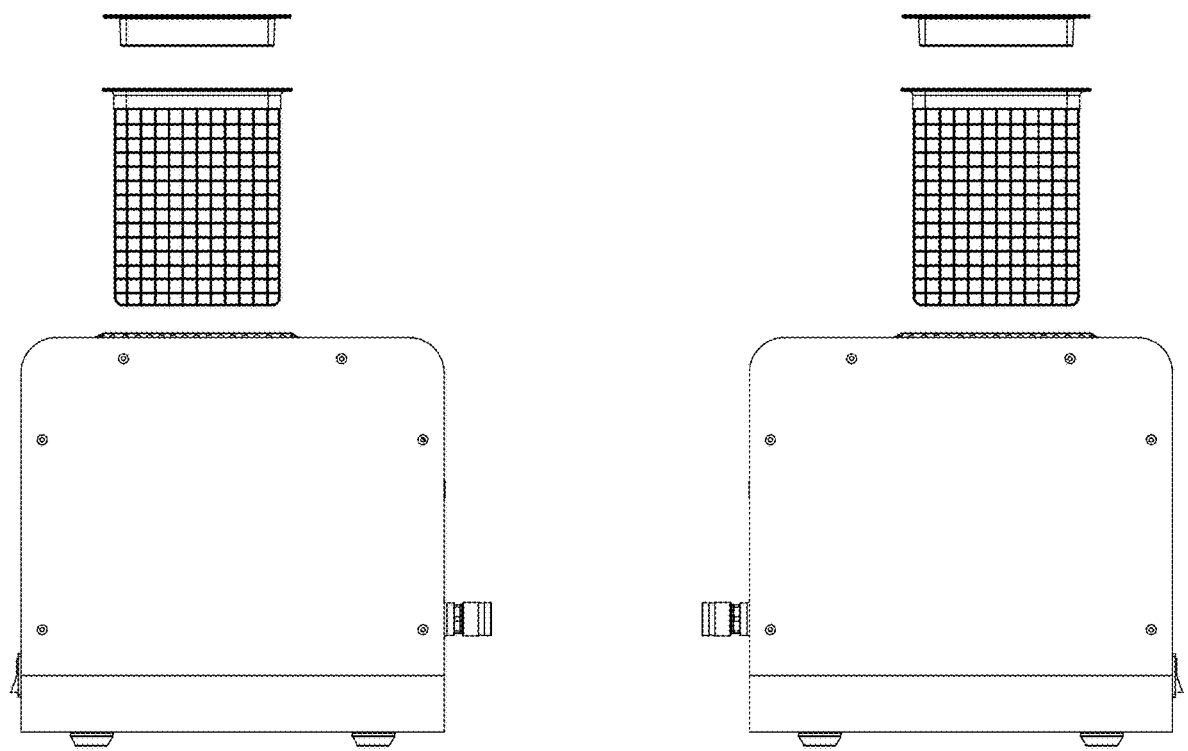
FIG. 25B　　　　　FIG. 25C

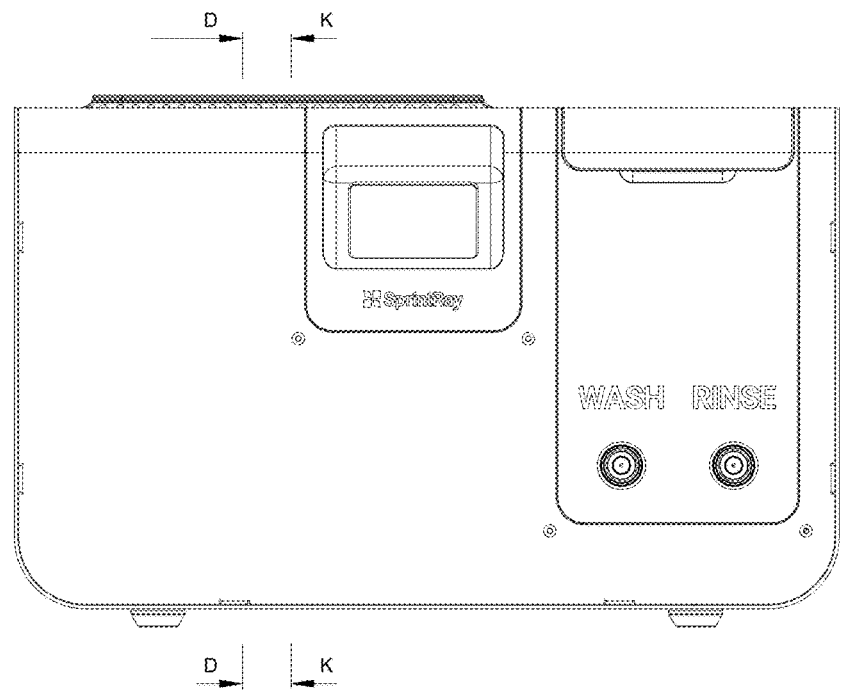
FIG. 35A
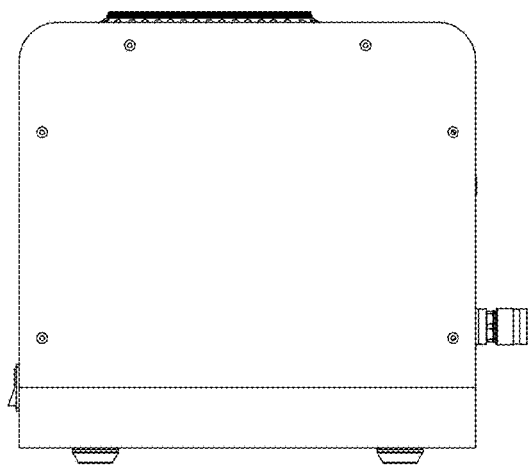 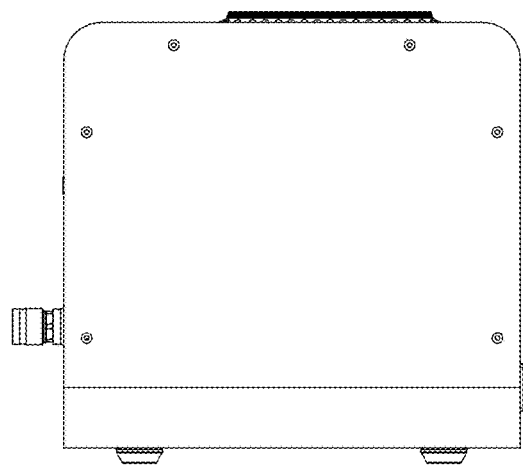
FIG. 35B    FIG. 35C

Section K-K

Section D-D

MULTI-STAGE WASH SYSTEM FOR VAT POLYMERIZATION-BASED 3D PRINTED PARTS

PRIORITY AND RELATED APPLICATIONS

This application is a continuation-in-part application of U.S. Non-Provisional application Ser. No. 17/678,996, filed on Feb. 23, 2022, which is a continuation of U.S. Non-Provisional application Ser. No. 17/142,942, filed on Jan. 6, 2021, which claims priority to U.S. Provisional Application No. 62/957,645, filed on Jan. 6, 2020, the disclosure of each of these prior applications incorporated by reference in their entirety.

TECHNICAL FIELD OF THE INVENTION

The present invention primarily relates to a system for washing off the uncured or residual resin from objects which are three-dimensionally (3D) printed. Particularly, the present invention relates to a multi-stage wash system for use in removing residual resin from objects that are 3D printed through a vat polymerization (VP) process.

COPYRIGHT AND TRADEMARK NOTICE

A region of the disclosure of this patent application may contain material that is subject to copyright protection. The owner has no objection to the facsimile reproduction by anyone of the patent document or the patent disclosure, as it appears in the Patent and Trademark Office patent file or records, but otherwise reserves all copyrights whatsoever.

Certain marks referenced herein may be common law or registered trademarks of third parties affiliated or unaffiliated with the applicant or the assignee. Use of these marks is by way of example and should not be construed as descriptive or to limit the scope of this invention to material associated only with such marks.

BACKGROUND OF THE INVENTION

Three-dimensional printing, also known as additive manufacturing (AM), rapid prototyping (RP), or solid free-form fabrication (SFF), is an advanced manufacturing process to additively create 3D objects from computer-aided design (CAD) data directly. The machine which performs the process is called a 3D printer. Compared with traditional manufacturing processes, such as milling, drilling, and injection molding, in which the object is fabricated through removing excess material from a block or changing the shape of the material, 3D printing fabricates 3D objects through selectively depositing material or energy on a single layer, and then accumulating layers one upon another to form 3D objects. Because of its unique means to create 3D objects, parts with complex shapes and intricate geometric features, which are usually not accessible through traditional manufacturing processes, could be fabricated through 3D printing. 3D printing is a collection of different techniques including vat polymerization, fused deposition modeling (FDM), selective laser sintering (SLS), etc.

Vat polymerization is one of the most popular 3D printing processes in the market nowadays. It uses a solution which is a mixture of photosensitive monomer and/or oligomer and certain photo initiator as the raw material. This photosensitive material may be a resin which is originally in the liquid state. When the resin is exposed to a light source with a certain wavelength, the photo initiator inside the resin may reach excited state to create a reactive specie, e.g., a free radical, a cation, or an anion. The reactive specie opens the π-bond of the monomer or oligomer and appends itself to the monomer or oligomer to form a new radical, cation, or anion. This process is repeated, and many more monomers and/or oligomers are successively added to the reactive species to form a polymer with a crosslinked network. In this process, the state of the resin turns from liquid into solid.

Vat polymerization process creates 3D objects by selectively solidify the resin layer by layer. Depending on the light source, there are several major types of VP processes, including stereolithography (SLA)-based VP which uses a laser as the light source, digital light processing (DLP)-based VP, and liquid crystal display (LCD)-based VP. All of these types of VP processes use liquid resin as the raw material and form 3D objects from a resin vat.

In VP processes, as 3D objects are created from the liquid resin container, and the printing part and/or the platform need to be immersed or partially immersed into the liquid resin, it is inevitable that residual resin in the liquid state stays on the surface of the 3D printed parts. Usually, a wash process is necessary to remove all the residual resin before sending the 3D printed parts for post curing, otherwise, the accuracy could be compromised. This is because the residual resin gets cured in a position during post curing, which results in an incremental change in dimensions of the object.

Furthermore, after being solidified, the hardened polymers are almost non-toxic, however, the exposure to uncured resin can be harmful, and it may contain a substance that is toxic and/or carcinogenic. Thus, it is desirable to have a wash process, through which the uncured or residual resin is completely removed from the surface of 3D printed parts, to complement the VP-based 3D printing processes.

Compared with other 3D printing technologies, VP-based 3D printing is one of the most accurate processes. Because of this, it is also one of the most popular processes in the market. With the advancement of technology and enhancement in printing speed, resolution, and reliability, VP-based 3D printing has been widely used in various fields recently, including dentistry, orthodontics, audiology, and jewelry. As a result, the necessity of some peripherals which can smoothen and facilitate the post process of VP-based 3D printing becomes more and more prominent. Similar to other commercial products, these peripherals are expected to be compact, efficient, reliable, user friendly, easy to operate, and cost effective. Such 3D printed parts from resin-based 3D printing always have a layer of uncured resin which needs additional processing. Post processing of 3D printed parts to remove surface resin is facilitated by addition of a solvent to improve the fluidity of resin. Systems target at, submerging or splashing surfaces of 3D printed parts using solvents like, IPA or Ethanol. This process can be termed as the washing process, since its main aim is to remove the excess resin from the surface.

The washing process inevitably leaves a layer of solvent on the surface of the models, which can only be further processed once the layer of solvent is removed. Current systems remove the layer of solvent by exposing to open air and artificial airflow. Since the solvent is volatile, over a period of time, depending on the surface area of 3D printed parts, the parts surface becomes completely void of solvent. The existing systems present parts to the user which have solvent on the surface. The user uses a different appliance to create artificial airflow, which increases the rate of evaporation.

One approach to clean the 3D printed models uses solvents. The solvents commonly used during the wash process are materials like Isopropyl Alcohol (IPA) or Ethanol. During wash process, the IPA is splashed onto the 3D printed model to remove the residual resin present in the surface of the models. However, this type of wash stationery systems consumes large amount of solvents. These materials are hazardous materials and need a chemical disposal process after its use in the wash process. Further, few alternate approaches are intended to clean the 3D printed models. The 3D printing models using Stereolithography (SLA) methods always leaves behind a layer of resin on the parts. This resin is not washed well, which can cause the parts to be out of dimension and/or create a mess for the user to deal with.

Accordingly, it would be highly desirable to develop a wash system for VP-based 3D printing processes to fulfill the requirement in commercial applications and improve on the efficiency and efficacy of the conventional washing systems. Also, it would be highly desirable to implement a drying feature to remove solvent from the surface of 3D printed parts during post cleaning. In addition, it would be highly desirable to develop a recycling feature to resolve the disposal of large quantities of solvent. Further, it would be highly desirable to develop a washing feature to clean the 3D printing parts using an agitation mechanism. It is to these ends that the present invention has been developed.

SUMMARY OF THE INVENTION

According to the present invention, a wash system and method for removing the uncured or residual resin from the surface of objects which are created through a vat polymerization-based 3D printing process and removing residual wash solvent from the surface of the 3D printed objects, is described. The residual resin and wash solvent removal process described in the present invention includes multiple stages, and different stages serve different purposes. The multi-stage wash system for vat polymerization 3D printed parts is efficient, reliable, and easy to operate.

There are two major families of base monomers used in VP processes: 1) acrylicmethacrylic-based resin which can be crosslinked through radical polymerization; and 2) epoxy or vinyl ether-based resin which can be crosslinked through cationic polymerization. To remove the uncured or residual resin on the surface of 3D printed objects, traditionally, repetitive baths with chemicals, including acetone, isopropyl alcohol (IPA), or tripropylene glycol monomethyl ether (TPM), are used. The entire process of the bath can be broken down into the following steps:

1. Refill the wash reservoir with a predetermined volume of wash solvent;
2. Immerse the 3D printed objects with residual resin on their surface into the wash solvent;
3. Agitate the wash solvent for a certain period of time;
4. Take out the 3D printed objects from the wash reservoir; and
5. Air-dry the objects.

Depending on the result after wash at step 3, it may be necessary to give the 3D printed objects another round of wash to achieve satisfactory cleanliness. A final rinse with water may also be engaged into the entire wash process to remove the trace of the wash solvent used for baths.

In terms of the method adopted for agitating the wash solvent, there are two types of agitating methods: contact and non-contact. In contact stirring, a stirring device, such as a propeller or a magnetic bar, may be directly placed into the wash solvent, and it spins quickly to agitate the wash solvent when a rotating motor or a rotating magnetic field is employed. In non-contact stirring, nothing is in direct contact with the wash solvent. Instead, it creates turbulence in the wash solvent through an external mechanical oscillator or ultrasound oscillator.

A wash system for cleaning 3D objects printed through VP-based 3D printing processes may broadly comprise of a cartridge or receptacle that is used to store the wash solvent, a wash reservoir in which the removal of uncured resin from the surface of 3D printed objects happens, an automatic stirring device to agitate the wash solvent to wash off the uncured resin more efficiently, and an air-drying system.

According to some exemplary embodiments of the present invention, a system for removing the residual resin from the surface of objects which are created through a vat polymerization-based 3D printing process and removing residual wash solvent from the surface of objects, may comprise: a wash solvent reservoir or receptacle; a wash reservoir in fluid communication with the wash solvent receptacle; and a controller configured to pump a wash solvent from the wash solvent receptacle to the wash reservoir for washing off residual resin from objects that are 3D printed through a VP process.

According to some exemplary embodiments of the present invention, a system for washing 3D printed objects may include a resin concentration monitoring module.

According to some exemplary embodiments of the present invention, a system for washing 3D printed objects may include a wash reservoir with an anti-splashing adapter for a build platform to prevent wash solvent from splashing or spilling from the wash reservoir.

According to some exemplary embodiments of the present invention, a system for washing 3D printed objects may include multiple pumps to refill or drain the wash reservoir, including automatic valves to direct and control the flow of the wash solvent, and or check valves to prevent an unwanted reverse flow of the wash solvent.

According to some exemplary embodiments of the present invention, a system for washing 3D printed objects may include an observation window through which the user can observe the whole process.

According to some exemplary embodiments of the present invention, a system for washing 3D printed objects may include a wash reservoir with one inlet and one outlet which are used to refill and drain the wash reservoir, respectively. The inlet and outlet may include barbs to securely fasten the tubing and prevent leakage. The wash reservoir may also include a mesh which is expected to prevent printed 3D printed objects or parts thereof from directly hitting a rotatory component during a wash or air-drying process. The material of the mesh may be preferably compatible with both the wash solvent and the resin. The bottom of the wash reservoir may be slightly slanted and coated with a thin layer of hydrophobic and/or oleophobic coating, e.g., Teflon, to help drain the wash reservoir completely.

According to some exemplary embodiments of the present invention, a system for washing 3D printed objects may include an adapter for the wash reservoir on which the build platform from a specific VP-based 3D printer can directly sit. The adapter may include an anti-splashing design, so the agitated wash solvent cannot come out of the wash reservoir during the wash process, however, it allows the necessary circulation of the air flow during the air-drying process.

According to some exemplary embodiments of the present invention, a system for washing 3D printed objects may include a resin concentration monitoring module for measuring the resin concentration of the wash solvent in real time. The resin concentration monitoring module gives feedback to the entire wash system based on which the wash system can determine whether the wash solvent is suitable for wash or needs to be replaced. After each wash, the uncured resin goes into the wash solvent, and thus, the resin concentration in the wash solvent increases. The wash solvent used in the present invention is preferably configured for multiple uses and may be repeatedly used until the resin concentration reaches a certain level beyond which the wash process is not efficient anymore. Accordingly, in some exemplary embodiments, a user may be required to replace the wash solvent. This may be achieved in various manners depending on the specifications of the resin concentration monitoring module. For example, and without limiting the scope of the present invention, the following are exemplary embodiments of a resin concentration monitoring module in accordance with the present invention:

Detecting Change in Density:

For a commonly used wash solvent, such as acetone, IPA, or TPM, its density is usually smaller than that of the resin. To be more specific, the density for acetone is $0.788 \times 10^3$ $kg/m^3$, the density for IPA is $0.785 \times 10^3$ $kg/m^3$, and the density for TPM is $0.975 \times 10^3$ $kg/m^3$. Compared with the density of the aforementioned solvents, the density for photosensitive resin is usually greater than $1.1 \times 10^3$ $kg/m^3$. When more photosensitive resin is dissolved into the wash solvent, the density of the wash solvent also increases. Based on the change of the wash solvent density, a density-based sensor, e.g., hydrometer, can be used to monitor the resin concentration in the wash solvent.

Detecting Change in Pressure:

Besides directly using density change to indicate the resin concentration of the wash solvent, the pressure change at a certain location can also be used for this purpose. The pressure (P) in a static liquid is proportional to both the liquid density ($\rho$) and the depth (h) in the liquid which can be represented as $P=\rho gh$, where g is the gravitational constant. Therefore, the pressure change at a certain depth in the wash solvent can reflect the wash solvent density change, and further indicate the concentration change of the wash solvent.

Detecting Change in Opacity:

Another method to monitor the concentration change of the wash solvent is to evaluate the opacity of the wash solvent. For commonly used wash solvent, such as acetone, IPA, or TPM, it usually has a high transparency. With the increasing of the resin concentration, the transparency decreases. This change can be detected by a photosensitive sensor, such as a photoresistor. For a given light source, the resistance of a photoresistor increases with decreasing incident light intensity which is caused by increasing media opacity between the light source and the photoresistor. Therefore, the opacity can be used to indicate the resin concentration in the wash solvent.

According to some exemplary embodiments of the present invention, a system for washing 3D printed objects may include a predetermined volume of wash solvent. The wash solvent may be added into the wash reservoir through an auto refilling system which includes a pump, valves and tubing. Before the wash process starts, the pump may transport the wash solvent from the wash solvent reservoir to the washing reservoir until the predetermined volume is achieved. A liquid level measuring module can be used to check the volume of the wash solvent and determine whether to stop feeding the wash reservoir.

In some exemplary embodiments, the aforementioned photosensitive sensor can also serve to monitor whether the predetermined volume is achieved. The photosensitive senor may be mounted at a certain height on the wash reservoir which reflects the predetermined volume. Before the wash solvent reaching that height, the gap between the photosensitive sensor and the light source is filled with air. Once the liquid level achieves that height, the same gap is filled with the wash solvent whose transparency is usually lower than that of the air. This change in transparency can be monitored by a photosensitive sensor, such as a photoresistor. Once the drop in the transparency is observed, the auto refilling system stops feeding the wash reservoir. Therefore, the volume in the wash reservoir is the predetermined amount.

According to some exemplary embodiments of the present invention, a system for washing 3D printed objects may be configured for removing residual wash solvent from the surface of objects after the wash process. The residual wash solvent removal process introduced by the present invention may include an air-drying system. The air-drying system may be compact, reliable and easy to operate.

According to some exemplary embodiments of the present invention, a system for washing 3D printed objects may include solvent cartridges that are removable and replaceable to store the wash solvent. The cartridges may be compact and interchangeable.

According to some exemplary embodiments of the present invention, a system for washing 3D printed objects may be configured to perform a multi-stage residual resin removal process, e.g., two stages: preliminary wash and fine wash. The majority of the residual resin, i.e., 85%, 90%, or 95%, may be removed during the preliminary wash, and the remaining liquid resin on the 3D printed objects, i.e., 15%, 10%, or 5%, may be washed off during the fine wash. In some embodiments, the wash solvent for each wash stage comes from an exclusive or separate wash solvent cartridge or solvent compartment in a solvent receptacle.

According to some exemplary embodiments of the present invention, a system for washing 3D printed objects may be configured to perform a multi-style residual resin removal process, i.e., rinsing, splashing, and jetting. Different wash styles may stem from the wash solvent level and the liquid flow rate. In a rinsing style, the 3D printed objects may be fully immersed into the wash solvent, and the wash solvent may be agitated gently. In this case, the residual resin may be removed mainly by dissolving into the wash solvent. In a splashing style, an agitator may be immersed into the wash solvent, and the wash solvent may be agitated with a medium speed. In this case, the residual resin may be removed by both dissolving into the wash solvent and washing off by the solvent flow. In a jetting style, the liquid level may be lower than the agitator, and the wash solvent may be agitated with a high speed. In this case, the residual resin may be removed mainly by washing off by the high-speed solvent flow. Generally, jetting is more effective than splashing, and splashing is more effective than rinsing. However, higher agitating rates may cause more solvent loss for each wash. Therefore, the material property and resin concentration in the wash solvent may need to be taken into consideration when selecting the wash style for each stage.

According to some exemplary embodiments of the present invention, a system for washing 3D printed objects may be configured to adaptively change the duration for each wash stage based on the resin type, the residual resin amount, the resin concentration in the wash solvent, and the wash style.

According to some exemplary embodiments of the present invention, a method for washing off residual resin from objects that are 3D-printed through a vat polymerization process, and removing residual wash solvent from the surface of the 3D printed objects, may include pumping a first solution of a plurality of solvent solutions from a solvent receptacle to a wash reservoir of the system, wherein the wash reservoir is adapted to enclose a 3D-printed object, by activating a pump of solvent disperser adapted to facilitate a flow of the plurality of solvent solutions between the wash reservoir and the solvent receptacle; dispersing the first solutions onto the 3D-printed object by activating an agitator of the solvent disperser adapted to disperse the plurality of solvent solutions onto the 3D-printed object; pumping the first solution from the wash reservoir to the solvent receptacle in order to substantially remove the first solution from the wash reservoir; pumping a second solution of the plurality of solvent solutions from the solvent receptacle to the wash reservoir; and dispersing the second solution onto the 3D-printed object.

According to some exemplary embodiments of the present invention, a method in accordance with the present invention may include activating an agitator to create an airflow and dry the 3D-printed object.

According to some exemplary embodiments of the present invention, a method in accordance with the present invention may include filling up the wash reservoir with a solution so that the 3D-printed object inside the wash reservoir is fully submerged in the solvent during a rinsing cycle.

According to some exemplary embodiments of the present invention, a method in accordance with the present invention may include filling up the wash reservoir with a solution so that a propeller of the agitator is fully submerged in the solvent during a splashing cycle.

According to some exemplary embodiments of the present invention, a method in accordance with the present invention may include filling up the wash reservoir with a solution so that a solvent level inside the wash reservoir is lower than a portion of a propeller of the agitator during a jetting cycle.

According to some exemplary embodiments of the present invention, a method in accordance with the present invention may include monitoring a resin concentration inside the solvent receptacle using one or more sensors including an optical sensor, a density sensor, or a pressure sensor.

According to an exemplary embodiment of the present invention, a system for washing off residual resin from 3D-printed objects comprises a wash reservoir containing a wash solvent or liquid solvent and a propeller fully or partially submerged into the wash solvent. The propeller is configured to splash the wash solvent upwards to disperse on the 3D printed object, thereby largely washing away the resin residue present in the 3D printer object.

According to an exemplary embodiment of the present invention, the system further comprises a fan module connected to the wash reservoir configured to create a positive air pressure inside the wash reservoir, thereby redirecting the airflow to the wash reservoir. The fan module is any one of a centrifugal fan, an axial fan, a blower, an air pump, and a combustion-based thruster. In an embodiment, the axial fan is connected to the wash chamber via an adapter, thereby redirecting the airflow into the wash reservoir. In an embodiment, the centrifugal fan is connected to the outside of the wash reservoir via a conduit, thereby redirecting the pressure created at outside to the wash reservoir. In an embodiment, the combustion-based thruster creates an exothermic reaction configured to facilitate the generation of a pressure gradient. The pressure gradient is perpendicular to an opening for the conduit.

According to an exemplary embodiment of the present invention, the system further one or more air exchange vents provided between a splash guard and a platform/lid of the wash reservoir configured to act as an air intake when the fan module blows air out of the wash reservoir and as an exhaust vice versa.

According to an exemplary embodiment of the present invention, the system further comprises one or more barriers include a conduit barrier, a valve barrier, an air barrier, and one or more flow reducing structures to avoid the wash solvent to flow out of the wash reservoir. The conduit barrier utilizes a conduit between the fan module and the wash reservoir configured to avoid the wash solvent flowing from the wash reservoir to the fan module. The conduit comprises one or more built-in filters configured to impede the flow of wash solvent. The valve barrier utilizes a one-way flow valve configured to restrict the flow of wash solvent and support the flow of air into/from the wash reservoir. In one embodiment, the one-way flow valve is activated by an external field or electric filed. The one-way flow valve includes, but not limited to, an umbrella valve, a sleeved duckbill valve, a cross-opening valve, or any other soft material valves that are opened through activation using an airflow.

According to an exemplary embodiment of the present invention, the fan module creates the positive or negative pressure to act as the air barrier configured to counteract the wash solvent flowing from the wash reservoir to the outside. The positive or negative air pressure is regulated on the higher end to avoid the blow off of wash solvent by the fan module through the exhaust air vents.

According to an exemplary embodiment of the present invention, a system for washing off residual resin from 3D-printed objects comprises a wash reservoir pressed between a rubber gasket and a tension ring. The rubber gasket seals against the wash reservoir, wherein the wash reservoir contains a wash solvent or liquid solvent and a propeller fully or partially submerged into the wash solvent. The propeller is configured to splash the wash solvent upwards to disperse on the 3D printed object, thereby largely washing away the resin residue present in the 3D printer object.

According to an exemplary embodiment of the present invention, the system further comprises an adapter configured to hold a fan module on the tension ring and a one-way flow valve positioned on an adapter front end. The fan module is connected to the wash reservoir configured to create a positive or negative air pressure inside the wash reservoir, thereby redirecting the airflow to the wash reservoir for washing off residual resin from 3D-printed objects.

According to an exemplary embodiment of the present invention, the system further comprises a conduit configured to connect the fan module to the wash reservoir for creating one or more shadow regions, thereby restricting the flow of wash solvent from the wash reservoir to the conduit.

According to an exemplary embodiment of the present invention, the propeller and fan combination provides uniform airflow to the entire wash reservoir. The adapter front end has a smooth slope to facilitate the flow of wash solvent under gravity. The adapter comprises a groove with side walls to hold a one-way flow valve configured to create the shadow region on the one-way flow valve to flow down the wash solvent. The adapter further comprises a plurality of air holes and a larger air opening configured to provide air movement. The plurality of holes are angled horizontally in a way to create a flow back of wash solvent in to the wash reservoir during leakage.

According to an exemplary embodiment of the present invention, a system for recycling solvents used to clean 3D-printed objects comprises one or more solvent reservoirs configured to store the solvent topped by a user. The one or more solvent reservoirs include a saturated solvent reservoir and an unsaturated solvent reservoir. The solvent reservoirs are recycling units that are externally or internally connected to the system for recycling the saturated solvents.

According to an exemplary embodiment of the present invention, the system further comprises a wash chamber connected to one end of the solvent reservoir configured to receive solvent from the solvent reservoir. The solvent interacts with residual resin present in the 3D printed objects in the wash chamber. The solvent is saturated with the residual resin and pumped back into the solvent reservoir.

According to an exemplary embodiment of the present invention, the system further comprises a distillation chamber or distillation unit connected to another end of the solvent reservoir containing saturated resin solution to process or recycle the saturated solvent. The distillation chamber receives the saturated solvent as a batch process or continuous process. The distillation chamber comprises a heating chamber configured to account a large volume of saturated solution and heats it up as batch process.

The heating chamber is a tube or tube heat exchanger for continuous process configured to collect and heat the saturated solvent. In an exemplary embodiment, the tube heat exchanger is configured to provide volume for phase separation of solvent and resin. The tube heat exchanger is configured to provide filter media to capture resin residue from the solution.

According to an exemplary embodiment of the present invention, the heating chamber further includes a user accessible filter media configured to collect the precipitated resin at the bottom. The filter media allows higher precipitation of the consumable resin particles on the surface. The filter media accesses a cleaning fluid configured to dissolve distillation residue.

According to an exemplary embodiment of the present invention, the system further comprises a self-locking structure configured to seal the removable filter media against the heating chamber. The system further comprises a mechanical locking mechanism or spring-based locking mechanism configured to engage a spring-based locking structure with the heating chamber upon inserting the filter media. The system further comprises an ejection button to disengage the mechanical locking mechanism.

According to an exemplary embodiment of the present invention, the distillation chamber further comprises one or more cooling tubes configured to receive an evaporated volatile solvent transferred from the heating chamber. The cooling tubes are configured to condense the evaporated volatile solvent. Each cooling tube comprises a kink configured to prevent backflow of the condensed solvent.

According to an exemplary embodiment of the present invention, the distillation chamber further comprises a distilled solvent chamber placed at a lower level to the cooling tubes configured to capture the condensed solvent to enable the flow into it. The distilled solvent chamber comprises a liquid level sensor configured to ensure the solvent level before reaching the inlet of cooling tubes and create a backflow into the heating chamber. In an exemplary embodiment, the system further comprises a coupled-heating and cooling mechanism using Peltier effect configured to heat the heating chamber and cool the cooling tube.

According to an exemplary embodiment of the present invention, a system for washing off residual resin from a surface of 3D-printed objects using force field comprises a propeller. The propeller is attached at a bottom of a wash chamber configured to spin at a high momentum thereon creating a plurality of small liquid particles or droplets containing lift and rotational momentum. The lift and rotational momentum of the plurality of small liquid particles creates the force filed. The force field hits the surface of 3D printed objects and removes the resin from the surface of 3D-printed objects.

According to an exemplary embodiment of the present invention, the liquid particles include solvent that dissolves the resin from the surface. The liquid particles include solvent with low viscosity that decreases overall viscosity of a solution containing residual resin and solvent. The lift and rotational momentum of the liquid forces the low viscosity solution to move away from the surface of the 3D printed object.

According to an exemplary embodiment of the present invention, the force field is created by submerging a mixer into the wash chamber to force the liquid to come out. The system may utilize swirling in the solution to rotate the liquid configured to remove the resin from the surface of the 3D printed object.

According to an exemplary embodiment of the present invention, the force field is created by placing the 3D-printed object in a conduit with flowing liquid, thereby removing the resin away from the 3D-printed object using the flowing liquid.

According to an exemplary embodiment of the present invention, the system utilizes a non-contact force field to move the resin away from the surface of the 3D-printed object.

According to an exemplary embodiment of the present invention, the 3D-printed object is placed on a window with gravity, thereby causing the resin to move away or pulled downwards under the non-contact force field from the surface of the 3D printed object.

According to an exemplary embodiment of the present invention, the system utilizes an air-field configured to pull or push the resin away from the 3D-printed object by creating a positive or negative air-pressure.

According to an exemplary embodiment of the present invention, the system utilizes a centrifugal force field by rotating the 3D-printed object at very high speed, thereby causing the resin to move off the surface of the 3D-printed object.

According to an exemplary embodiment of the present invention, a system for washing off residual resin from a surface of 3D-printed objects using force field comprises one or more nozzles or narrow orifices. The nozzles are placed around a wash chamber containing the 3D-printed objects for cleaning. The nozzles pressurize and pass air or liquid or solvent through the one or more nozzles at a high velocity, thereby removing the resin from the 3D-printed object through imparting momentum to the resin on the surface.

According to an exemplary embodiment of the present invention, the nozzles are stationery and face in such a way that the reflection of the motion of air or liquid is directed towards the 3D-printed object.

According to an exemplary embodiment of the present invention, the nozzles have motion configured to allow the one or more nozzles to redirect towards the 3D printed objects. The motion is linear or mixture of linear and rotational motion for imparting movement transfer to the resin on the surface of the 3D-printed object.

According to an exemplary embodiment of the present invention, the resin is removed from the surface of the 3D-printed object by increasing the field or reducing the resin viscosity.

According to an exemplary embodiment of the present invention, the system utilizes resin movement aid to move the resin off the surface of 3D printed object. The resin movement aid utilizes heat to reduce the viscosity of the resin and induce the flow of resin away from the surface of the 3D-printed object. The resin movement aid utilizes solvent to dissolve the resin from the surface and reduce the viscosity to induce the flow of resin away from the surface of the 3D-printed object. The resin movement aid utilizes high frequency waves through contact or non-contact mechanisms to vibrate the surface of the 3D-printed object, thereby removing the resin from the surface of the 3D-printed object.

In some exemplary embodiments, a system for washing off residual printing material from a surface of a three-dimensionally-printed (3D-printed) object may be provided. The system may include a chamber adapted to receive the 3D-printed object; a printing material disruption module adapted to disrupt a composition of a residual printing material on a surface of the 3D-printed object; and a washing force module adapted to apply a washing force field to the 3D-printed object and wash off the residual printing material.

In some exemplary embodiments, the printing material disruption module disrupts the composition of the residual printing material on the surface of the 3D-printed object by applying heat to the residual printing material. In some exemplary embodiments, the printing material disruption module disrupts the composition of the residual printing material on the surface of the 3D-printed object by applying a sonic or ultrasonic frequency to the residual printing material. In some exemplary embodiments, the printing material disruption module disrupts the composition of the residual printing material on the surface of the 3D-printed object by applying a solvent to the residual printing material. In some exemplary embodiments, the printing material disruption module disrupts the composition of the residual printing material on the surface of the 3D-printed object by altering a viscosity of the residual printing material.

In some exemplary embodiments, the washing force module is configured to generate the washing force field by submerging the 3D-printed object in a washing solution. In some exemplary embodiments, the washing force module is configured to generate the washing force field by applying a positive or negative air pressure onto the 3D-printed object. In some exemplary embodiments, the washing force module is configured to generate the washing force field by applying a gravitational force to the 3D-printed object. In some exemplary embodiments, the washing force module is configured to generate the washing force field by applying a centrifugal force to the 3D-printed object. In some exemplary embodiments, the washing force module is configured to alter or modulate the washing force field applied to the 3D-printed object. In some exemplary embodiments, the washing force module is configured to generate the washing force field by aligning the 3D-printed object in a conduit with a flowing liquid. In some exemplary embodiments, the washing force module is configured to generate the washing force field by way of a non-contact force field that moves the residual printing material away from the surface of the 3D-printed object. In some exemplary embodiments, the washing force module includes a nozzle module adapted to at least partially direct one or more fluid streams to the 3D-printed object.

In some exemplary embodiments, the nozzle module pressurizes and directs air through the one or more nozzles at a high velocity to remove the residue printing material off from the surface of 3D-printed. In some exemplary embodiments, the nozzle module pressurizes and directs a liquid through the one or more nozzles at a high velocity to remove the residue printing material off from the surface of 3D-printed. In some exemplary embodiments, the nozzle module pressurizes and directs a solvent through the one or more nozzles at a high velocity to remove the residue printing material off from the surface of 3D-printed. In some exemplary embodiments, the one or more nozzles are stationery. In some exemplary embodiments, the one or more nozzles are adapted to shift a direction of the one or more fluid streams directed through the one or more nozzles.

In some exemplary embodiments, the system further includes actuators that shift the direction of the one or more fluid streams. In some exemplary embodiments, the system further includes a passive control module coupled to the one or more nozzles and adapted to use a momentum of the fluid flowing through the passive control module to shift the direction of the fluid stream.

In some exemplary embodiments, a system for recycling solvents used to clean 3D-printed objects may be provided. The system may include: one or more solvent reservoirs configured to store a solvent for cleaning residual 3D-printing material off of 3D-printed objects; a wash chamber adapted to clean the 3D-printed objects, the wash chamber in fluid communication with the one or more solvent reservoirs configured to receive the solvent from the one or more solvent reservoir; and a solvent recycling module in fluid communication with the one or more solvent reservoirs, configured to: receive a saturated solvent from the one or more solvent reservoirs; evaporate or condense the saturated solvent to remove residual 3D-printing material from the saturated solvent; and return clean solvent to the one or more solvent reservoirs.

In some exemplary embodiments, a system for recycling solvents used to clean 3D-printed objects may be provided. The system may include: one or more solvent reservoirs configured to store a solvent for cleaning residual 3D-printing material off of 3D-printed objects; a wash chamber adapted to clean the 3D-printed objects, the wash chamber in fluid communication with the one or more solvent reservoirs configured to receive the solvent from the one or more solvent reservoir; and a solvent recycling module in fluid communication with the one or more solvent reservoirs, configured to: receive a saturated solvent from the one or more solvent reservoirs; distill the saturated solvent to remove residual 3D-printing material from the saturated solvent; and return clean solvent to the one or more solvent reservoirs.

In some exemplary embodiments, the solvent recycling module is housed in an enclosure externally to a housing of the system or housed in an enclosure integral with the wash chamber or the one or more solvent reservoirs of the system. In some exemplary embodiments, the solvent recycling module comprises a distillation chamber adapted to remove the residual 3D-printing material from the saturated solvent. In some exemplary embodiments, the one or more solvent reservoirs include a saturated solvent reservoir and an unsaturated solvent reservoir.

In some exemplary embodiments, the recycling module is coupled to the saturated solvent reservoir. In some exemplary embodiments, the recycling module is adapted to process the saturated solvent as a batch process or as a continuous process. In some exemplary embodiments, the recycling module is adapted to heat and cool the saturated solvent using a Peltier effect. In some exemplary embodiments, the recycling module comprises a heating chamber adapted to collect the saturated solvent. In some exemplary embodiments, the heating chamber is adapted to use waste heat from the system as a heat source or a thermoelectric heater. In some exemplary embodiments, the recycling module comprises a distilled solvent chamber adapted to capture condensed distillate and enable flow into the distilled solvent chamber. In some exemplary embodiments, the recycling module comprises a filter media adapted to capture a residue from the saturated solvent or access a cleaning fluid to dissolve the residue.

In some exemplary embodiments, a system for drying off residual resin from 3D-printed objects is provided. The system may include: a wash reservoir including a chamber for housing the 3D printed object and containing a wash solvent or liquid solvent adapted to at least partially remove residual residue present in the 3D printer object; one or more air exchange vents provided between a splash guard or a lid of the wash reservoir adapted to act as an air intake or an air exhaust; and an airflow module in fluid communication with the air exchange vents and the chamber, the airflow module adapted to: create a positive or negative air pressure inside the wash reservoir for redirecting airflow to the chamber housing the 3D printed object; and blowing air out of the chamber or blowing air into the chamber to dry the 3D-printed object.

In some exemplary embodiments, the air module includes any one of a centrifugal fan, an axial fan, a blower, an air pump, or a combustion-based thruster. In some exemplary embodiments, the axial fan is connected to the wash chamber via an adapter, thereby redirecting the airflow into the wash reservoir. In some exemplary embodiments, the centrifugal fan is connected to the outside of the wash reservoir via a conduit, thereby redirecting the pressure created at outside to the wash reservoir. In some exemplary embodiments, the combustion-based thruster creates an exothermic reaction configured to facilitate the generation of a pressure gradient. In some exemplary embodiments, the pressure gradient is perpendicular to an opening for the conduit.

In some exemplary embodiments, the system further includes one or more barriers adapted to avoid the wash solvent from flowing out of the wash reservoir, including one or more of a conduit barrier, a valve barrier, an air barrier, or one or more flow reducing structures. In some exemplary embodiments, the conduit barrier utilizes a conduit between the air module and the wash reservoir configured to avoid the wash solvent flowing from the wash reservoir to the air module. In some exemplary embodiments, the conduit comprises one or more built-in filters configured to impede the flow of wash solvent. In some exemplary embodiments, the valve barrier utilizes a one-way flow valve configured to restrict the flow of wash solvent and support the flow of air into/from the wash reservoir. In some exemplary embodiments, the one-way flow valve is activated by an external field or electric filed. In some exemplary embodiments, the one-way flow valve is any one of an umbrella valve, a sleeved duckbill valve, a cross-opening valve, or any other soft material valves that are opened through activation using an airflow.

In some exemplary embodiments, the air module creates the positive or negative pressure to act as the air barrier configured to counteract the wash solvent flowing from the wash reservoir to the outside. In some exemplary embodiments, the positive or negative air pressure is regulated on the higher end to avoid the blow off of wash solvent by the air module through the exhaust air vents.

Various objects and advantages of the present invention will become apparent from the following description taken in conjunction with the accompanying drawings wherein are set forth, by way of illustration and example, certain embodiments of this invention. The drawings submitted herewith constitute a part of this specification, include exemplary embodiments of the present invention, and illustrate various objects and features thereof.

BRIEF DESCRIPTION OF DRAWINGS

Elements in the figures have not necessarily been drawn to scale in order to enhance their clarity and improve understanding of these various elements and embodiments of the present invention. Furthermore, elements that are known to be common and well understood to those in the industry are not depicted in order to provide a clear view of the various embodiments of the invention.

FIG. 12A-FIG. 12C depict a front view and side views, respectively, of the exemplary embodiment illustrated in FIG. 11A-FIG. 11B.

FIG. 25A-FIG. 25C depict an exploded view and exploded side views, respectively, of the exemplary embodiment illustrated in FIG. 23A-FIG. 24B.

FIG. 35A-FIG. 35C depict a front view and side views, respectively, of the exemplary embodiment illustrated in FIG. 11A-FIG. 11B, the housing shown in a sealed configuration with a top lid in the closed position.

DESCRIPTION OF THE INVENTION

Figure 1A:
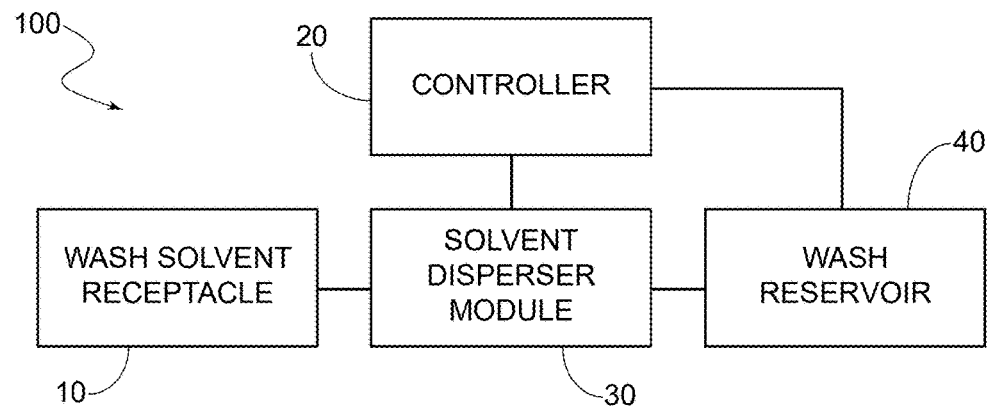
FIG. 1A is a block diagram of an exemplary system for removing the uncured residual resin from the surface of objects which are created through a vat polymerization-based 3D printing process, in accordance with the present invention.

In the following discussion that addresses a number of embodiments and applications of the present invention, reference is made to the accompanying drawings that form a part thereof, where depictions are made, by way of illustration, of specific embodiments in which the invention may be practiced. It is to be understood that other embodiments may be utilized, and changes may be made without departing from the scope of the invention. Wherever possible, the same reference numbers are used in the drawings and the following description to refer to the same or similar elements.

In the following detailed description, numerous specific details are set forth by way of examples in order to provide a thorough understanding of the relevant teachings. However, it should be apparent to those skilled in the art that the present teachings may be practiced without such details. In other instances, well known structures, components and/or functional or structural relationship thereof, etc., have been described at a relatively high-level, without detail, in order to avoid unnecessarily obscuring aspects of the present teachings.

Throughout the specification and claims, terms may have nuanced meanings suggested or implied in context beyond an explicitly stated meaning. Likewise, the phrase "in one embodiment/example" as used herein does not necessarily refer to the same embodiment and the phrase "in another embodiment/example" as used herein does not necessarily refer to a different embodiment. It is intended, for example, that claimed subject matter include combinations of example embodiments in whole or in part.

Conditional language used herein, such as, among others, "can," "could," "might," "may," "e.g.," and the like, unless specifically stated otherwise, or otherwise understood within the context as used, is generally intended to convey that certain embodiment include, while other embodiments do not include, certain features, elements and or steps. Thus, such conditional language is not generally intended to imply that features, elements and or steps are in any way required for one or more embodiments, whether these features, elements and or steps are included or are to be performed in any particular embodiment.

The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present. The term "and or" means that "and" applies to some embodiments and "or" applies to some embodiments. Thus, A, B, and or C can be replaced with A, B, and C written in one sentence and A, B, or C written in another sentence. A, B, and or C means that some embodiments can include A and B, some embodiments can include A and C, some embodiments can include B and C, some embodiments can only include A, some embodiments can include only B, some embodiments can include only C, and some embodiments include A, B, and C. The term "and or" is used to avoid unnecessary redundancy. Similarly, terms, such as "a, an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

While exemplary embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions, and changes in the form of the methods and systems described herein may be made without departing from the spirit of the invention or inventions disclosed herein. Accordingly, the following detailed description does not limit the disclosure. Instead, the proper scope of the disclosure is defined by the appended claims.

As used in this disclosure, the term "comprise" and variations of the term, such as "comprising" and "comprises", are not intended to exclude other additives, components, integers or steps.

For purpose of description herein, the terms "upper", "lower", "left", "right", "front", "rear", "horizontal", "vertical" and derivatives thereof shall relate to the invention as oriented in figures. However, it is to be understood that the invention may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristic relating to the embodiments disclosed herein are not to be considered as limiting, unless the claims expressly state otherwise.

Turning now to the figures, FIG. 1A is a block diagram of an exemplary system for removing the uncured residual resin from the surface of objects which are created through a vat polymerization-based 3D printing process, in accordance with the present invention. More specifically, FIG. 1A depicts system 100, comprising a wash solvent storage or receptacle 10, a controller 20, and a solvent disperser module 30, which may include one or more of a pump, valve(s), and tubing or conduits configures to supply the wash reservoir with a wash solvent stored in the wash receptacle, and a wash reservoir 40 in which 3D printed objects may be washed. The wash solvent receptacle 10 stores wash solvent for removing the residual resin from the 3D objects which are 3D printed through a VP-based process. The wash solvent could be acetone, IPA, TPM or water (for water-washable resin). The controller 20 controls the entire wash and air-drying process, including refill and drain the wash reservoir 40, switch on and off the agitator for wash and air-drying, etc. The pump, valve, and tubing system of solvent disperser module 30 provides the necessary power and passage to direct and transport the required wash solvent for a specific wash stage from the wash solvent receptacle 10 to the wash reservoir 40, or in the opposite direction, i.e., from the wash reservoir 40 to the wash solvent receptacle 10. The wash reservoir 40 receives the wash solvent from the wash solvent receptacle 10 and provides a space where wash and air-drying processes take place.

Figure 1B:
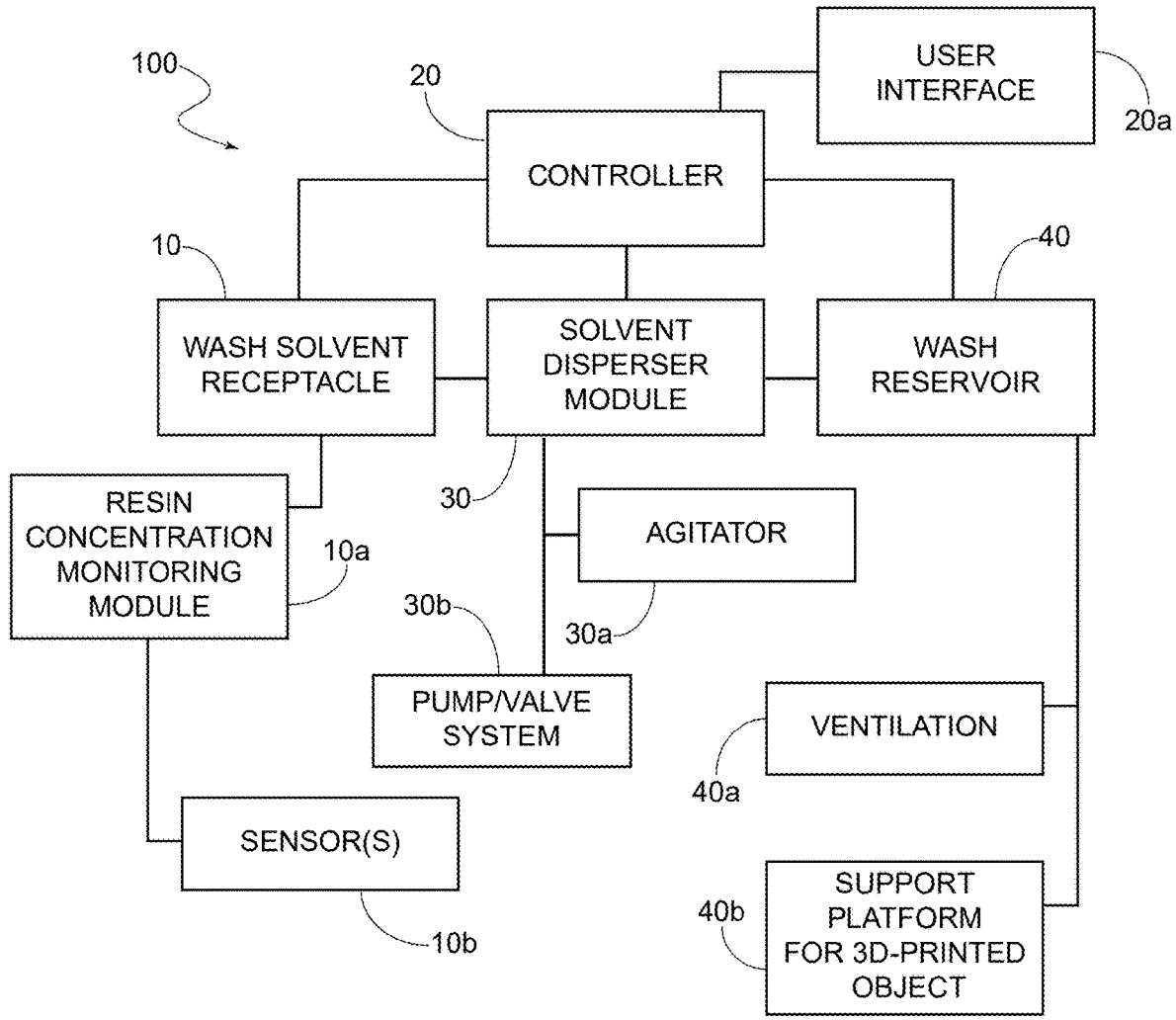
FIG. 1B is a block diagram of another exemplary system for removing the uncured residual resin from the surface of objects which are created through a vat polymerization-based 3D printing process, in accordance with the present invention.

FIG. 1B is a block diagram depicting some exemplary components of system 100 in accordance with the present invention. More specifically, FIG. 1B depicts system 100 exemplarily, and without limiting the scope of the present invention, including a resin concentration monitoring module 10a, a user interface 20a, an agitator 30a, a pump/valve system 30b, a ventilation or airflow system 40a, and a support platform 40b.

In some exemplary embodiments, which will be discussed in more detail below, a resin concentration monitoring module 10a may include one or more sensors 10b for detecting a resin concentration within wash solvent receptacle 10. This allows system 100 to detect when the solvent may need replenishment or changing. As will be discussed below, several types of sensors may be utilized without deviating from the scope of the present invention, including optical sensors, density sensors, pressure sensors, or any other type of sensor that may be suitable for detecting a resin concentration in order to monitor that the solvent being used is adequate for washing off the undecided residue from 3D printed objects.

In some exemplary embodiments, which will be discussed in more detail below, the controller 20 may include a user interface 20a for a user to program, execute, or otherwise control features of system 100. User interface 20a may be as simple as a few buttons or more complex such as a display with a touch screen. Several embodiments of a user interface in accordance with the present invention will be discussed with more detail below.

In some exemplary embodiments, which will be discussed in more detail below, the solvent disperser module may include various components, including an agitator that may be adapted for dispersing the solvent in one or multiple manners so as to maximize the washing process. For example, and without limiting the scope of the present invention, system 100 may include an agitator 30a that is configured to disperse solvent in a jetting manner, a splattering manner, and in an immersive manner. In some exemplary embodiments, the agitator may comprise of a propeller. Each means of dispersing a solvent onto a 3D printed object will be discussed with more detail below.

In some exemplary embodiments, which will be discussed in more detail below, the wash reservoir may include various components, including a ventilation or airflow system 40a for improving or facilitating an airflow within the wash reservoir. Such airflow system may facilitate a drying cycle or drying sequence activated by controller 20 to dry off the 3D printed object after one or more wash cycles.

In some exemplary embodiments, which will be discussed in more detail below, the wash reservoir may include a support platform 40b for supporting a 3D printed object being washed therein. In some exemplary embodiments, support platform 40b may include an adapter for securing a 3D printer platform, or other 3D printer component directly onto the adapter (see FIG. 2, FIG. 11A-FIG. 13). In some exemplary embodiments, support platform 40b may include a cage (see FIG. 24A-FIG. 28, for example) for enclosing the 3D printed object and preventing debris from the residue that comes off the 3D printed object from interfering with components of system 100.

Figure 2:
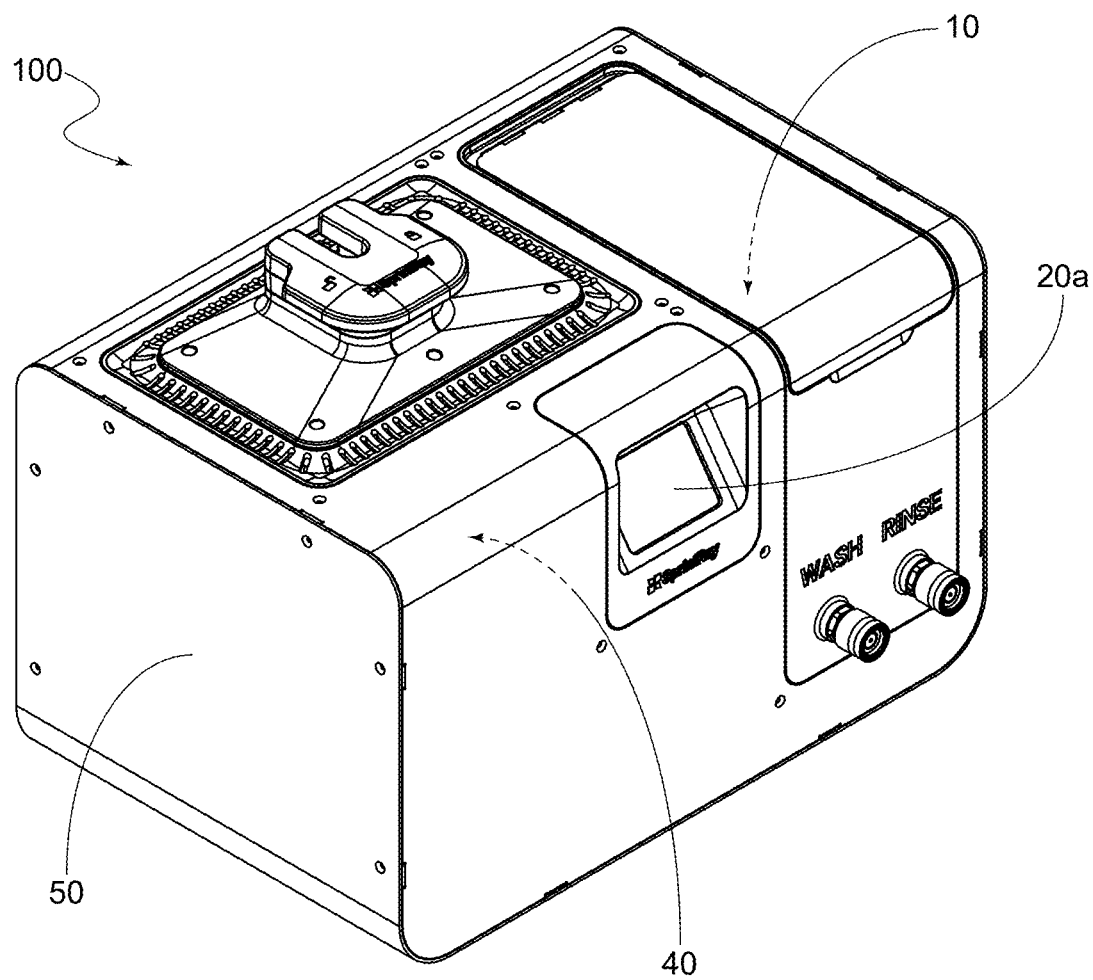
FIG. 2 is a perspective view of a multi-stage wash system for VP-based 3D printed parts according to an embodiment of the present invention.

FIG. 2 depicts a perspective view of a two-stage wash apparatus for removing the uncured residual resin from the surface of 3D objects which are created through a vat polymerization-based 3D printing process according to an embodiment of the present invention. More specifically, FIG. 2 depicts one embodiment of system 100, which includes an enclosure 50 that houses each of the components of system 100 to provide an easy-to-use appliance to the user. Enclosure 50 may be a single enclosure with multiple cavities therein, and or may be configured to hold one or more receptacles or containers therein. For example, and without limiting the scope of the present invention, enclosure 50 may include a first cavity for housing wash reservoir 40, which may be situated within a larger area or cavity of the enclosure 50. Enclosure 50 may include a second cavity for housing wash solvent receptacle 10, which may be situated within a smaller area or cavity of the enclosure 50. Disposed on or accessible via an outer surface of enclosure 50, may be user interface 20a, which allows a user to interact with system 100. Controller 20 and solvent disperser module 30 may be housed within the one or more cavities of enclosure 50 along with any other components of system 100. Enclosure 50 may be configured to receive components of system 100 therein, such as for example, cartridges that may form part or facilitate use of solvent receptacle 10, in accordance with some exemplary embodiments of the present invention, as will be discussed with reference to FIG. 3 and FIG. 4 below.

Figure 3:
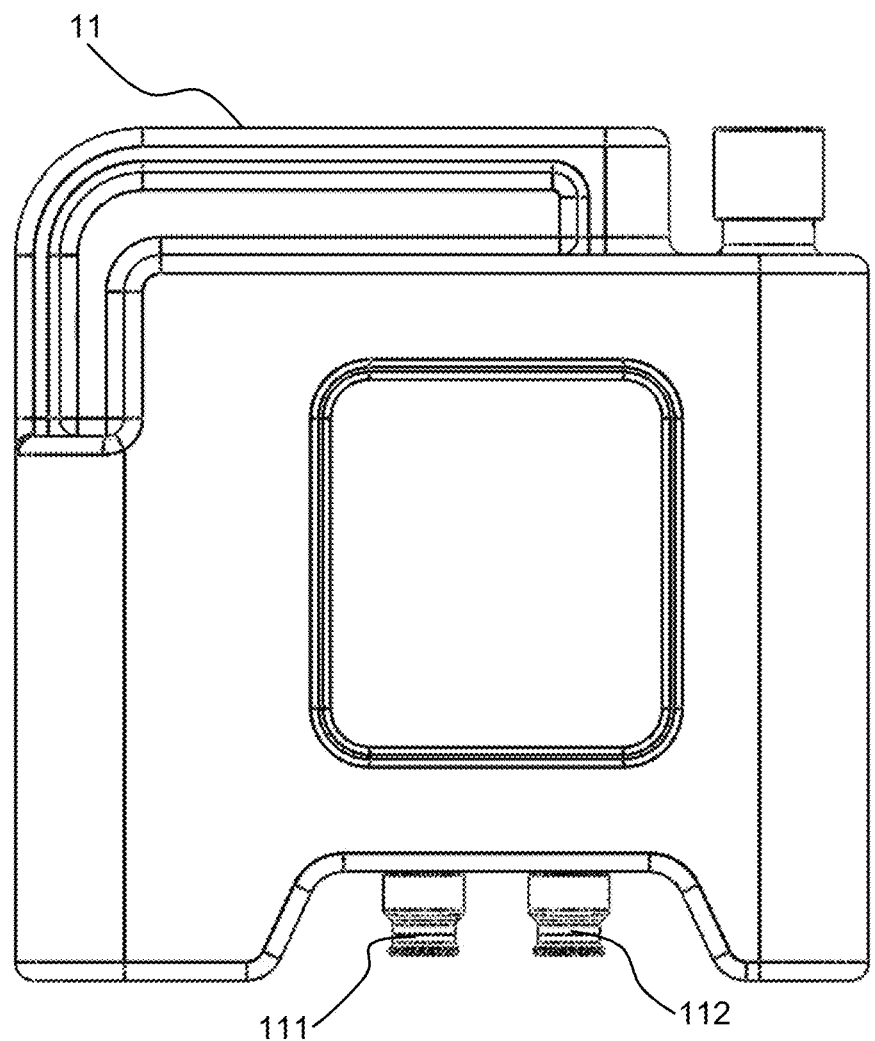
FIG. 3 is a front view of wash solvent cartridge according to an embodiment of the present invention.
Figure 4:
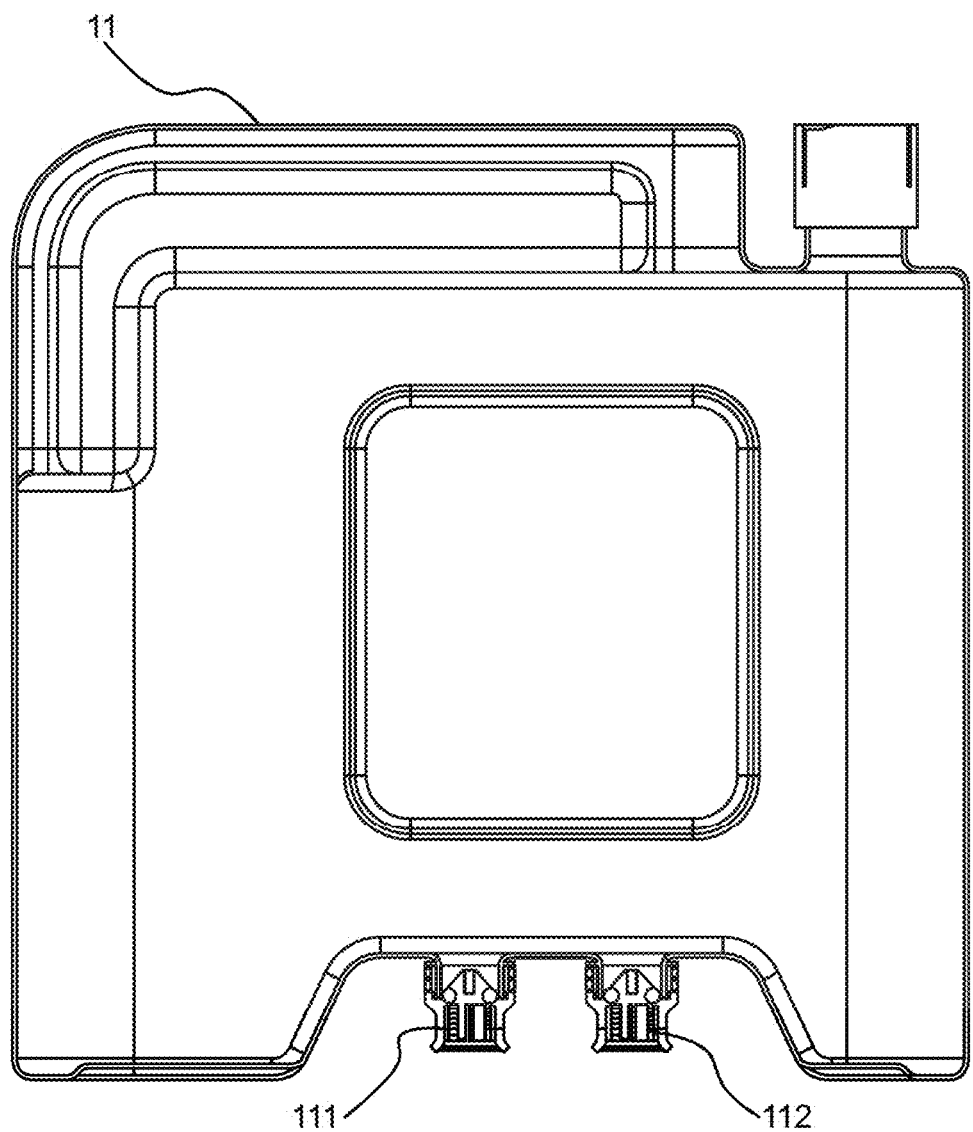
FIG. 4 is a front cross-sectional view of a wash solvent cartridge according to an embodiment of the present invention.
Figure 5:
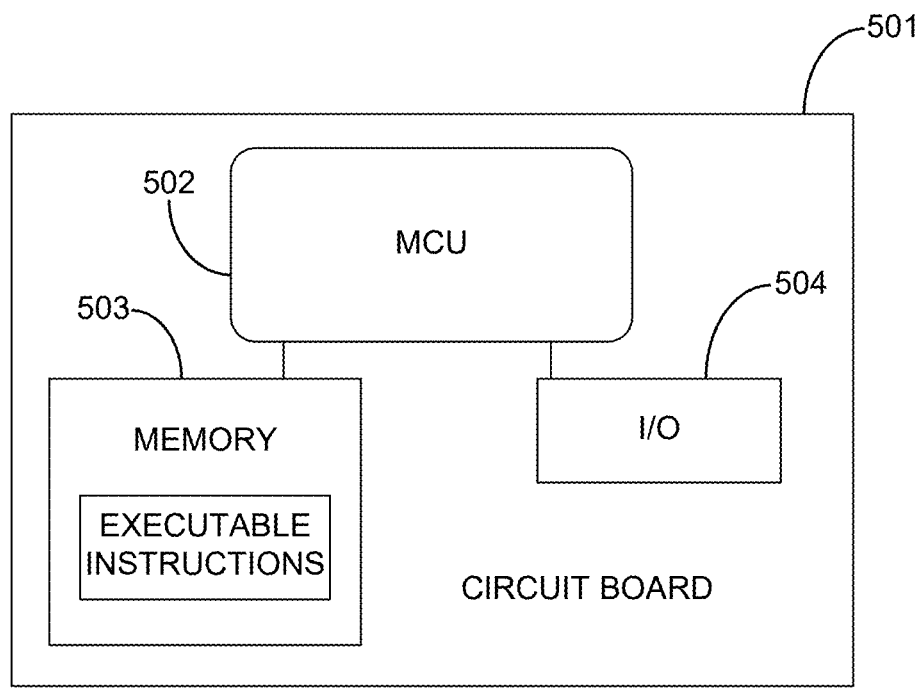
FIG. 5 is a block diagram of a controller according to an embodiment of the present invention.

Turning now to the next set of figures, FIG. 3 is a front view of wash solvent cartridge according to an embodiment of the present invention; FIG. 4 is a front cross-sectional view of a wash solvent cartridge according to an embodiment of the present invention; FIG. 5 is a block diagram of a controller according to an embodiment of the present invention; and FIG. 6 is a schematic diagram for an exemplary pump, valve, and tubing system according to an embodiment of the present invention.

Figure 6:
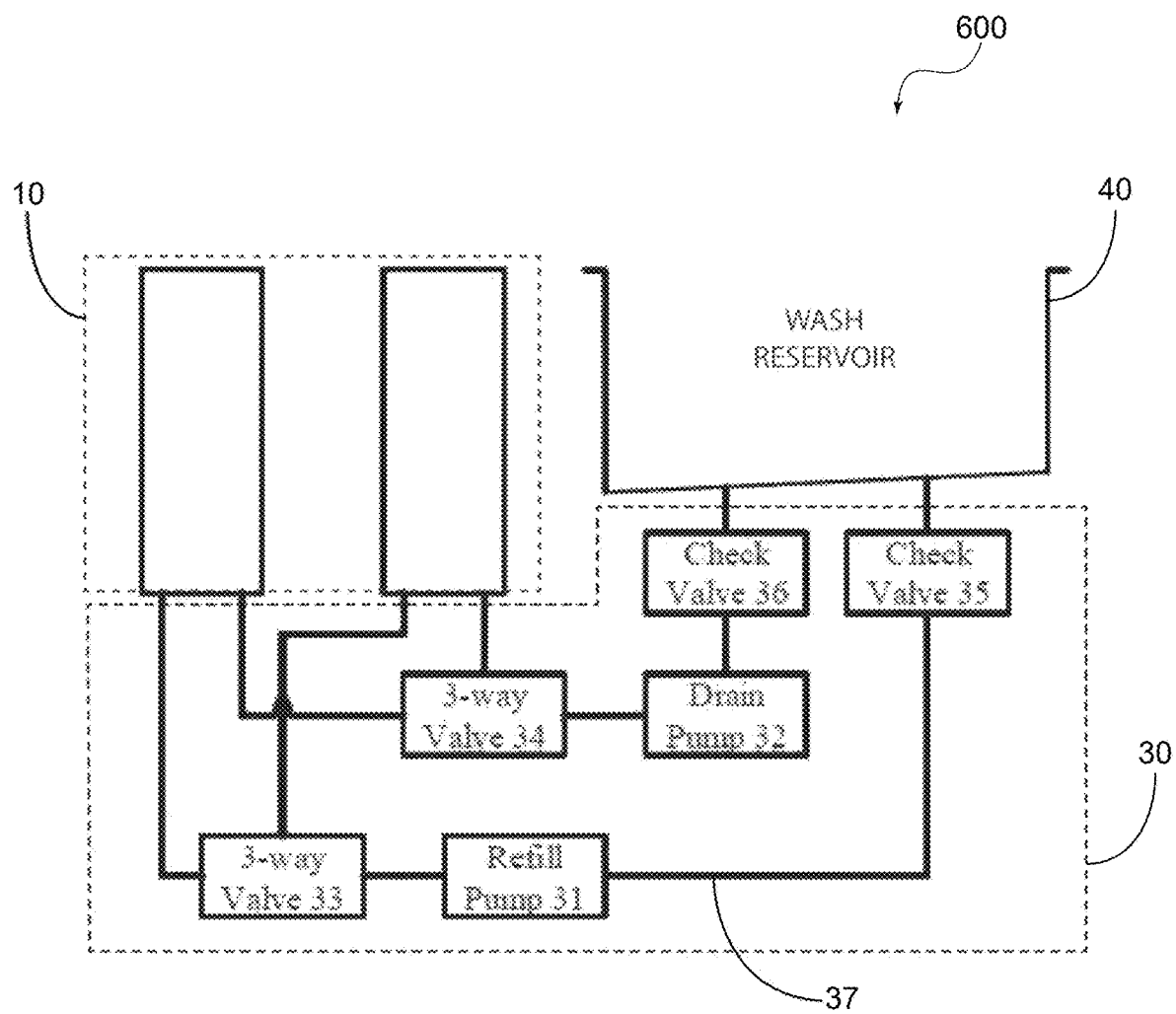
FIG. 6 is a schematic diagram for an exemplary pump, valve, and tubing system according to an embodiment of the present invention.

According to some exemplary embodiments, as depicted in FIG. 6, the wash solvent receptacle 10 may include two repositories for storing two solvent solutions. In one exemplary embodiment, as shown and in accordance with the cartridges illustrated in FIG. 3 and FIG. 4, the two repositories may comprise cartridges, i.e., a wash solvent cartridge for the preliminary wash 11a and wash solvent cartridge for the fine wash 11b. Referring to FIG. 3-4, each cartridge may include two bite valves, i.e., 111 for the inlet and 112 for the outlet, which are located on the underside of the wash solvent cartridge 11, i.e., the bite valves 111a and 112a for the cartridge 11a, the bite valve 111b and 112b for the cartridge 11b. When the cartridge 11 is installed in position, the bite valve 111 and 112 are squeezed to allow the wash solvent to flow into the tubing connected to the cartridge 11. Once the cartridge 11 is removed from the wash system, the bite valve 111 and 112 return to its original state and shuts off the flow.

The wash solvent cartridge 11 is made from material which is compatible with both resin and wash solvent, such as poly(methyl methacrylate) (PMMA).

Referring to FIG. 3-FIG. 4, each cartridge may also include an ID chip which is located next to the bite valve 111. The ID chip may be used to save and update the information related to the wash solvent it contains, such as the type of the wash solvent and the current resin concentration of the solvent. When the cartridge 11 is installed in position, the controller 20 reads the information from the ID chip. Based on this information, the wash system can determine the style and time for each wash stage.

Referring to FIG. 5, the controller 20 may include a circuit board 501, which integrates electronic components comprising a micro control unit (MCU 502), memory 503, and I/O ports 504. Necessary program and data are installed in the memory for MCU 502 to operate. In exemplary embodiments, memory 503 incudes a set of executable instructions for operating the system 100.

Referring to FIG. 2, in accordance with some exemplary embodiments, the controller 20 may also include a touch screen (user interface 20a), which may be electrically connected with the circuit board of FIG. 5 as human-machine interface. Its major functions include, but are not limited to:
 a. receiving commands from the user, such as start a programmed wash cycle, start a customized wash cycle, set the customized time for each wash stage, drain the wash bucket 41, cancel the job, etc.;
 b. showing the status of the wash system, e.g., busy or idle;
 c. showing the progress regarding to current job, e.g., stage 1 wash, stage 2 wash, or air-drying;
 d. showing the relevant information regarding to current job, e.g., estimated time consumption, estimated time left, resin concentration for wash solvent cartridge 11a, resin concentration for wash solvent cartridge 11b, etc.; and or
 e. showing system relevant information, such as machine model number, machine serial number, etc.

The concept of multi-stage wash is implemented by a pump, valve, and tubing system that form part of the disperser module 30 which fluidly communicates the wash solvent receptacle 10 with the wash reservoir 40. Referring to FIG. 6, in one exemplary embodiment, such as system 600, a two-stage wash system may employ the pump, valve, and tubing system of the disperser module 30, including a refill pump 31, a drain pump 32, an "L" type automatic three-way valve 33 for the refill pump 31, an "L" type automatic three-way valve 34 for the drain pump 32, a check valve 35 connected with the wash solvent inlet 44 of wash reservoir 40 (see also FIG. 8), a check valve 36 connected with the wash solvent outlet 45 of wash reservoir 40 (see also FIG. 8), and tubing 37 that forms part of the pump, valve, and tubing system of the disperser module 30.

Figure 18:
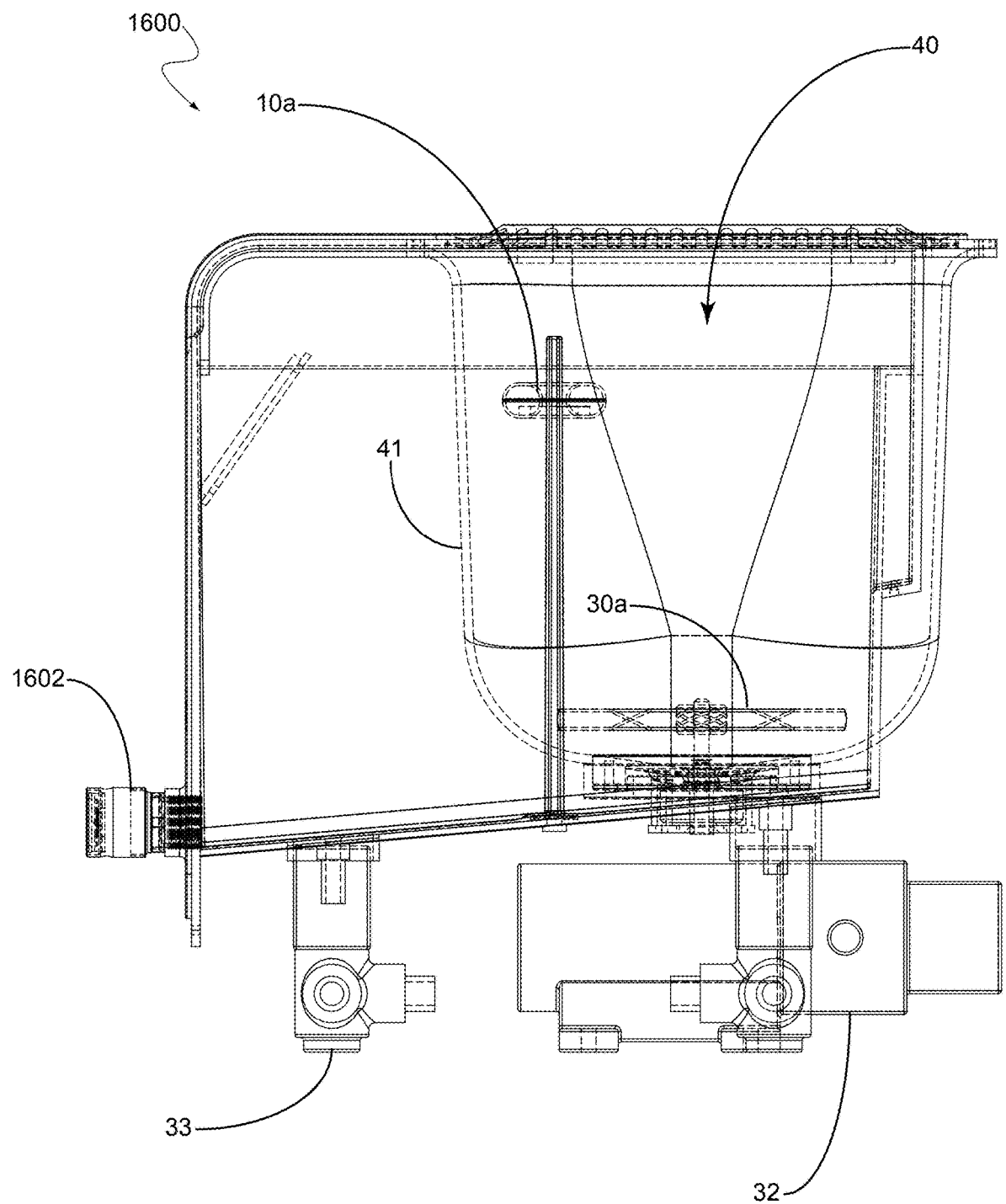
Figure 19:
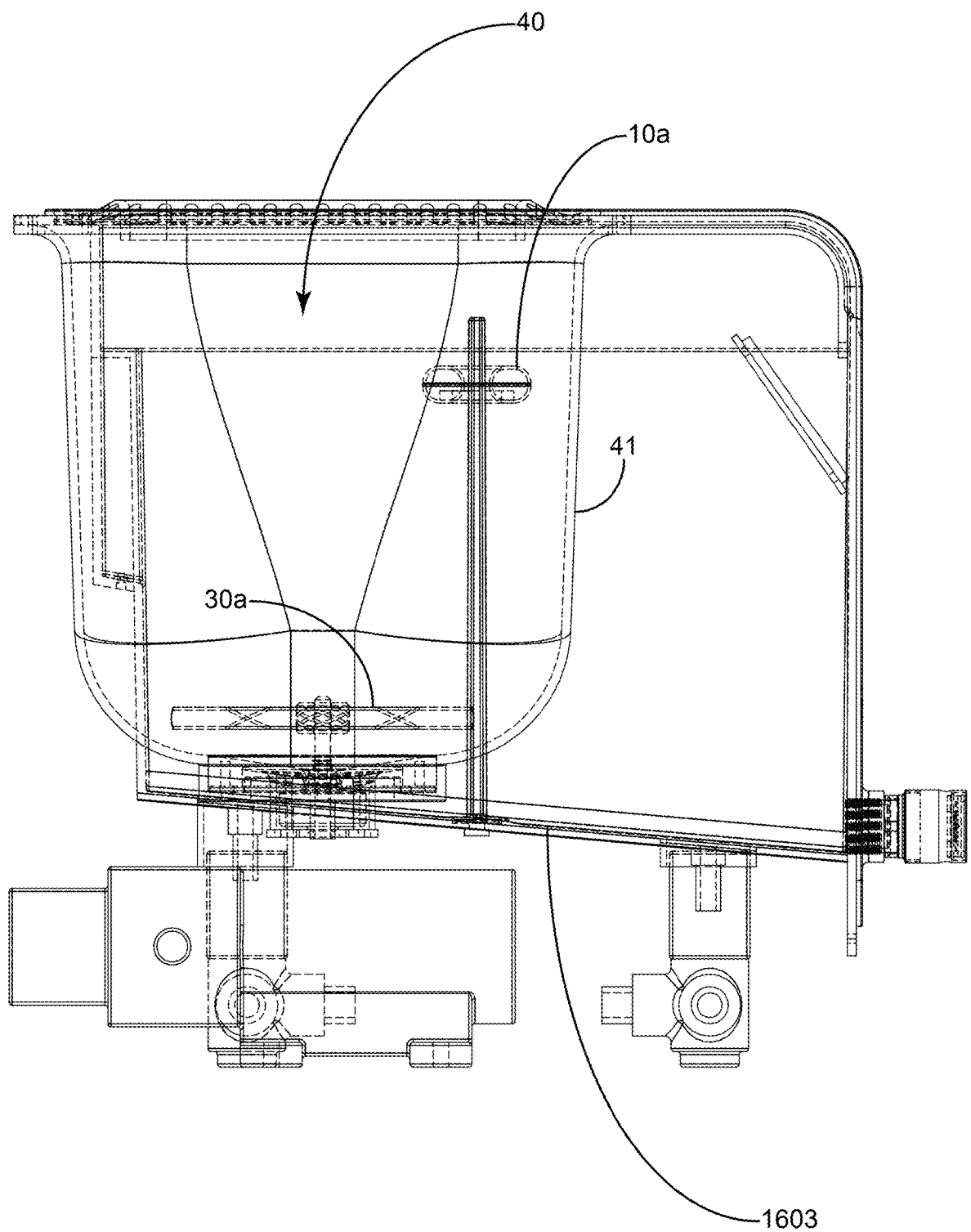
Figure 20:
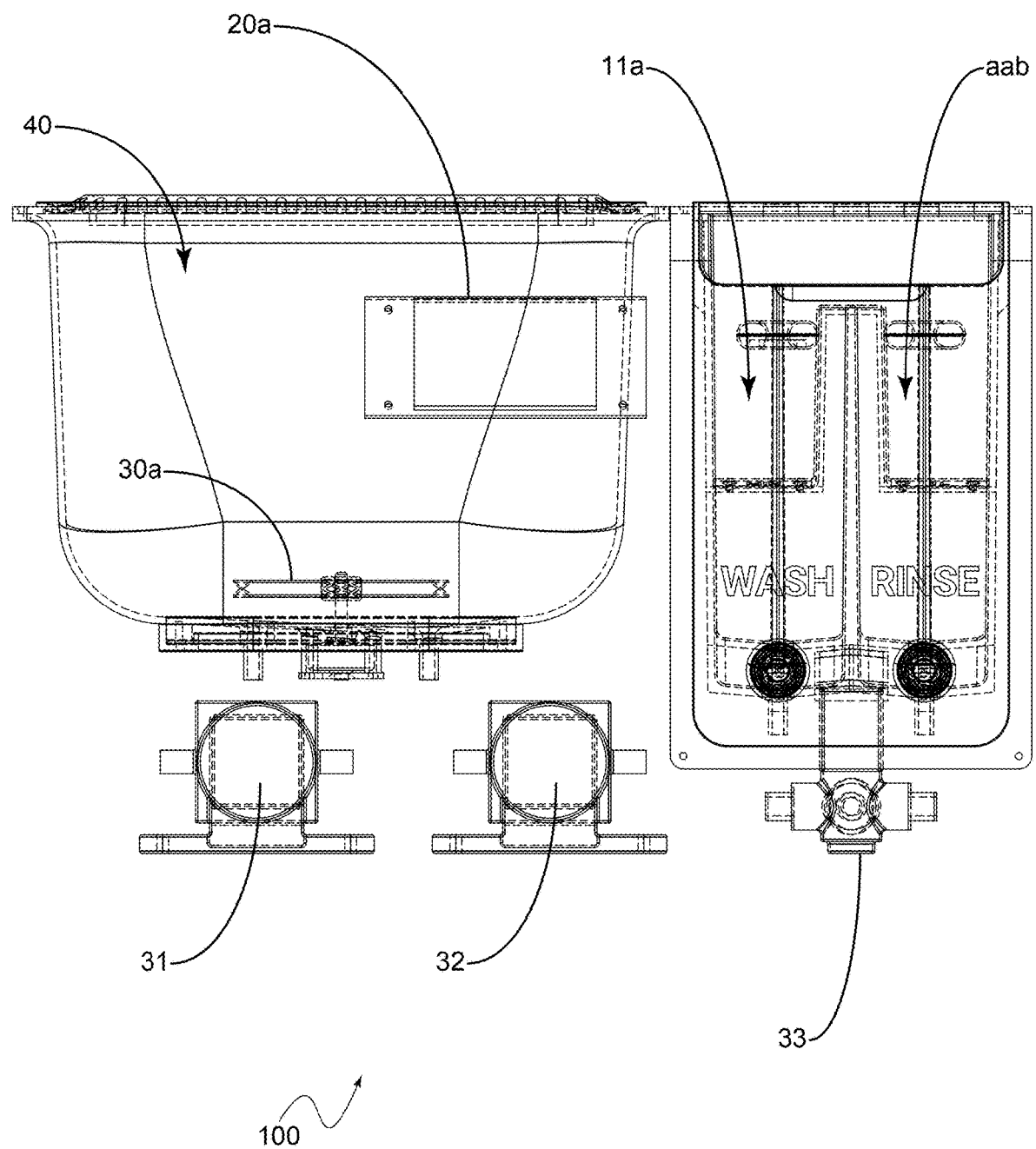
Figure 21:
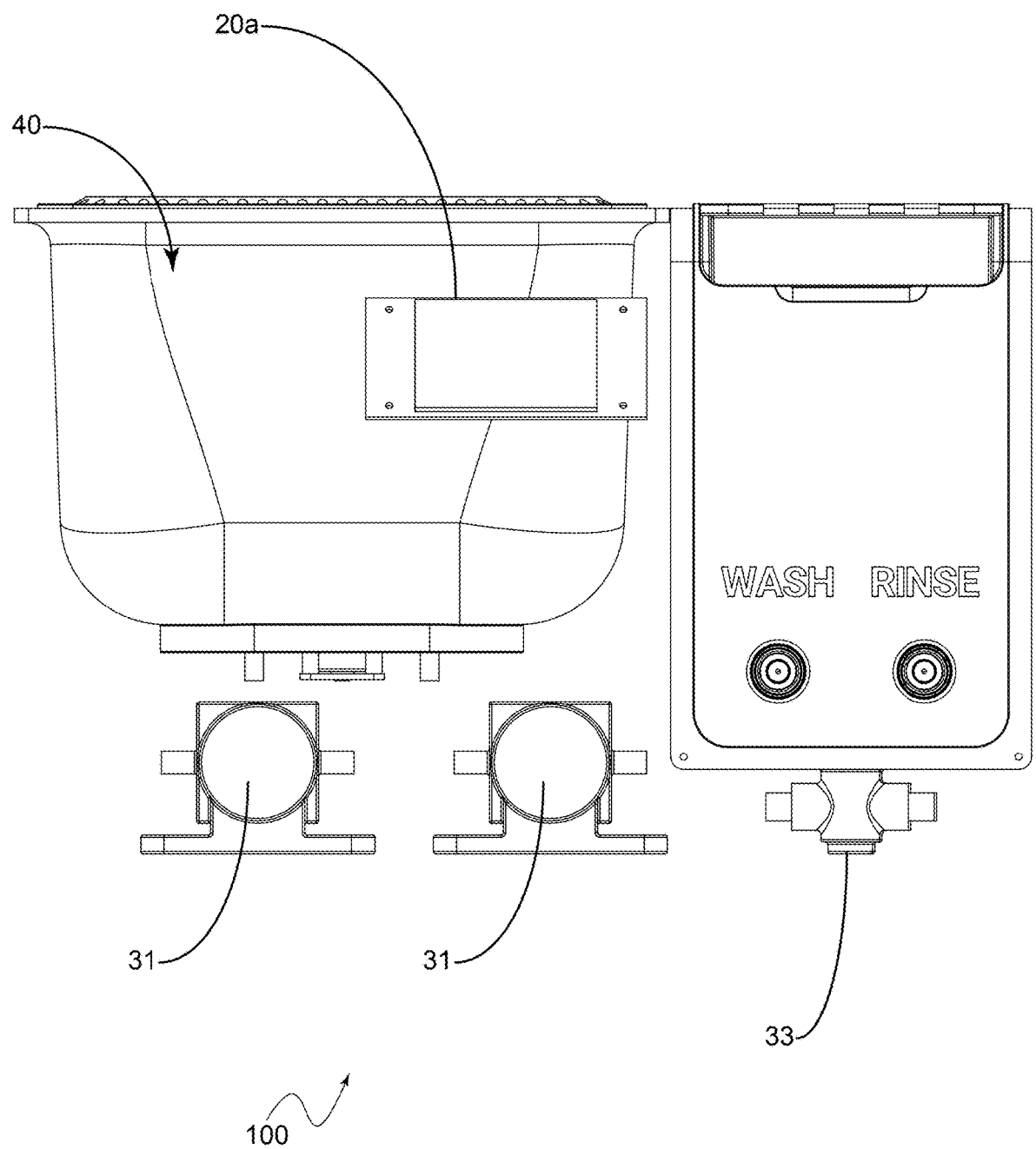

In some exemplary embodiments, a wash and air-drying process may be broken down into the following steps:
 Step 1: The "L" type three-way valve 33 switches the direction to allow the wash solvent to flow from the cartridge or tank 11a of receptacle 10 to the refill pump 31;
 Step 2: The refill pump 31 pumps a predetermined volume of wash solvent from the cartridge or tank 11a of receptacle 10 to the wash reservoir 40;
 Step 3: The agitator 30a runs for a specific time for a preliminary wash (i.e., although the agitator is not shown in the diagram of FIG. 6, see other figures for reference such as FIG. 13 and FIG. 18, in which an agitator is shown housed within the wash reservoir);
 Step 4: The "L" type three-way valve 34 switches the direction to allow the wash solvent to flow from the drain pump 32 to the cartridge or tank 11a of receptacle 10;
 Step 5: The drain pump 32 pumps the wash solvent from the wash reservoir 40 back to the cartridge or tank 11a of receptacle 10;
 Step 6: The "L" type three-way valve 33 switches the direction to allow the wash solvent to flow from the cartridge or tank 11b of receptacle 10 to the refill pump 31;
 Step 7: The refill pump 31 pumps a predetermined volume of wash solvent from the cartridge or tank 11b of receptacle 10 to the wash reservoir 40;
 Step 8: The agitator 30a runs for a specific time for fine wash;
 Step 9: The "L" type three-way valve 34 switches the direction to allow the wash solvent to flow from the drain pump 32 to the cartridge or tank 11b of receptacle 10;
 Step 10: The drain pump 32 pumps the wash solvent from the wash reservoir 40 back to the cartridge or tank 11b of receptacle 10 so that wash reservoir is substantially empty and all or substantially all of the solvent has been removed; and
 Step 11: The agitator 30a runs for a specific time for air-drying.

Accordingly, in exemplary embodiments, a method performed by system 100 for washing off residual resin from objects that are 3D-printed through a vat polymerization process, may include: pumping a first solution (stored in cartridge or tank 11a) of a plurality of solvent solutions from a solvent receptacle 10 to a wash reservoir 40 of system 100, wherein the wash reservoir 40 is adapted to enclose a 3D-printed object, by activating a pump of solvent disperser module 30 adapted to facilitate a flow of the plurality of solvent solutions between the wash reservoir 40 and the solvent receptacle 10; dispersing the first solutions onto the 3D-printed object by activating an agitator 30a of the solvent disperser module 30 adapted to disperse the plurality of solvent solutions onto the 3D-printed object; pumping the first solution from the wash reservoir 40 to the solvent receptacle 10 (i.e. a cartridge or tank 11a) in order to substantially remove the first solution from the wash reservoir 40; pumping a second solution (stored in cartridge or tank 11b) of the plurality of solvent solutions from the solvent receptacle 10 to the wash reservoir 40; and dispersing the second solution onto the 3D-printed object.

In some exemplary embodiments, the method performed by system 100 described above may further include: pumping the second solution from the wash reservoir 40 back to the solvent receptacle 10 (i.e., back into cartridge or tank 11b) in order to substantially remove the second solution from the wash reservoir 40. In some exemplary embodiments, the method performed by system 100 described above may further include activating the agitator 30a of the solvent disperser module 30 to create an airflow and dry the 3D-printed object. In this manner, system, 100 may be configured to perform an air-drying cycle.

See also FIG. 16-FIG. 20, which depict each of the components mentioned above with reference to some exemplary embodiments of the present invention. In exemplary embodiments, the majority of the residual resin on the 3D printed object, i.e., 85%, 90%, or 95%, is expected to be removed during the preliminary wash, and the remaining liquid resin on the 3D printed objects, i.e., 15%, 10%, or 5%, is expected to be washed off during the fine wash. The wash solvent for each wash stage may be stored in an exclusive wash solvent cartridge or tank of the solvent receptacle 10. Therefore, the resin concentration in the wash solvent for the preliminary wash increases much faster than that for the fine wash, and as a result, it may require replacement more frequently as well.

According to some exemplary embodiments of the present invention, a system for washing 3D printed objects may be configured to perform a multi-style residual resin removal process, i.e., rinsing, splashing, and jetting. Different wash styles may stem from the wash solvent level and the liquid flow rate. In a rinsing style, the 3D printed objects may be fully immersed into the wash solvent, and the wash solvent may be agitated gently. In this case, the residual resin may be removed mainly by dissolving into the wash solvent. In a splashing style, an agitator may be immersed into the wash solvent, and the wash solvent may be agitated with a medium speed. In this case, the residual resin may be removed by both dissolving into the wash solvent and washing off by the solvent flow. In a jetting style, the liquid level may be lower than the agitator, and the wash solvent may be agitated with a high speed. In this case, the residual resin may be removed mainly by washing off by the high-speed solvent flow. Generally, jetting is more effective than splashing, and splashing is more effective than rinsing. However, higher agitating rates may cause more solvent loss for each wash. Therefore, the material property and resin concentration in the wash solvent may need to be taken into consideration when selecting the wash style for each stage.

Referring to FIG. 6, the pump, valve, and tubing system of disperser module 30 includes a check valve 35 which is installed between the refill pump 31 and the wash solvent inlet 44. The check valve 35 allows the wash solvent to flow from the refill pump 31 to the wash solvent inlet 44 and shuts off the flow in the opposite direction. The pump, valve and tubing system of disperser module 30 also includes a check valve 36 which is installed between the wash solvent outlet 45 and the drain pump 32. The check valve 36 allows the wash solvent to flow from the wash solvent outlet 45 to the drain pump 32 and shuts off the flow in the opposite direction.

Figure 7:
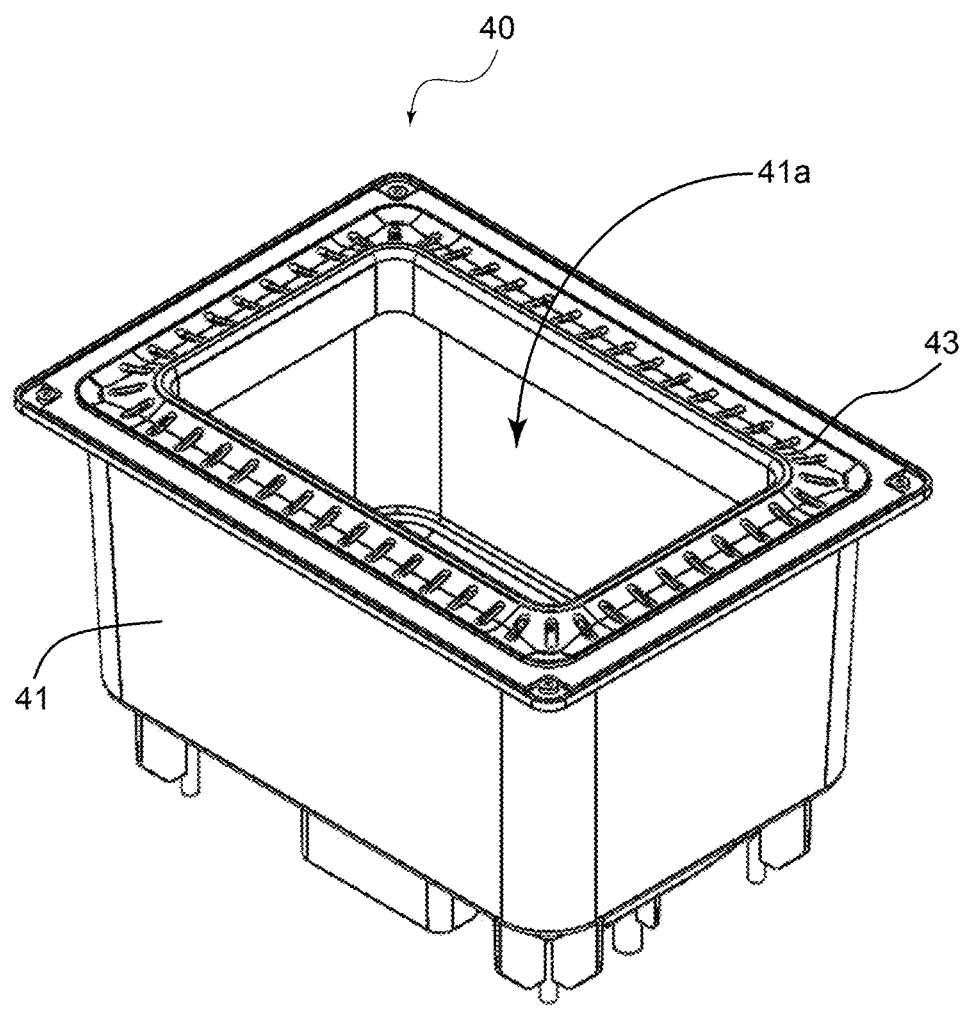
FIG. 7 is a front perspective view of a wash reservoir according to an embodiment of the present invention.
Figure 8:
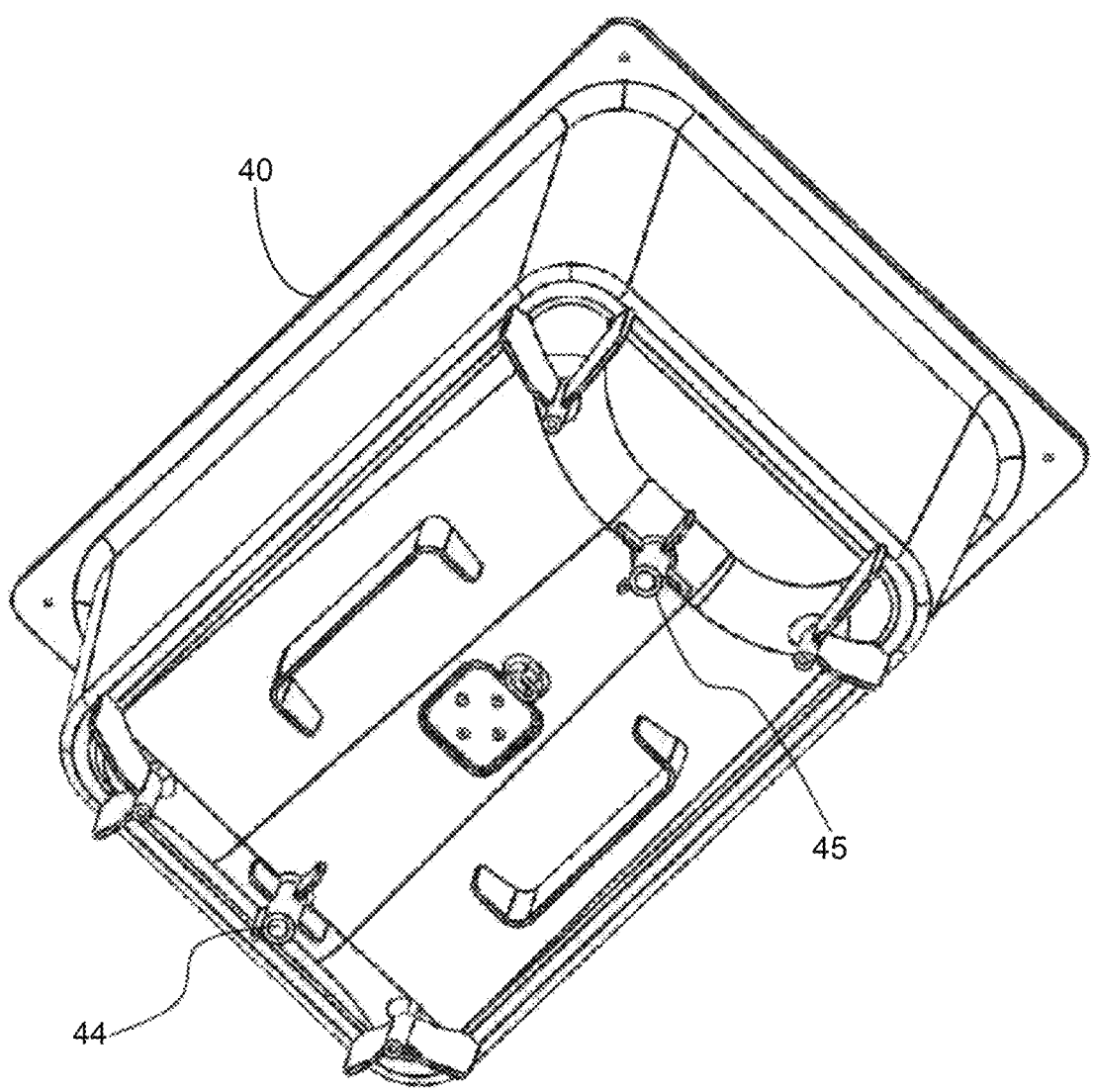
FIG. 8 is a bottom perspective view of a wash reservoir according to an embodiment of the present invention.

Referring to FIGS. 7-8, the wash reservoir 40 typically comprises a wash bucket 41, wherein the wash bucket 41 may include a monitoring window that may be disposed over an aperture 41a of the wash bucket 41, an anti-splashing adaptor 43, and a wash solvent inlet 44 that may include a barb, and a wash solvent outlet 45 that may include a barb for facilitating coupling to the tubing system of disperser module 30. Although not shown in these views, but will be discussed further below with reference to other figures, wash reservoir 40 may typically house or be coupled with a mesh, a resin concentration monitoring module, and a wash solvent agitator of the solvent disperser module 30.

In some exemplary embodiments, the wash bucket 41 may be made of a material that is compatible with both resin and wash solvent, such as PMMA. The wash bucket 41 may preferably employ a slightly slanted bottom, and the wash solvent outlet 45 may be located at its lowest position. Therefore, this design can help to drain the wash solvent when necessary. Furthermore, a hydrophobic and/or oleophobic coating, e.g., Teflon, can be applied on the bottom of the wash bucket 41, which may further help the drainage of the wash solvent. In some exemplary embodiments, wash reservoir 40 including wash bucket 41 may employ a monitoring or observation window on one or more of the walls of wash bucket 41, or the entirety of wash bucket 41 may be transparent, and thus, the user can monitor the wash and air-drying process. In such embodiments, an enclosure of the system such as enclosure 50 may include such observation window on one of its walls.

Figure 9:
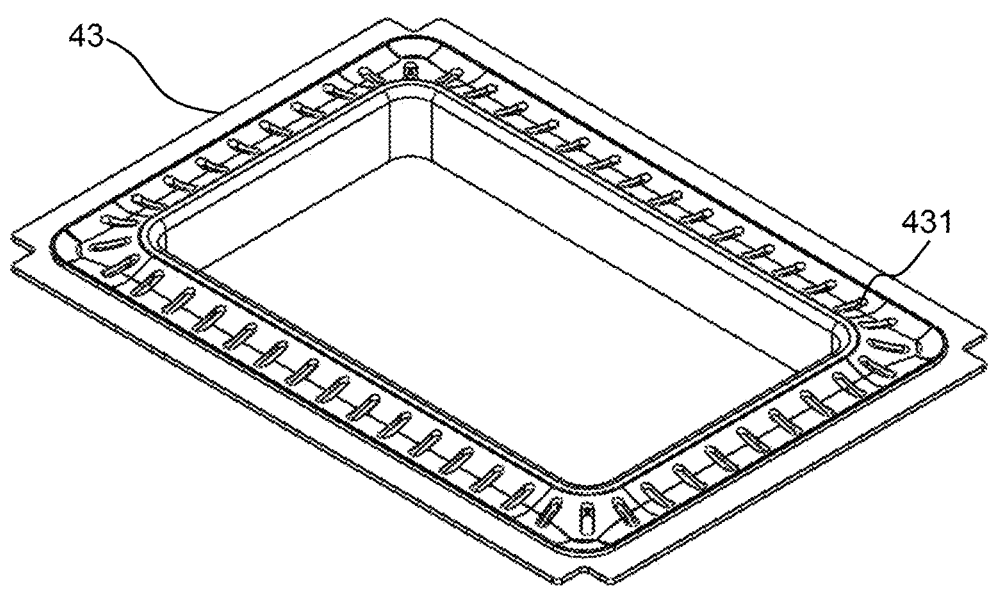
FIG. 9 is a front perspective view of an anti-splashing adapter according to an embodiment of the present invention.
Figure 10:
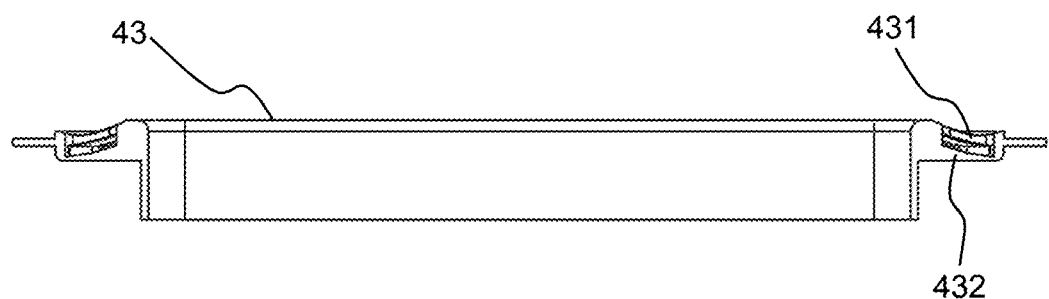
FIG. 10 is a front sectional view of an anti-splashing adapter according to an embodiment of the present invention.
Figure 11A:
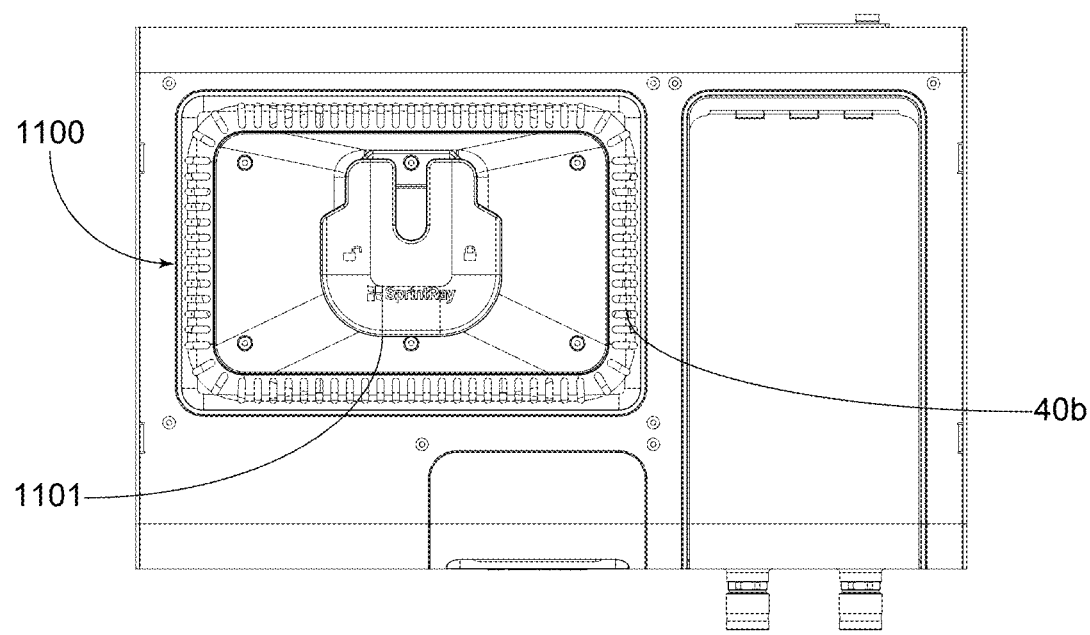
FIG. 11A-FIG. 11B depict an exemplary embodiment of the present invention in which a top aperture of a multi-stage wash device is configured to receive a platform of a 3D printer that can be washed using the system when coupled to the aperture.
Figure 11B:
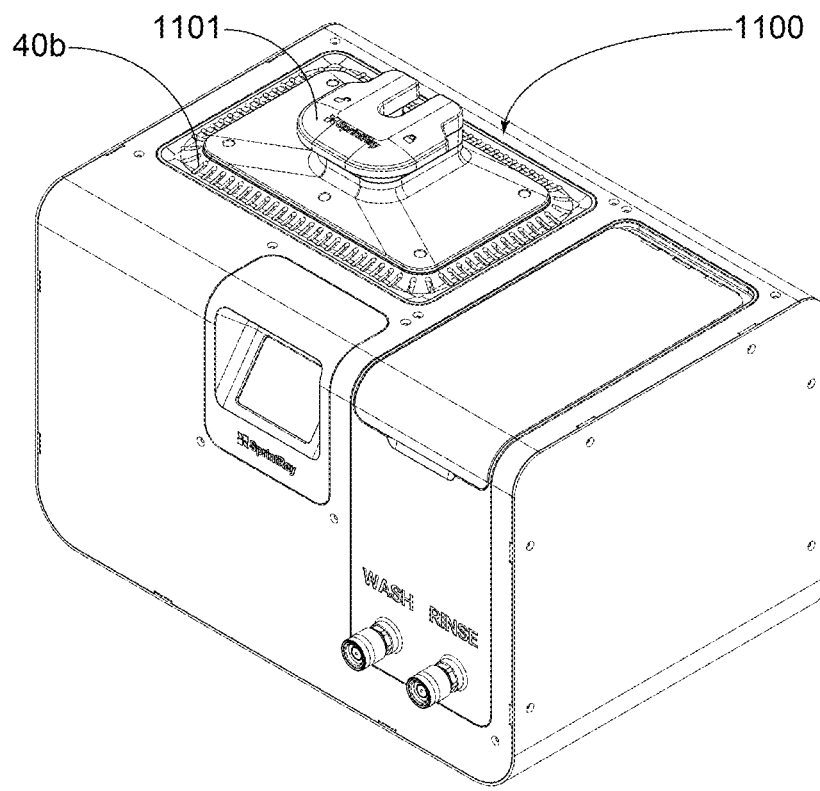

Referring to FIG. 9-10, an anti-splashing adapter 43 sits on the top of the wash bucket 41. It receives the build platform from a specific VP-based 3D printer. The anti-splashing adapter 43 has an array of slots 431, and below each slot 431, there is a small block 432 which is connected to the bottom surface of the anti-splashing adapter 43. Therefore, no direct passage exists in the vertical direction for the anti-splashing adapter 43. When the wash solvent inside the wash bucket 41 is agitated by the agitator, the wash solvent cannot come out easily. However, the slot 431 serves as a vent or airway for the necessary air circulation during air-drying—that is, when the wash reservoir is emptied, and the agitator is activated to create an airflow that dries the 3D-printed object within the wash reservoir. The inlet 44 and outlet 45 of the wash reservoir 40 come with barbs or similar coupling components, so the tubing with appropriate size can be securely fastened on them.

Referring to FIG. 7, FIG. 11A-FIG. 11B, FIG. 13, and FIG. 24A-24B, one or more components may be employed in order to protect the agitator during the wash and air-drying process. For example, and without deviating from the scope of the present invention, in some exemplary embodiments, a mesh may be positioned inside of wash bucket 41, which prevents debris from falling back onto the agitator inside the wash reservoir. In some exemplary embodiments, a support platform may be employed. For example, and without deviating from the scope of the present invention, a support platform 40b may be integrated with a lid of the wash reservoir, such as lid 1100, wherein the support platform 40b includes an adapter for receiving a build platform 1101 of a 3D printer. See for example the embodiment of FIG. 11A-FIG. 11B in which lid 1100 includes a support platform 40b that secures build platform 1101 of a 3D printer. In this exemplary embodiment, a build platform of a 3D printer may simply be placed facing into the wash reservoir 40 so that 3D printed objects attached directly on the build platform for ease of use. In this exemplary embodiment, the attachment or the 3D printed object may become loose during the wash and air-drying process due to the impact from the wash solvent or air flow. Thus, it is possible that the 3D printed objects fall off from the build platform. Accordingly, as shown by way of example in FIG. 13, a mesh 1301 may be installed in the wash bucket 41 to prevent the fallen objects from directly hitting on the agitator 30*a*. Meanwhile, the bore size and density of the mesh affect the wash and air-drying efficiency. The selection of the bore size and density for the mesh needs to offer enough protection for the rotary components without significantly compromising the wash and air-drying efficiency. It is preferable that the bore size is in the range of 4-5 mm in diameter, the density is in the range of 4-6/cm$^2$, and the thickness is less than 1 mm. The material of the mesh needs to be compatible with both the resin and wash solvent, such as stainless steel 316L.

Figure 24A:
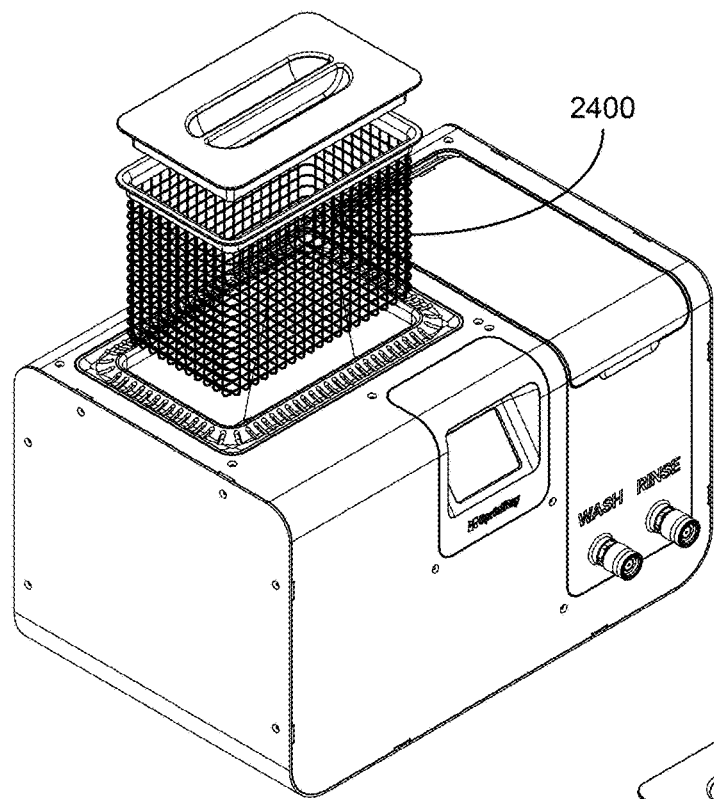
FIG. 24A-FIG. 24B depict a first exploded perspective side view, and a second exploded perspective side view of the exemplary embodiment illustrated in FIG. 23A-FIG. 23C.
Figure 24B:
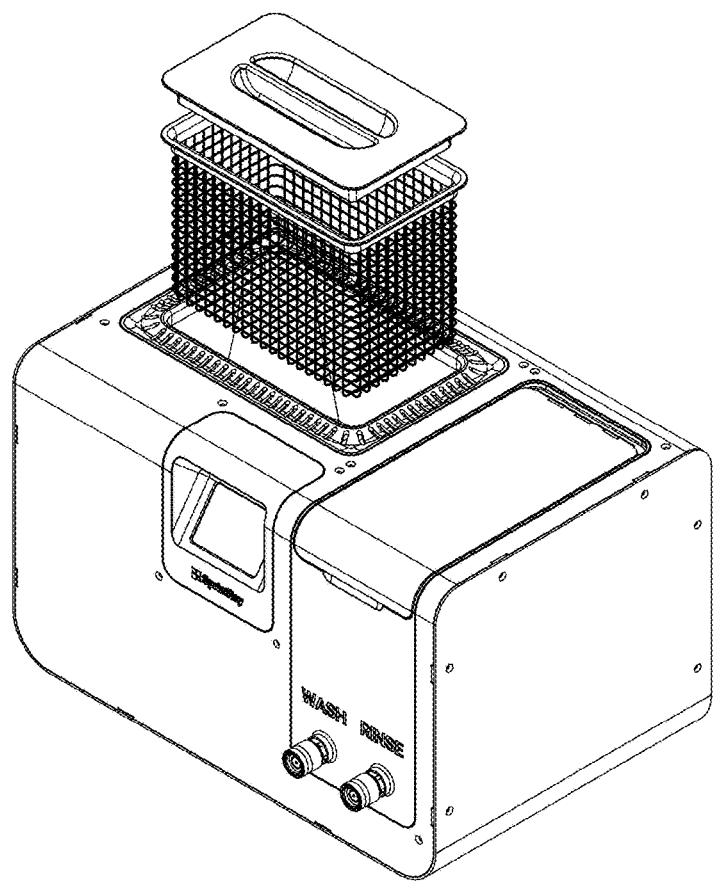
Figure 29:
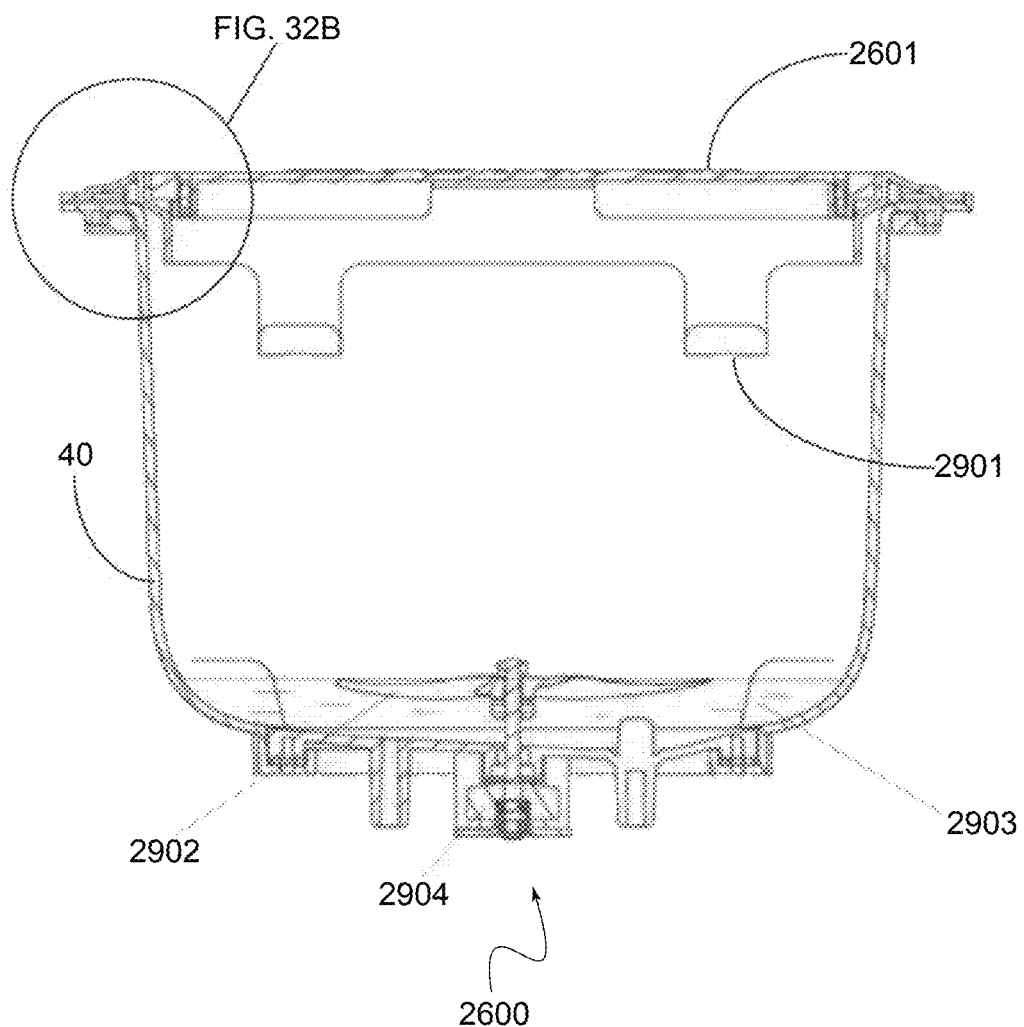
FIG. 29 depicts a cross-sectional view of one exemplary embodiment for a wash reservoir including a solvent disperser module configured to disperse solvent within a wash reservoir in accordance with the present invention.

In some exemplary embodiments, instead of using a mesh, or even in addition to a mesh, a support platform may employ include a cage or container for containing the 3D-printed object therein. For example, and without limiting the scope of the present invention, FIG. 24A-24B illustrate such embodiment. From these views, it may be appreciated that a cage 2400 may be coupled to a lid that may be suspended over the cavity of wash reservoir 40. In FIG. 29 and in FIG. 33A exemplary embodiments of a support or adapter configured to suspend a cage inside wash reservoir 40 are illustrated.

Referring to FIG. 2 and FIG. 7, a photosensitive-based resin concentration monitoring module may be installed on the wash bucket 41. The resin concentration monitoring module may comprise a laser diode and a photoresistor. The laser diode can generate a light with a certain wavelength which illuminates the photoresistor. The resistance of the photoresistor increases with decreasing incident light intensity which is caused by increasing media opacity between the laser diode and the photoresistor. The selection of the laser diode needs to avoid the wavelength range which may cause photopolymerization of the resin, such as ultra-violet. In some exemplary embodiments, it may be preferable to have a laser diode with a wavelength around 650 nm. The distance between the laser diode and the photoresistor may be fixed, so readings of the photoresistor are comparable and consistent. In some exemplary embodiments, information regarding the resin concentration for the wash solvent from cartridge 11*a* and 11*b* could be saved and updated on an ID chip and, respectively, so the controller 20 can retrieve this information when necessary.

The resin concentration monitoring module can also serve as the liquid level monitoring system. The resin concentration monitoring module can be fixed at a certain height which reflects the expected liquid level for the wash solvent. Before the wash solvent reaches that height, the gap between the laser diode and the photoresistor is filled with air which usually has a higher transparency than that of the wash solvent. Once the wash solvent achieves that height, the resistance of the photoresistor goes up, and it signals the controller 20 to stop refilling the wash reservoir 40.

In some exemplary embodiments, the agitator agitates the wash solvent in the wash bucket 41 to generate the turbulence with a predetermined speed for a certain time to remove the uncured residual resin from the surface of the printed 3D objects. The agitator may also agitate the air when there is no solvent inside the wash bucket 41 to create air flow to dry the printed 3D objects after wash. In such embodiments, the agitator comprises a waterproof brushless motor and a propeller. In some exemplary embodiments, it may be preferable that the speed of the waterproof brushless motor is in the rage of 5,000-25,000 rpm, and the length of blade from the propeller is in the range of 45-55 mm.

There may be three types of wash style, i.e., rinsing, splashing, and jetting, depending on the liquid level of wash solvent. For the rinsing style, the 3D objects are fully immersed in the wash solvent. In this case, the residual resin on the 3D objects is mainly removed by dissolving into the wash solvent. For the splashing style, the liquid level of the wash solvent is higher than the highest point of the propeller by 3-5 mm. In this case, the residual resin on the 3D objects is removed by both dissolving into the wash solvent and washing off by the solvent flow. For the jetting style, the liquid level of the wash solvent is lower than the lowest point of the propeller by 3-5 mm. In this case, the residual resin on the 3D objects is removed mainly by washing off by the high-speed solvent flow. The benefit of jetting the solvent versus rinsing are a) the amount of solvent used in jetting method is 10%-30% of the amount of solvent in rinsing (which is a significant saving on the amount of solvent) and b) the jetting method throws the liquid with a speed to the model which leads to a more effective wash.

In this embodiment, a combination of time and style for each wash stage could be determined based on the resin concentration of the wash solvent used and the amount of residual resin on the 3D printed objects.

The resin concentration monitoring module gives feedback to the entire wash system based on which the wash system can determine whether the wash solvent is suitable for wash or needs to be replaced. After each wash, the uncured resin goes into the wash solvent, and thus, the resin concentration in the wash solvent increases. The wash solvent used in the present invention is preferably configured for multiple uses and may be repeatedly used until the resin concentration reaches a certain level beyond which the wash process is not efficient anymore. Accordingly, in some exemplary embodiments, a user may be required to replace the wash solvent. This may be achieved in various manners depending on the specifications of the resin concentration monitoring module. For example, and without limiting the scope of the present invention, the following are exemplary embodiments of a resin concentration monitoring module in accordance with the present invention:

Detecting Change in Density:

For a commonly used wash solvent, such as acetone, IPA, or TPM, its density is usually smaller than that of the resin. To be more specific, the density for acetone is $0.788 \times 10^3$ kg/m$^3$, the density for IPA is $0.785 \times 10^3$ kg/m$^3$, and the density for TPM is $0.975 \times 10^3$ kg/m$^3$. Compared with the density of the aforementioned solvents, the density for photosensitive resin is usually greater than $1.1 \times 10^3$ kg/m$^3$. When more photosensitive resin is dissolved into the wash solvent, the density of the wash solvent also increases. Based on the change of the wash solvent density, a density-based sensor, e.g., hydrometer, can be used to monitor the resin concentration in the wash solvent.

Detecting Change in Pressure:

Besides directly using density change to indicate the resin concentration of the wash solvent, the pressure change at a certain location can also be used for this purpose. The pressure (P) in a static liquid is proportional to both the liquid density ($\rho$) and the depth (h) in the liquid which can be represented as $P=\rho g h$, where g is the gravitational constant. Therefore, the pressure change at a certain depth in the wash solvent can reflect the wash solvent density change, and further indicate the concentration change of the wash solvent.

Detect Change in Opacity:

Another method to monitor the concentration change of the wash solvent is to evaluate the opacity of the wash solvent. For commonly used wash solvent, such as acetone, IPA, or TPM, it usually has a high transparency. With the increasing of the resin concentration, the transparency decreases. This change can be detected by a photosensitive sensor, such as a photoresistor. For a given light source, the resistance of a photoresistor increases with decreasing incident light intensity which is caused by increasing media opacity between the light source and the photoresistor. Therefore, the opacity can be used to indicate the resin concentration in the wash solvent.

Figure 13:
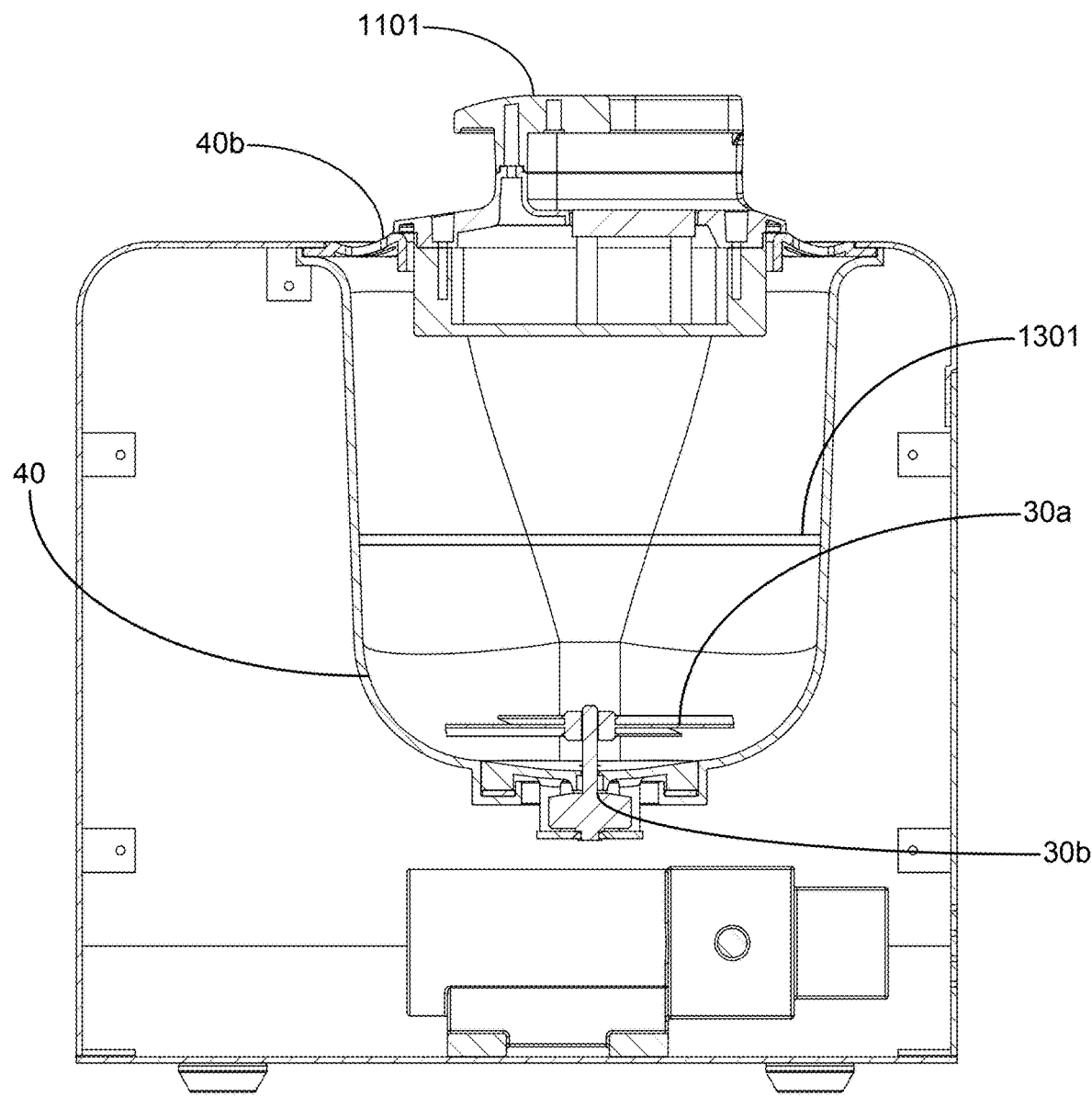
FIG. 13 depicts a cross-sectional view along the segment S-S illustrated in FIG. 12A.
Figure 14A:
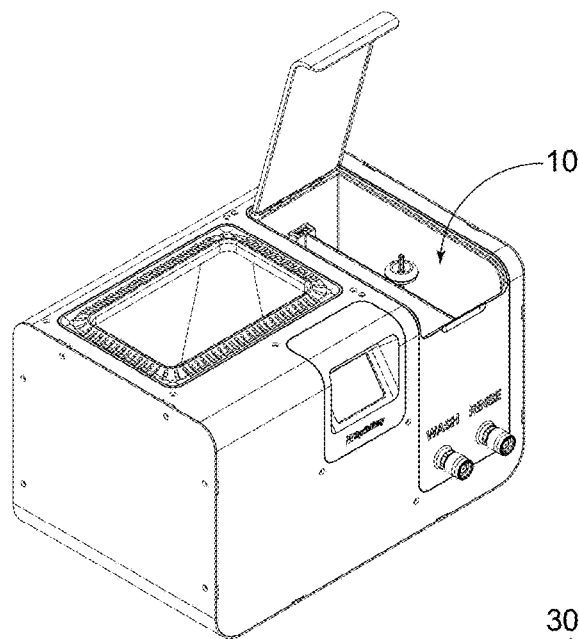
FIG. 14A-FIG. 14C depict a first perspective side view, a top view, and a second perspective side view, respectively, of an exemplary embodiment of the present invention.
Figure 14B:
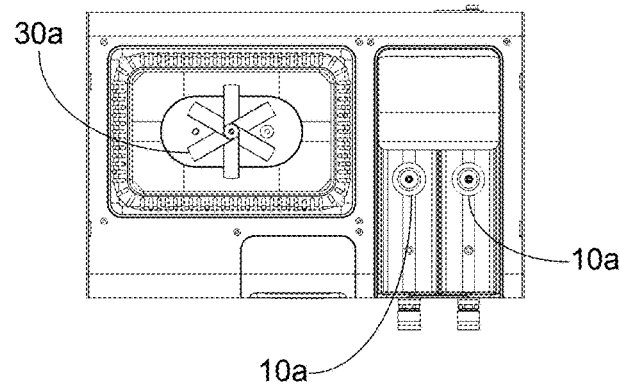
Figure 14C:
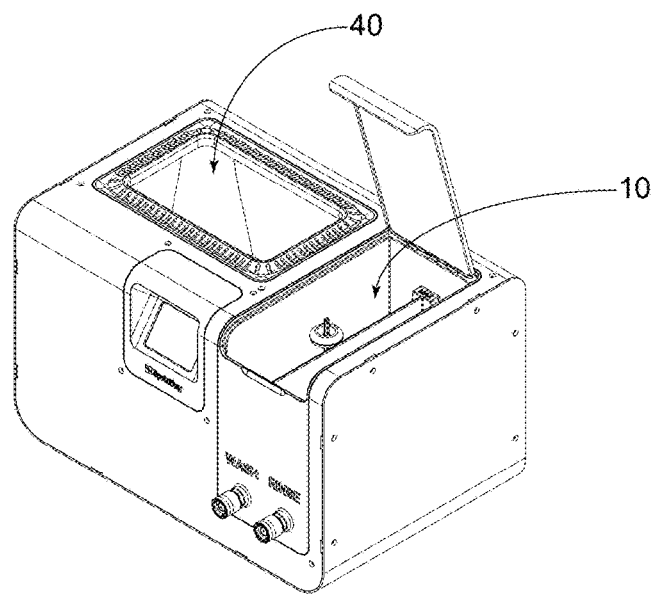
Figure 15A:
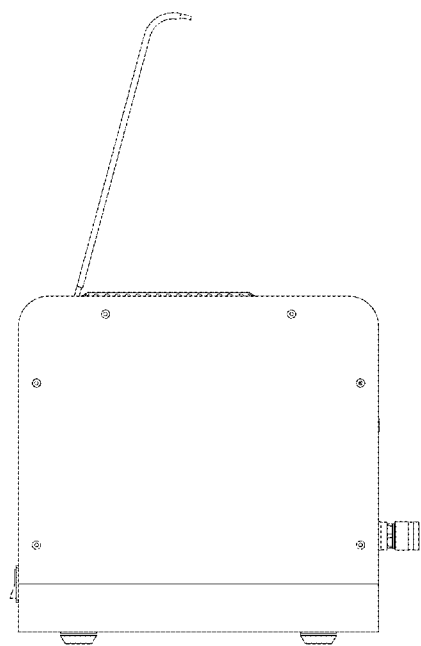
FIG. 15A-FIG. 15C depict a first side view, a front view, and a second side view, respectively, of the exemplary embodiment illustrated in FIG. 14A-FIG. 14C.
Figure 15B:
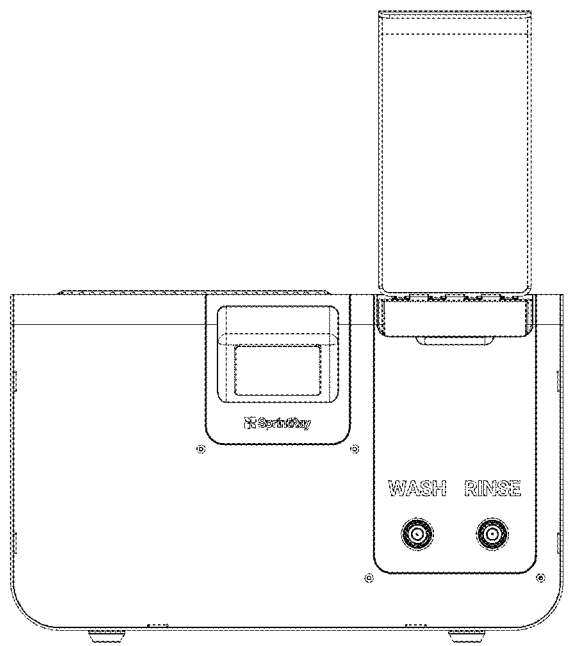
Figure 15C:
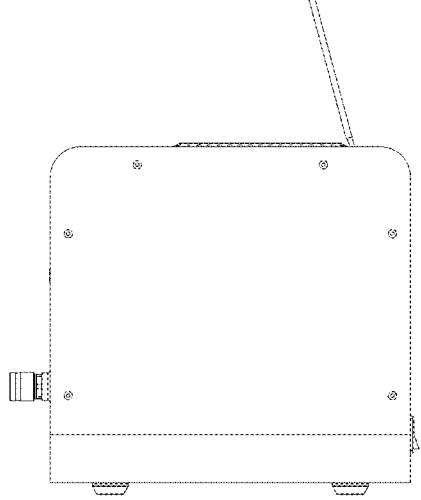
Figure 16:
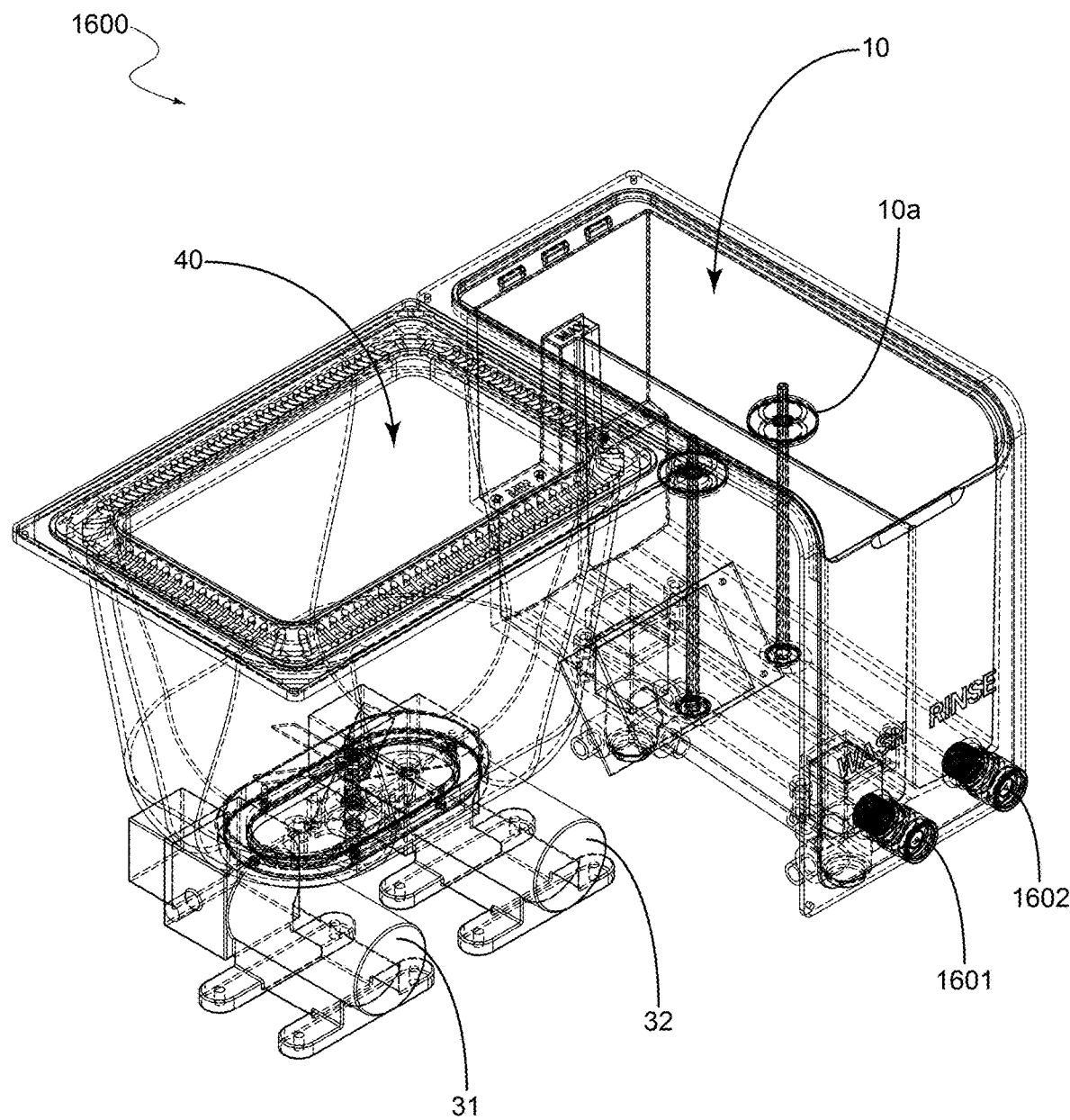
FIG. 16-FIG. 21 depict several see-through and cross-sectional views showing various components and configurations of the components within an enclosure of a device in accordance with exemplary embodiments of the present invention.
Figure 17:
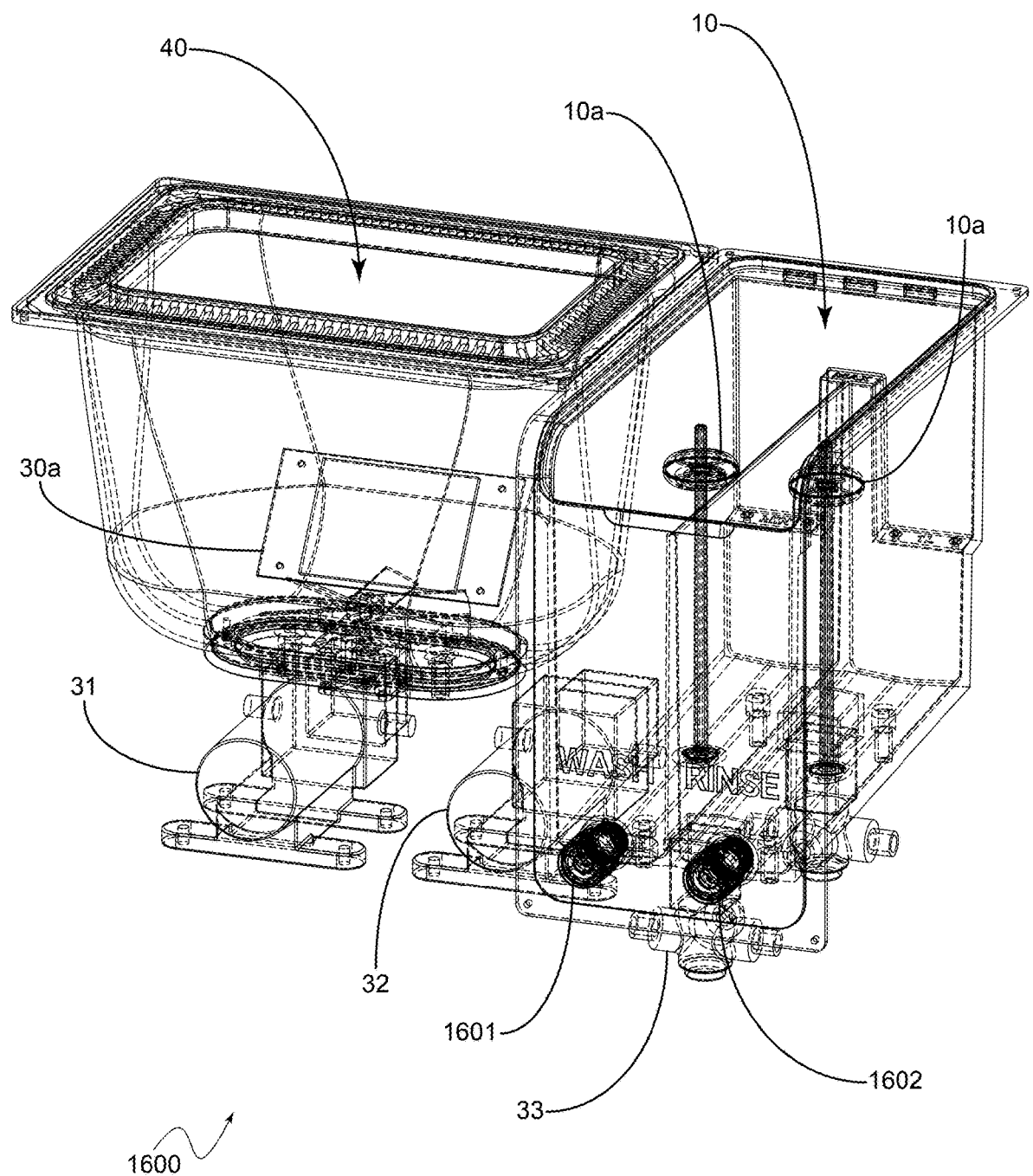

Turning now to the set of figures FIG. 11A-FIG. 12C, an exemplary embodiment of the present invention in which a top aperture of a multi-stage wash device is configured to receive a platform of a 3D printer that can be washed using the system when coupled to the aperture is depicted. FIG. 13 depicts a cross-sectional view of an exemplary embodiment of the present invention in which a top aperture of a multi-stage wash device is configured to receive a platform of a 3D printer that can be washed using the system when coupled to the aperture. From these views, it may be appreciated that at the top of the apparatus, an aperture receives a portion of the platform in a manner so that the surface(s) of the platform that require washing will be sealed inside the wash reservoir or cavity and facing the agitator. As mentioned above, the agitator may also agitate air when there is no solvent inside the wash reservoir (or wash bucket 41) to create air flow to dry the platform surface that has been washed.

Turning to figures, FIG. 14A-FIG. 15C, several perspective and side views are depicted of an exemplary embodiment of the present invention, showing a wash solvent reservoir opened. From these views, it may be appreciated that the wash solvent reservoir includes two adjacent repositories for each of the solutions (i.e., a wash solution and a rinse solution) employed by the system. For example, and without limiting the scope of the present invention, in such embodiment, rather than utilizing a cartridge for each solution, the separated reservoirs within the wash solvent reservoir is configured to separately hold the solutions in the two adjacent compartments. Further, in such embodiment, quick-connect valves may be used to easily fill each compartment or reservoir with the solution. This design may be desirable to save space and avoid the costs of the cartridges that may be employed in accordance with other exemplary embodiments of the present invention. Notably, in either embodiment, the solutions are kept separated and never mixed outside of the wash reservoir also shown in these views. In one embodiment, the two reservoirs are fixed and in another they are removeable.

Turning to the next set of figures, FIG. 16-FIG. 20 depict several see-through and cross-sectional views showing various components and configurations of the components within a housing of a device in accordance with exemplary embodiments of the present invention. Various valves and pumps and sensors are shown in these views, which may be employed in some exemplary embodiments of the present invention.

Draining the reservoirs and replacing the saturated solvent with a new solvent may be achieved by the two quick connect fittings shown in FIG. 16-FIG. 20. Quick connect fitting has a release mechanism that prevent the liquid from spilling upon shutting off. FIG. 16-FIG. 20 further depict several see-through and cross-sectional views showing various components and configurations of the components within an enclosure of a device in accordance with exemplary embodiments of the present invention.

As mentioned above and may be gleaned from FIG. 16-FIG. 20, a system 1600 for washing off residual resin from objects that are 3D-printed through a vat polymerization process, in accordance with the present invention, may comprise: a wash reservoir 40 adapted to enclose a 3D-printed object, the wash reservoir in fluid communication with a solvent receptacle 10, the solvent receptacle housing a plurality of solvent solutions; a solvent disperser module 30 including an agitator 30a and one or more pumps 31, 32, the agitator 30a adapted to disperse the plurality of solvent solutions onto the 3D-printed object and the one or more pumps 31, 32 adapted to facilitate a flow of the plurality of solvent solutions between the wash reservoir 40 and the solvent receptacle 10; and a controller 20 (not shown but coupled to user interface 20a) in communication with the solvent disperser, the controller 20 including a set of executable instructions configured to: pump a first solution of the plurality of solvent solutions from the solvent receptacle 10 to the wash reservoir 40; disperse the first solutions onto the 3D-printed object; pump the first solution from the wash reservoir 40 to the solvent receptacle 10; pump a second solution of the plurality of solvent solutions from the solvent receptacle to the wash reservoir; and disperse the second solution onto the 3D-printed object.

In exemplary embodiments, the controller 20 may be further configured to: pump the second solution from the wash reservoir 40 to the solvent receptacle 10 thereby emptying the wash reservoir of any solvent solution. Subsequently, controller 20 may activate the agitator 30a to create and airflow and dry the 3D printed object.

In some exemplary embodiments, the agitator 30a comprises a propeller adapted to be fully or partially submerged in the first or second solvent solutions pumped into the wash reservoir 40—this may be achieved by forming a base or basin in which solvent solution may be gathered.

In some exemplary embodiments, the solvent receptacle comprises adjacent tanks 11a and 11b for separately holding two separate solutions. In some exemplary embodiments, the adjacent tanks 11a and 11b may comprise of cartridges. In some exemplary embodiments, system 1600 further comprises a quick connect valves 1601 and 1602 for each of the adjacent tanks 11a and 11b of the solvent receptacle 10. In some exemplary embodiments, system 1600 further comprises a resin concentration monitoring module configured to detect a resin concentration inside the solvent receptacle 10. For example, and without deviating from the scope of the present invention, the resin concentration module may include one or more sensors 10a including but not limited to an optical sensor, and/or a density sensor, and/or a pressure sensor.

To prevent spillage from the wash reservoir during operation of system 1600, in some exemplary embodiments, system 1600 further comprises an anti-splashing adapter 43 situated on a top region of the wash reservoir 40 (see also FIG. 7). In exemplary embodiments, the anti-splash adapter includes openings for facilitating an airflow within wash reservoir 40 during a drying cycle. In exemplary embodiments, as mentioned above, wash bucket 41 includes a slanted or angled surface 1603 to facilitate draining any remaining solution from the wash reservoir during a wash or dry cycle or during cleaning.

A method, performed by system 1600 for washing off residual resin from objects that are 3D-printed through a vat polymerization process, for example by system 1600, may include: (1) pumping a first solution of a plurality of solvent solutions from a solvent receptacle to a wash reservoir of the system, wherein the wash reservoir is adapted to enclose a 3D-printed object, by activating a pump of solvent disperser adapted to facilitate a flow of the plurality of solvent solutions between the wash reservoir and the solvent receptacle; (2) dispersing the first solutions onto the 3D-printed object by activating an agitator of the solvent disperser adapted to disperse the plurality of solvent solutions onto the 3D-printed object; (3) pumping the first solution from the wash reservoir to the solvent receptacle in order to substantially remove the first solution from the wash reservoir; (4) pumping a second solution of the plurality of solvent solutions from the solvent receptacle to the wash reservoir; and (5) dispersing the second solution onto the 3D-printed object.

In some exemplary embodiments, a method may further include (6) pumping the second solution from the wash reservoir to the solvent receptacle in order to substantially remove the second solution from the wash reservoir; and (7) activating the agitator to create an airflow and dry the 3D-printed object.

In some exemplary embodiments, a method may further include pumping the first solution or the second solution from the solvent reservoir to the wash reservoir comprises filling up the wash reservoir with the first or second solutions so that the 3D-printed object inside the wash reservoir is fully submerged in the solvent during a rinsing cycle.

In some exemplary embodiments, a method may further include pumping the first solution or the second solution from the solvent reservoir to the wash reservoir comprises filling up the wash reservoir with the first or second solutions so that a propeller of the agitator is fully submerged in the solvent during a splashing cycle. In some embodiments, the propeller is full submerged by 3-5 mm.

In some exemplary embodiments, a method may further include pumping the first solution or the second solution from the solvent reservoir to the wash reservoir comprises filling up the wash reservoir with the first or second solutions so that a solvent level inside the wash reservoir is lower than the lowest point of a propeller of the agitator during a jetting cycle. In some embodiments, the solvent level inside the wash reservoir is lower than the lowest point of a propeller of the agitator by 3-5 mm during a jetting cycle.

In some exemplary embodiments, a method may further include monitoring a resin concentration inside the solvent receptacle using one or more sensors including an optical sensor, a density sensor, or a pressure sensor.

Turning to the next set of figures, FIG. 21-FIG. 28 show a system that employs a cage 2400. More specifically, in these figures another exemplary embodiment is depicted in which a top is provided to cover the aperture of the washing reservoir instead of the platform receiving aperture shown in other figures discussed above. That is, an apparatus in accordance with the present invention may be configured to receive parts inside a cage (i.e., in contrast with the embodiment in FIG. 11-FIG. 12). The parts may be washed using the same methods and systems in accordance with the present invention but in this version the parts are securely placed inside the cage rather than coupled directly to the aperture as is the case in the embodiment configured to receive a 3D printer platform. In some exemplary embodiments, the aperture is configured to receive both the platform and the lid shown in these views.

Figure 22:
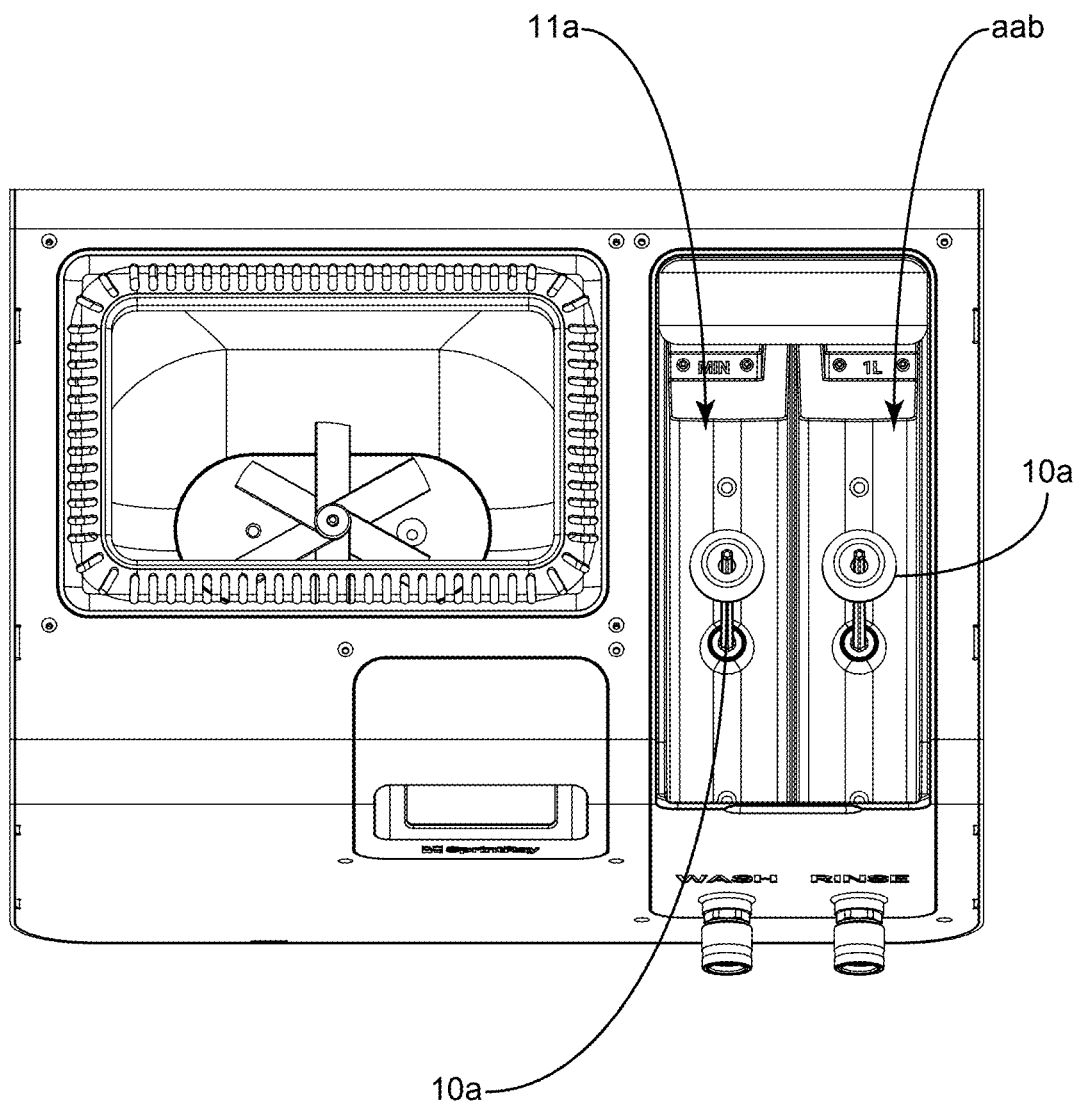
FIG. 22 illustrates an exemplary enclosure for housing the components depicted in FIG. 16-FIG. 21.
Figure 23A:
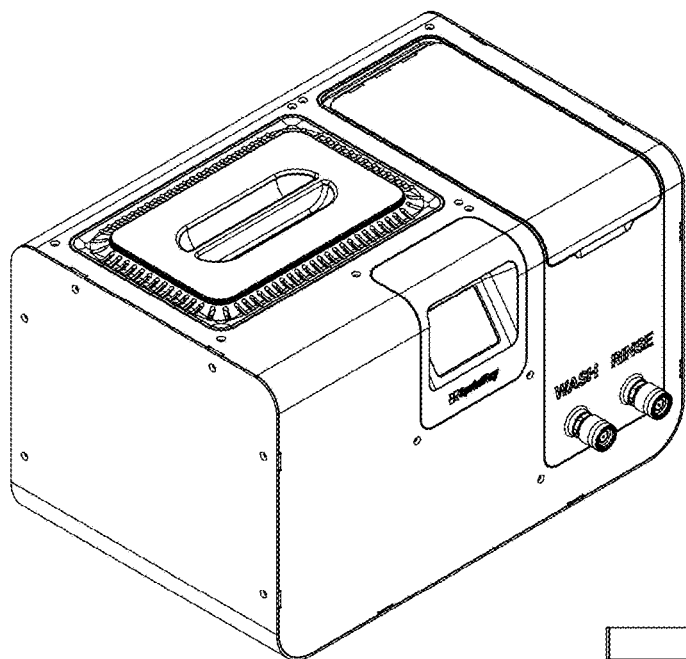
FIG. 23A-FIG. 23C depict a first perspective side view, a top view, and a second perspective side view, respectively, of an exemplary embodiment of the present invention that employs a cage for enclosing 3D printed objects therein.
Figure 23B:
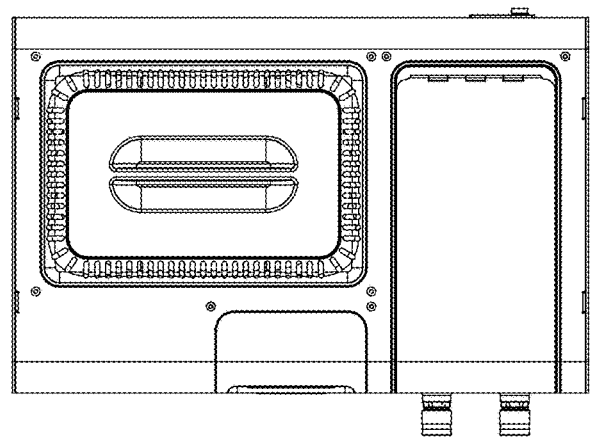
Figure 23C:
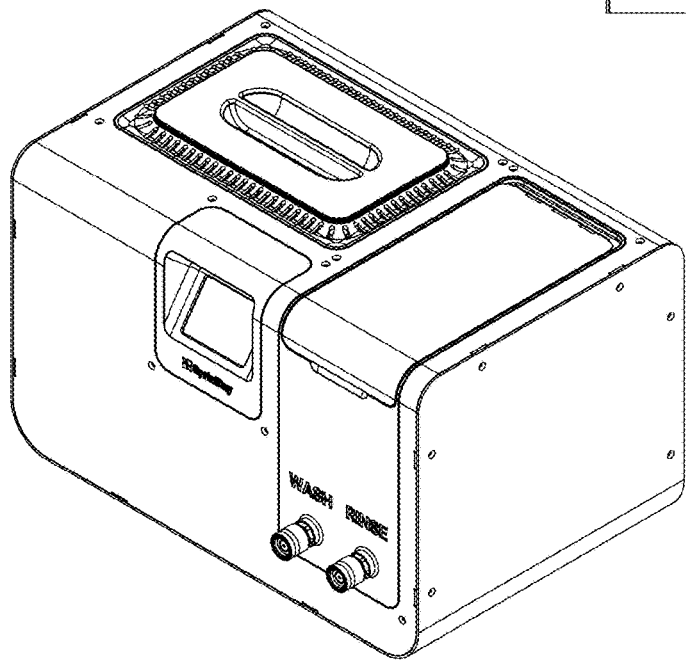

More specifically, FIG. 22 illustrates an exemplary enclosure for housing the components depicted in FIG. 16-FIG. 21. FIG. 23A-FIG. 23C depict a first perspective side view, a top view, and a second perspective side view, respectively, of an exemplary embodiment of the present invention that employs a cage for enclosing 3D printed objects therein. FIG. 24A-FIG. 24B depict a first exploded perspective side view, and a second exploded perspective side view of the exemplary embodiment illustrated in FIG. 23A-FIG. 23C. FIG. 25A-FIG. 25C depict an exploded view and exploded side views, respectively, of the exemplary embodiment illustrated in FIG. 23A-FIG. 24B.

Figure 26A:
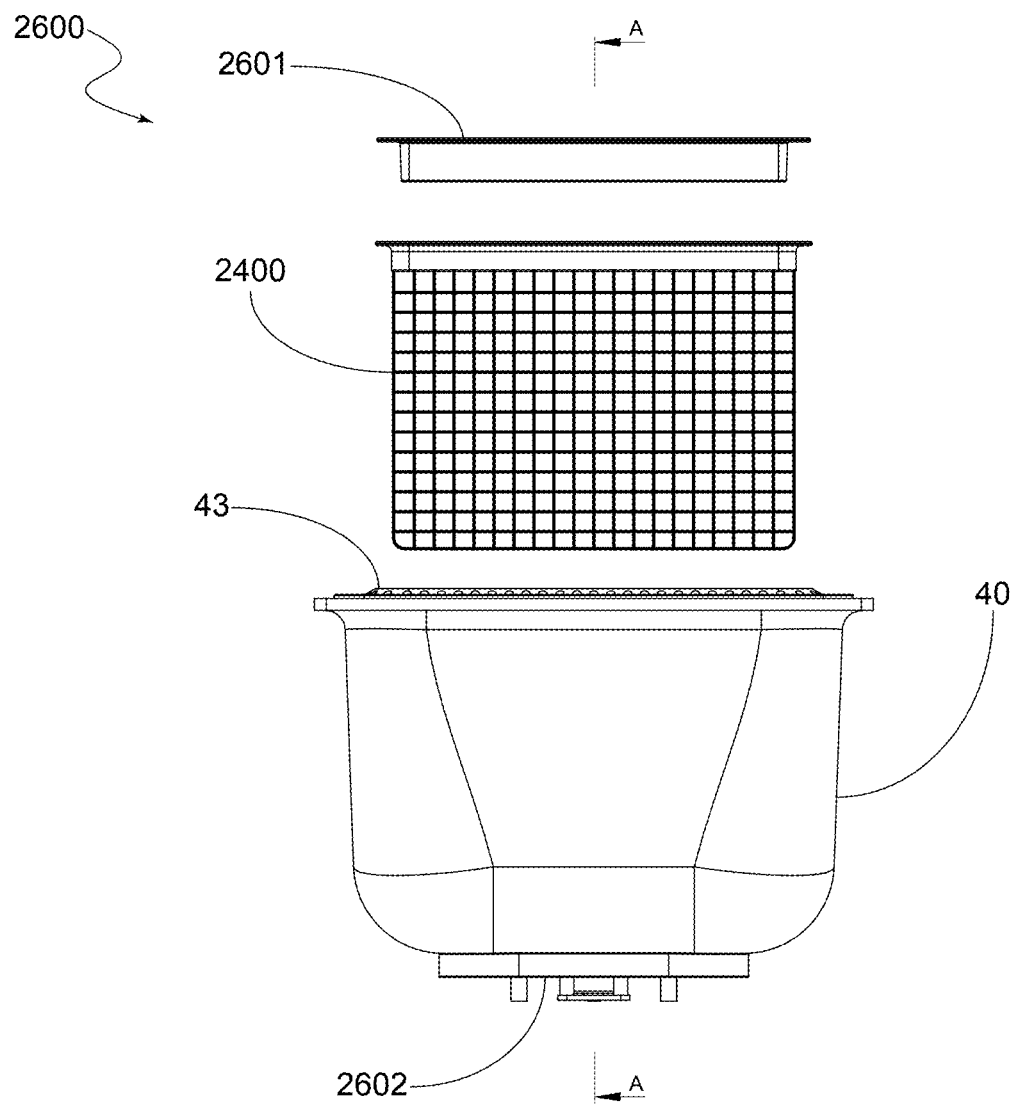
FIG. 26A-FIG. 26B depict an exploded front view and a bottom view, respectively, of an exemplary wash reservoir including a cage adapted to enclose a 3D printed object therein.
Figure 26B:
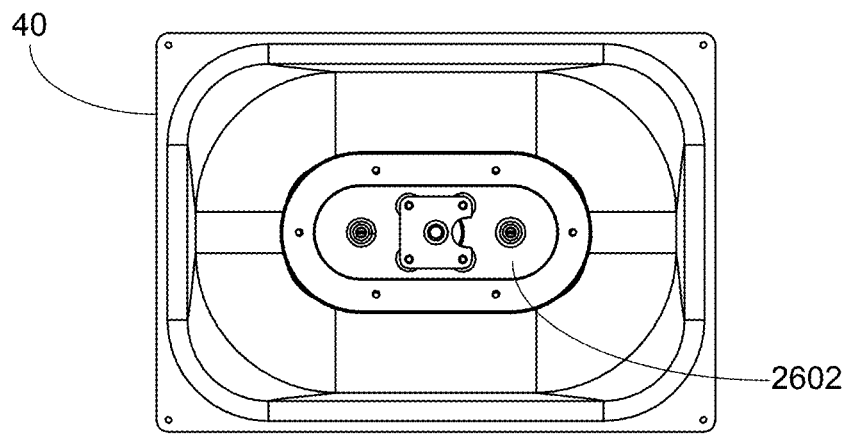

FIG. 26A-FIG. 26B depict an exploded front view and a bottom view, respectively, of an exemplary wash reservoir including cage 2400 adapted to enclose a 3D printed object therein. In this embodiment of these views, the wash system 2600 includes a lid 2601 and a cage 2400, which fits inside wash reservoir 40. FIG. 26B depicts a bottom view illustrating the bottom region of a motor assembly 2602 in accordance with the present invention. The lid 2601 may include a lid handle 2603, and in exemplary embodiments, as shown in FIG. 29, a region of the lid extending into the interior of wash reservoir 40 may include a coupling means such as a retaining arm 2901 for suspending cage 2400 inside wash reservoir 40.

Figures 27A, 27B:
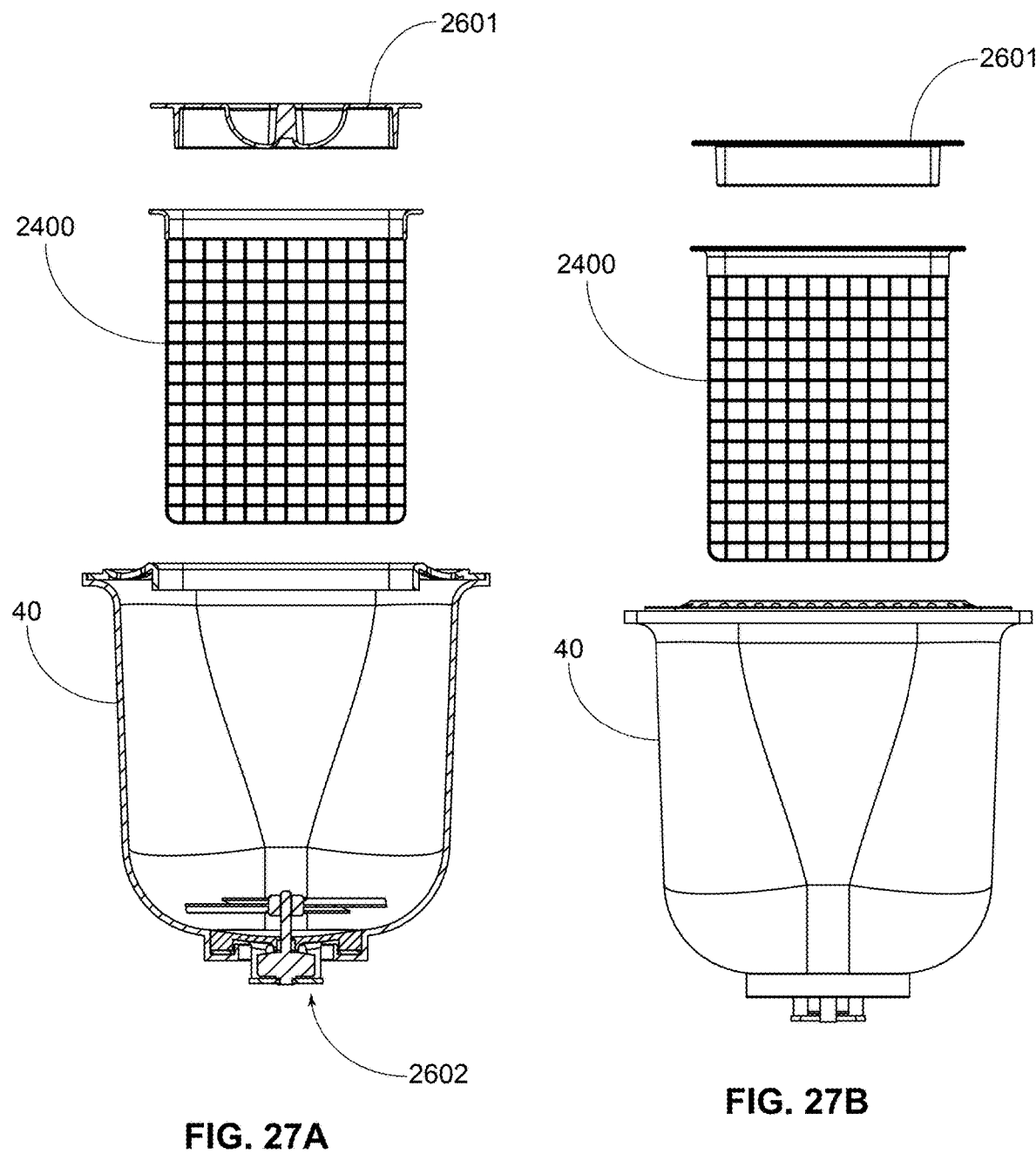
FIG. 27A-FIG. 27B depict an exploded cross-sectional view along the segment A-A of FIG. 26A and an exploded side view thereof, respectively, of an exemplary wash reservoir including a cage adapted to enclose a 3D printed object therein.
Figure 28:
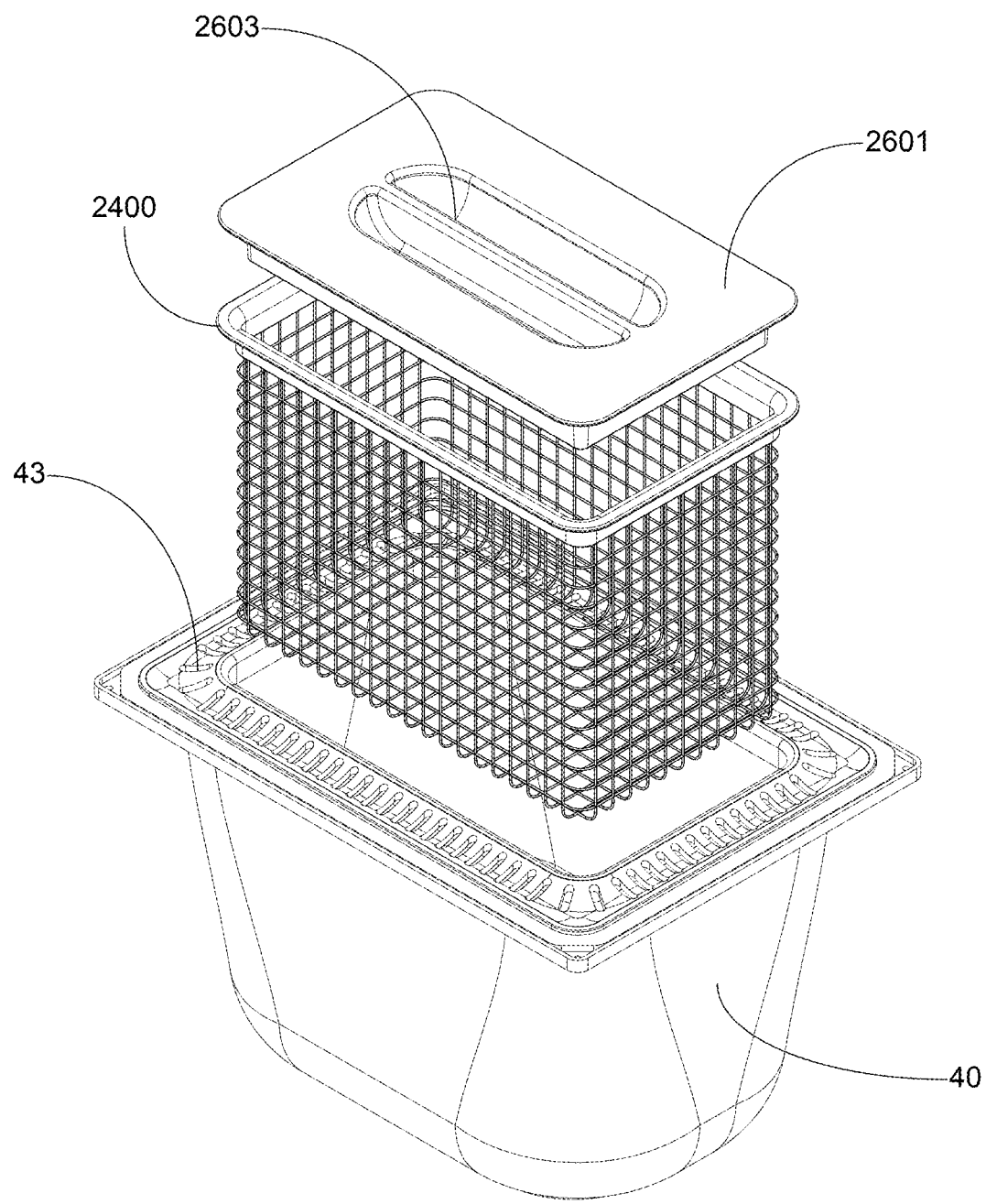
FIG. 28 depicts an exploded perspective view of exemplary wash reservoir including a cage adapted to enclose a 3D printed object therein.

FIG. 27A-FIG. 27B depict an exploded cross-sectional view along the segment A-A of FIG. 26A and an exploded side view thereof, respectively, of an exemplary wash reservoir including a cage adapted to enclose a 3D printed object therein. FIG. 28 depicts an exploded perspective view of exemplary wash reservoir including a cage adapted to enclose a 3D printed object therein. Moreover, the embodiment illustrated the figures referenced immediately above, may provide a more cost-effective and space saving design. Further, this design may be more environmentally friendly since it avoids use of various cartridges that may have to be refilled or otherwise disposed of after use.

Now turning to the next figure, FIG. 29 depicts a cross-sectional view of one exemplary embodiment for a wash reservoir including a solvent disperser module configured to disperse solvent within a wash reservoir in accordance with the present invention. More specifically, FIG. 29 illustrates a motor assembly 2600 of a solvent disperser module in accordance with the present invention. The motor assembly 2600 may employ a propeller 2902 to splash a liquid solvent 2903 upwards in a manner so that plenty of liquid will be dispersed on the 3D printed object, largely washing away the resin residue. Dispersing may include, jetting, splashing, or otherwise directing a flow of the solvent onto the 3D-prtitned part that may be suspended or secured within wash reservoir 40. In some embodiments, the system may employ a wash cycle that includes submerging or immersing the 3D printed object inside the wash reservoir, by for example, filling up the reservoir so that a 3D printed object therein is completely or substantially submerged, and activating the propellor 2902 in order to create a flow of the solvent liquid within the wash reservoir 40 and dislodge or remove any undesired residue.

In exemplary embodiments, for each cycle, the system consumes only 370 ml liquid, and the wash takes 3 mins. The high running speed with 3000 RPM of a brushless motor 2904, will drive the propeller to spin the surrounding liquid up. Calculating the optimal volume of the liquid consumed, this maximally releases the power of the brushless motor, and increases the liquid exchange rate with the wash part surface. In some embodiments, a brushless motor selection with proper KV rating and speed setting may deliver sufficient force of the liquid onto the part being washed. One benefit of this system is using a minimum volume of liquid to deliver the highest efficiency of wash result. Compared with conventional methods for washing, motor assembly 2600 highly increases the wash efficiency and wash cleanness results.

Figure 30:
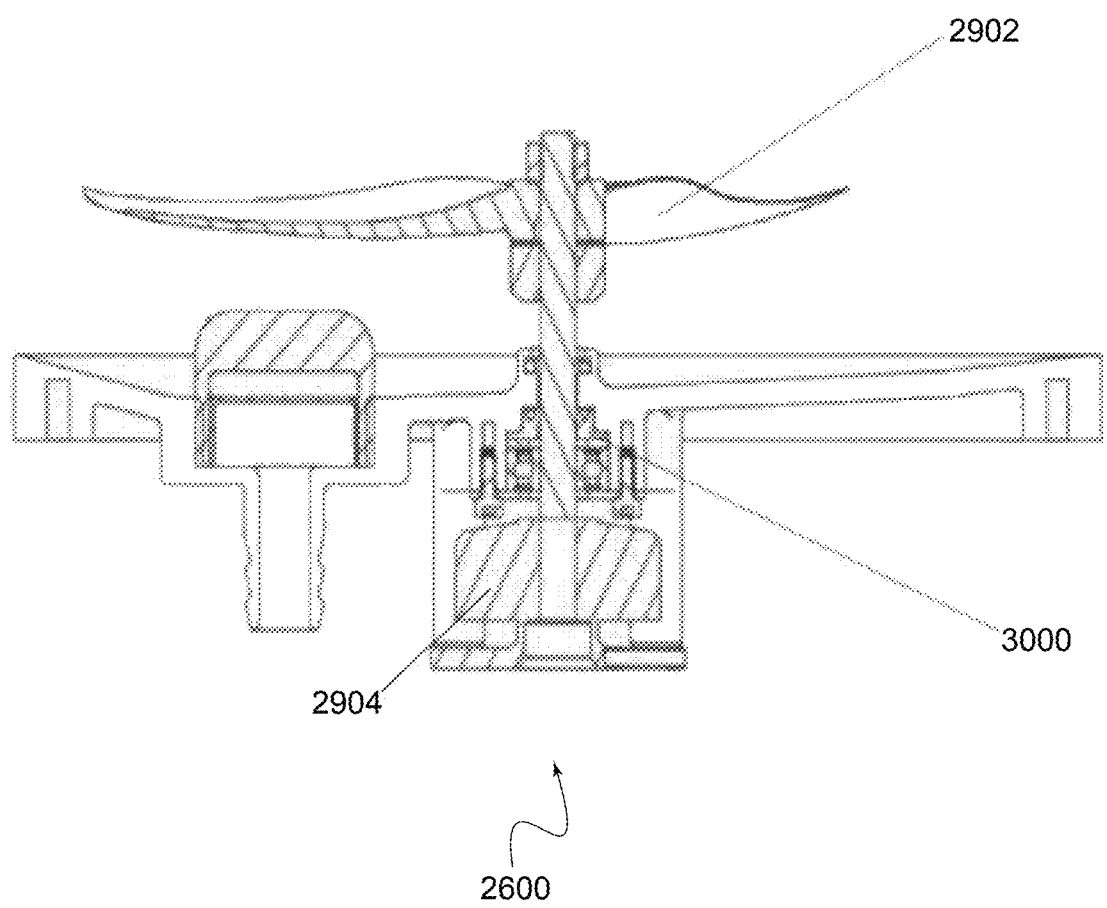
FIG. 30 depicts a cross-sectional view of some exemplary components of a solvent disperser module in accordance with the present invention.

Turning now to the next figure, FIG. 30 depicts a cross-sectional view of some exemplary components of a motor assembly for a disperser module in accordance with the present invention. More specifically, FIG. 30 depicts motor assembly 2600. To deliver a stable liquid dispersion, a motor 2904 drives an agitator, which in some exemplary embodiments as shown in this figure may comprise of a propeller 2902 to spin at stable RPMs. To deliver long-term usage, a seal may be preferably employed by assembly 2600, for example, and without limiting the scope of the present invention, a dynamic seal 3000. Dynamic seal 3000 may comprise of a rotary seal, or a power transmission seal. As may be appreciated by a person of ordinary skill in the art, dynamic seal 3000 is configured to seal openings between a rotating and a stationary component.

Figure 31A:
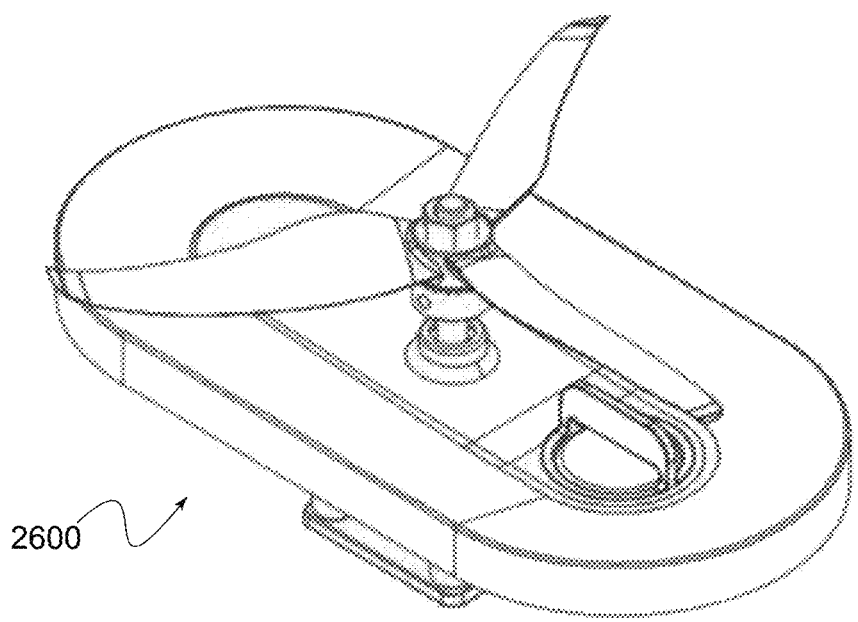
FIG. 31A depicts a perspective view of a solvent disperser assembly housing a motor in a sealed configuration.
Figure 31B:
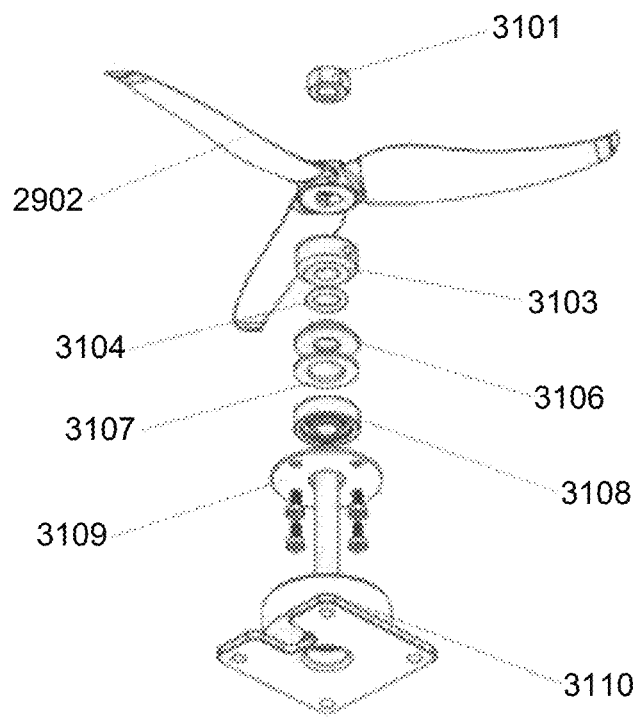
FIG. 31B depicts an exploded view of the components of the solvent disperser assembly depicted in FIG. 31A.

FIG. 31A depicts a perspective view of motor assembly 2600 and FIG. 31B depicts an exploded view thereof. The motor assembly 2600 may include lock nuts 3101, that lock the propeller to the assembly, propeller 2902, propeller seat 3103, which is a collar that contains the set screw to secure the propeller seat, a protecting O-ring 3104, a component for minimize the liquid flow into the seal, a grease component (not numbered)—such as a chemical resistant grease to help isolate the liquid that may traverse through the seal, a flange rotary seal 3106—a seal with flange that is the primary seal surface—a spacer 3107, a bearing 3108—a rotary assistant, a seal cover 3109, which is tightened by 4 M2 screws and compresses the entire assembly, and a brushless motor 3110, which may be configured to run at 3000 rpm in some exemplary embodiments, and which is the power source of the motor assembly 2600 to drive the propeller 2902.

Figure 32A:
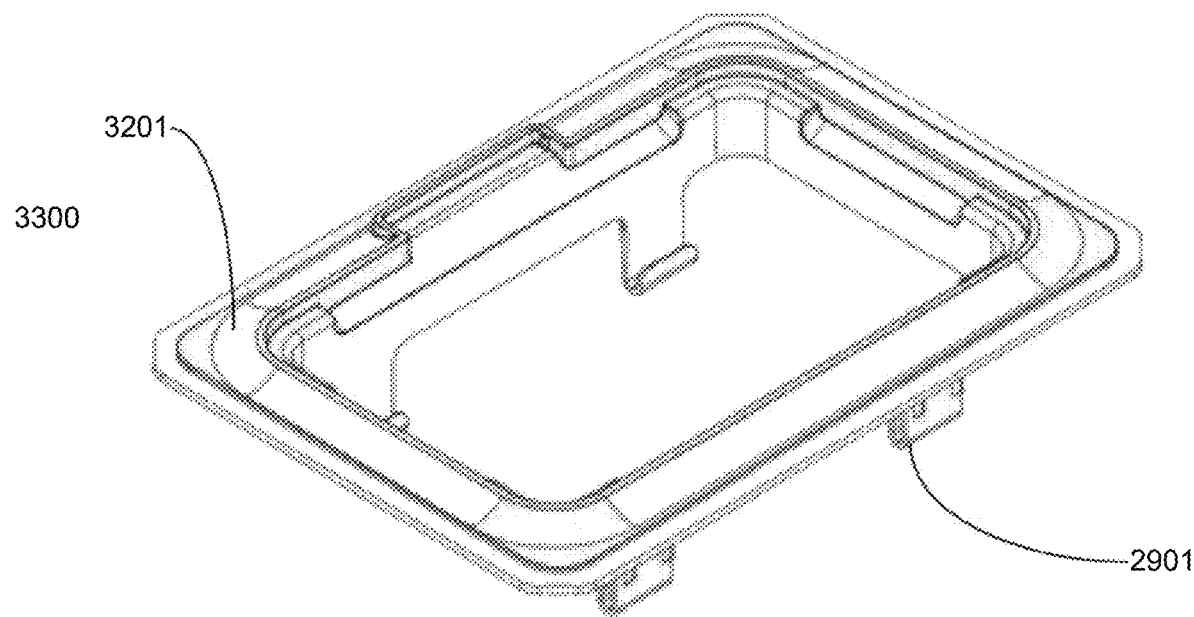
FIG. 32A-FIG. 32B depict a perspective view and a cross-sectional view of an airway or airflow system in accordance with some exemplary embodiments of the present invention.
Figure 32B:
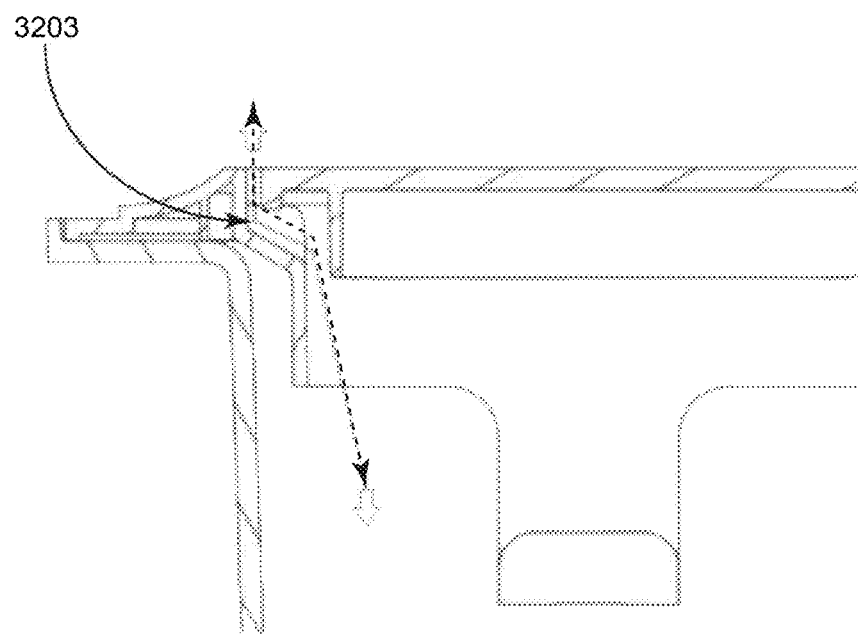

Turning now to the next set of figures, FIG. 32A-FIG. 32B depict a perspective view and a cross-sectional view of an airway or airflow system in accordance with some exemplary embodiments of the present invention. More specifically, these figures depict a unique design of an airflow system 3200, which comprises of a lid or lid adapter that provides an air channel to deliver the air exchange system between the chamber or cavity of wash receptacle 40 and the exterior thereof, as well as an anti-splash guard that may be built into the adapter. FIG. 32B shows how a splash guard 3201 registers with a wash bucket 4 with a retaining arm 2901 that extends from a bottom region of the splash guard 3201. Moreover, FIG. 32B depicts channel 3203 for providing an airflow or ventilation into the wash reservoir. In this embodiment, retaining arm 2901 extends from a bottom portion of splash guard 3201. The channel 3203 of airflow system 3200 facilitates a flow of air when, for example, an air-drying cycle is performed by allowing a flow of air into and or out of wash reservoir 40.

Figure 33A:
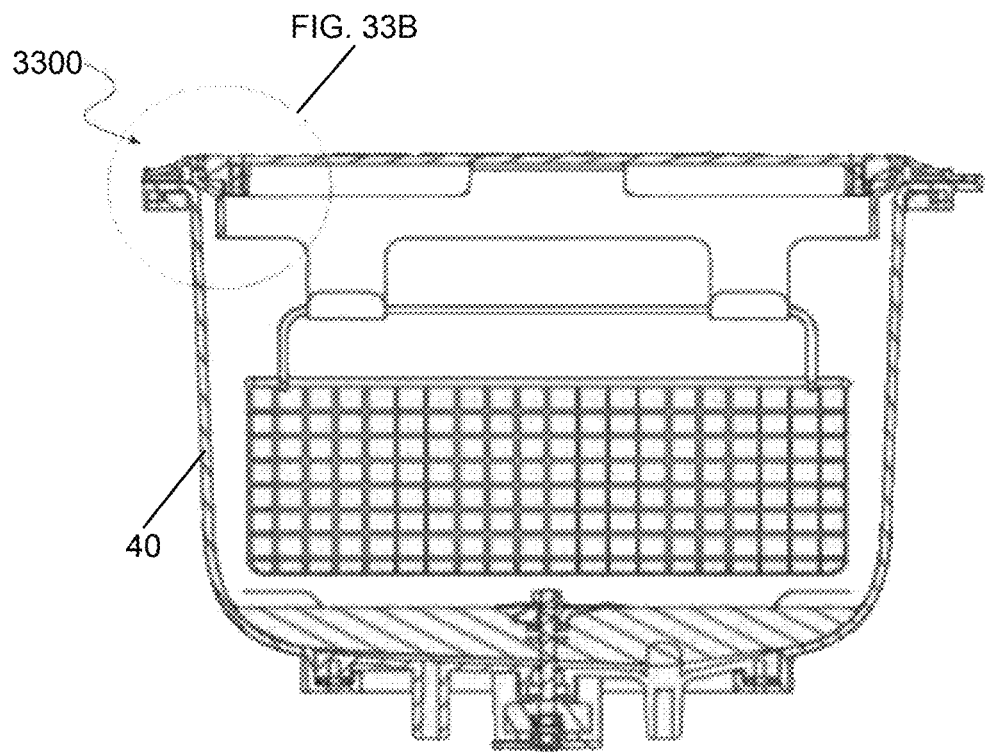
FIG. 33A-FIG. 33B depict a cross-sectional view and a close-up cross-sectional view, respectively, of an enclosure monitoring system in accordance with some exemplary embodiments of the present invention.
Figure 33B:
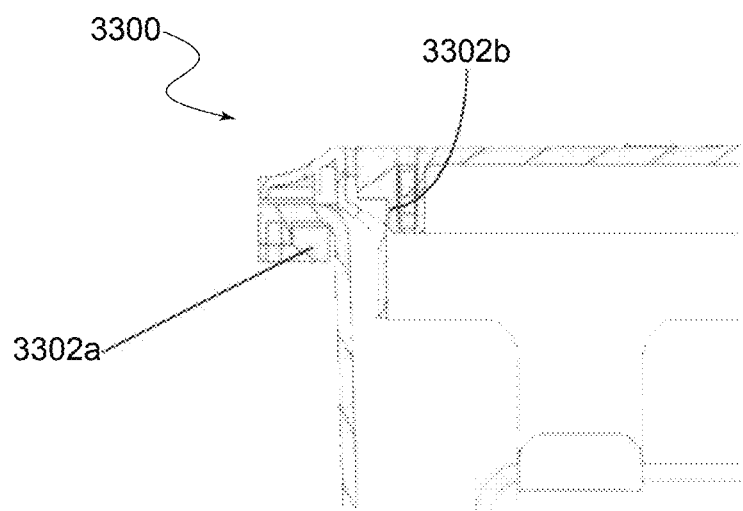

Turning now to the next set of figures, FIG. 33A-FIG. 33B depict a cross-sectional view and a close-up cross-sectional view, respectively, of an enclosure monitoring system in accordance with some exemplary embodiments of the present invention. More specifically, these views depict enclosure monitoring system 3300, which may include a magnet sensor system designed to identify whether the wash lid or the platform is sitting flat. FIG. 33A shows the whole picture of the magnet sensor system with a wash bucket 3301. FIG. 33B is the detail section view of how the magnet sensors 3302a, 3302b may be positioned. For example, and without limiting the scope of the present invention, a first magnet 3302a is taped on the platform, and inserted into the groove of the wash lid. A second magnet 3302b may be mounted on the outside of the wash bucket. When laying down the wash lid or the platform, the magnet will create the hall effect, which enables a controller to read the sensor feedback and determine a position of the wash lid and or platform. This user-friendly feature could protect the user when they open the wash lid or platform, the system will automatically pause to avoid the liquid splash out of the machine. Once the user places back the wash lid or platform, the system will resume the process.

Figure 34A:
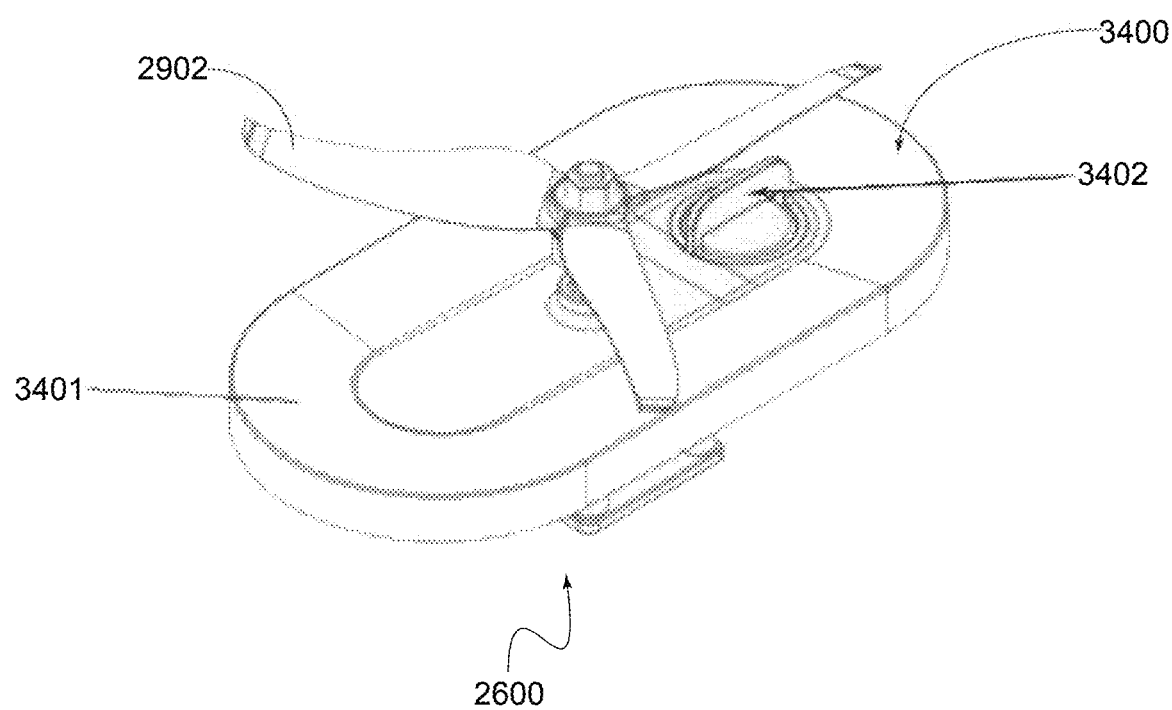
FIG. 34A-FIG. 34B depict a perspective view and a cross-sectional view of a vortex breaker in accordance with some exemplary embodiments of the present invention.
Figure 34B:
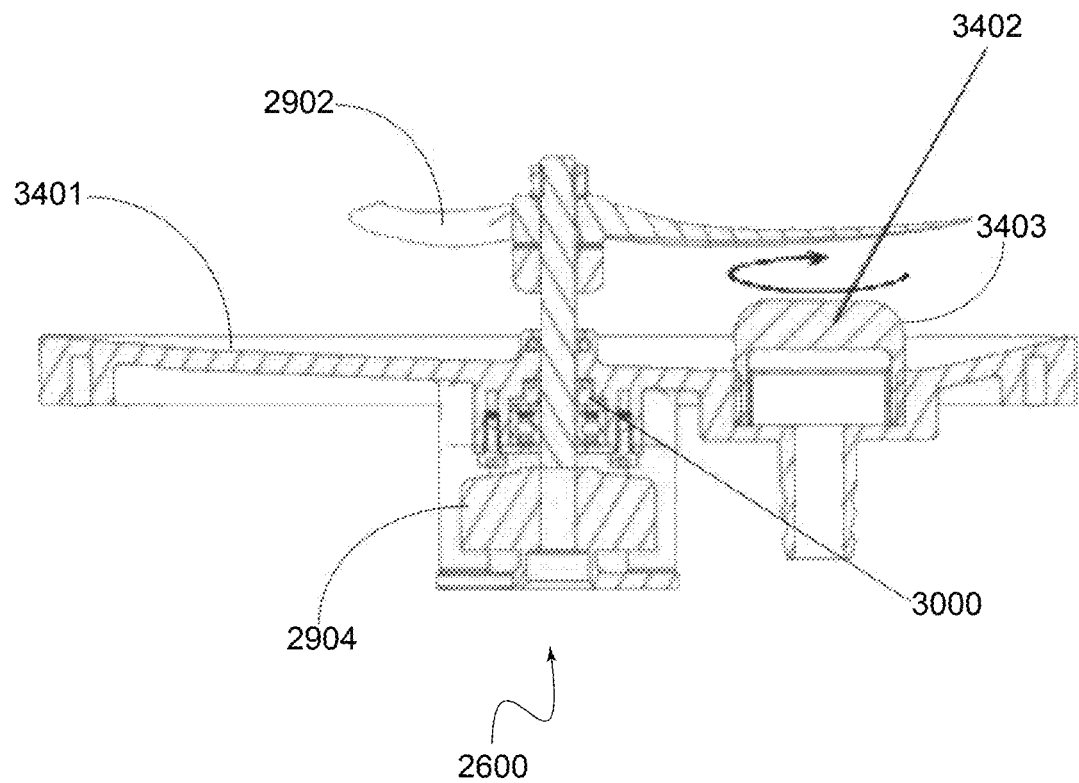

Turning to the next set of figures, FIG. 34A-FIG. 34B depict a perspective view and a cross-sectional view of a vortex breaker in accordance with some exemplary embodiments of the present invention. More specifically, these figures show vortex breaker 3400, an exemplary feature that may be implemented on a base or surface of disperser module 30 such as on a base portion of motor assembly 2600 of the disperser module 30. FIG. 34A illustrates how vortex breaker 3400 may be situated as a replaceable part on a base 3401. The function of it is to stop the formation of the vortex when draining the liquid through one or more drain holes that may be sealed and or controlled with a drain control 3402. FIG. 34B depicts a cross-sectional view of the vortex breaker 3400. The unique feature includes a twist knob 3403 of drain control 3402, that is easy to remove by the user. By opening up knob 3403, drainage can be more efficiently achieved.

FIG. 35A-FIG. 35C depict a front view and side views, respectively, of the exemplary embodiment illustrated in FIG. 23A-FIG. 28, the housing shown in a sealed configuration with a top lid in the closed position.

Figure 36:
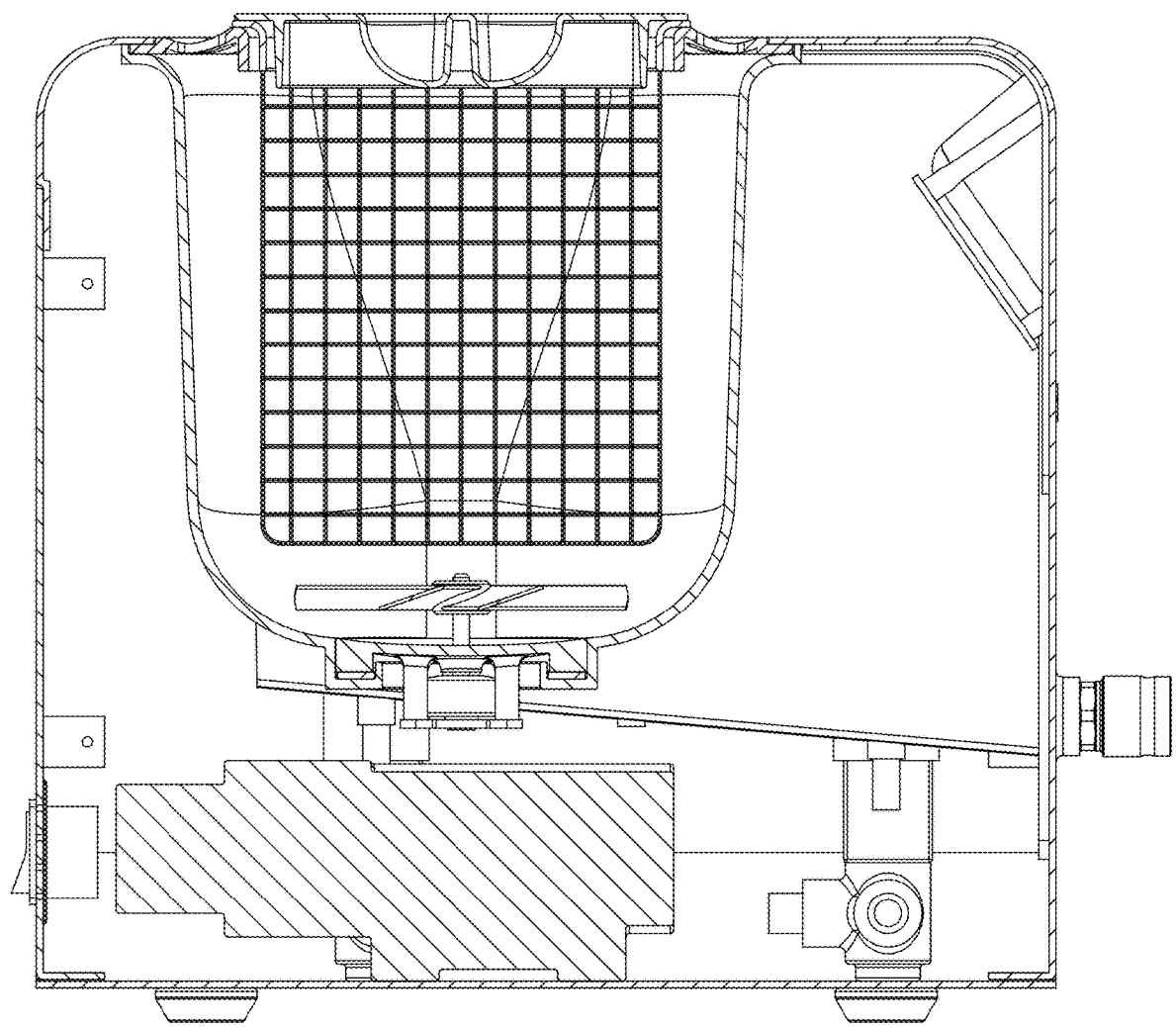
FIG. 36-FIG. 37 depict cross-sectional views along line segments D-D and K-K as shown in FIG. 35A.
Figure 37:
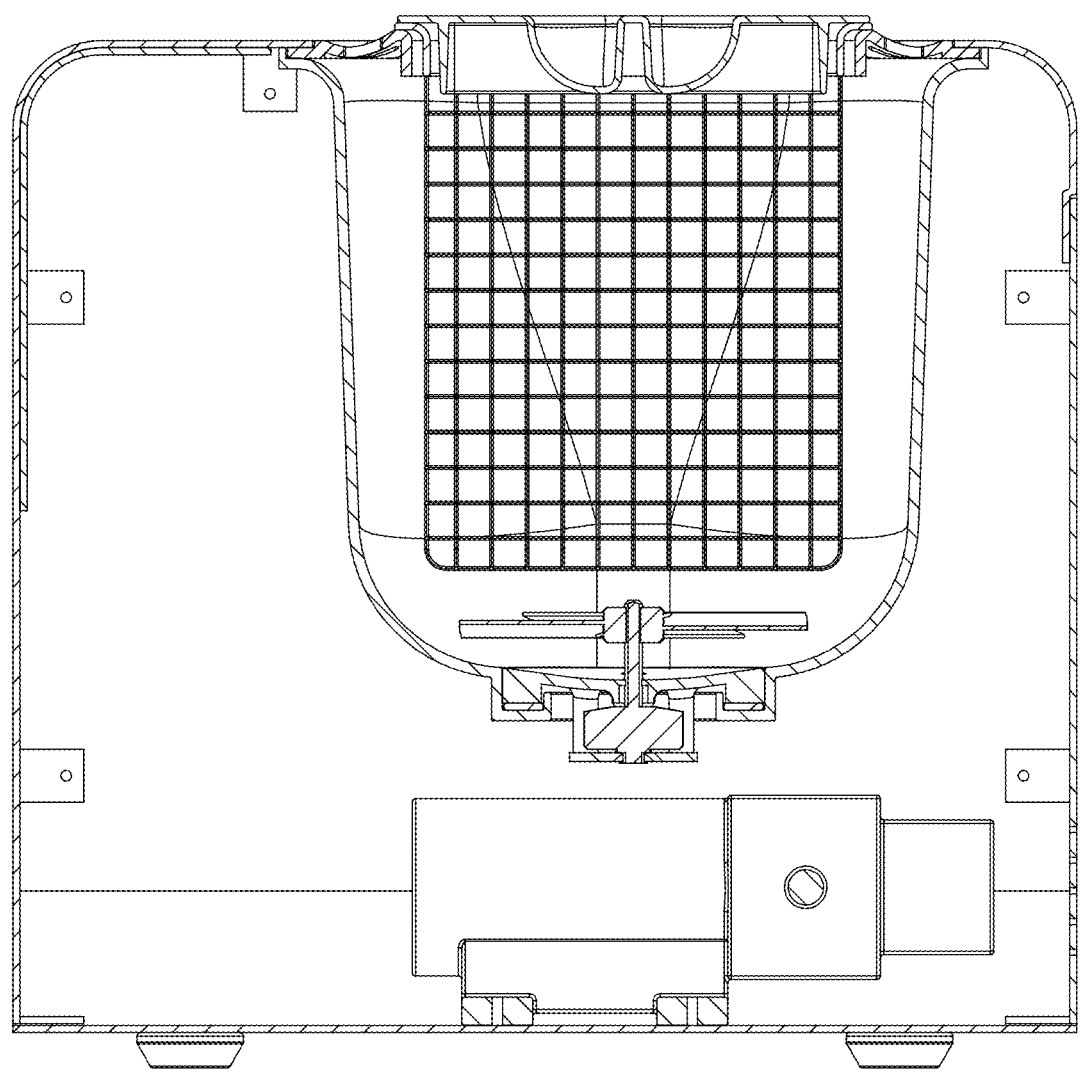
Figure 38:
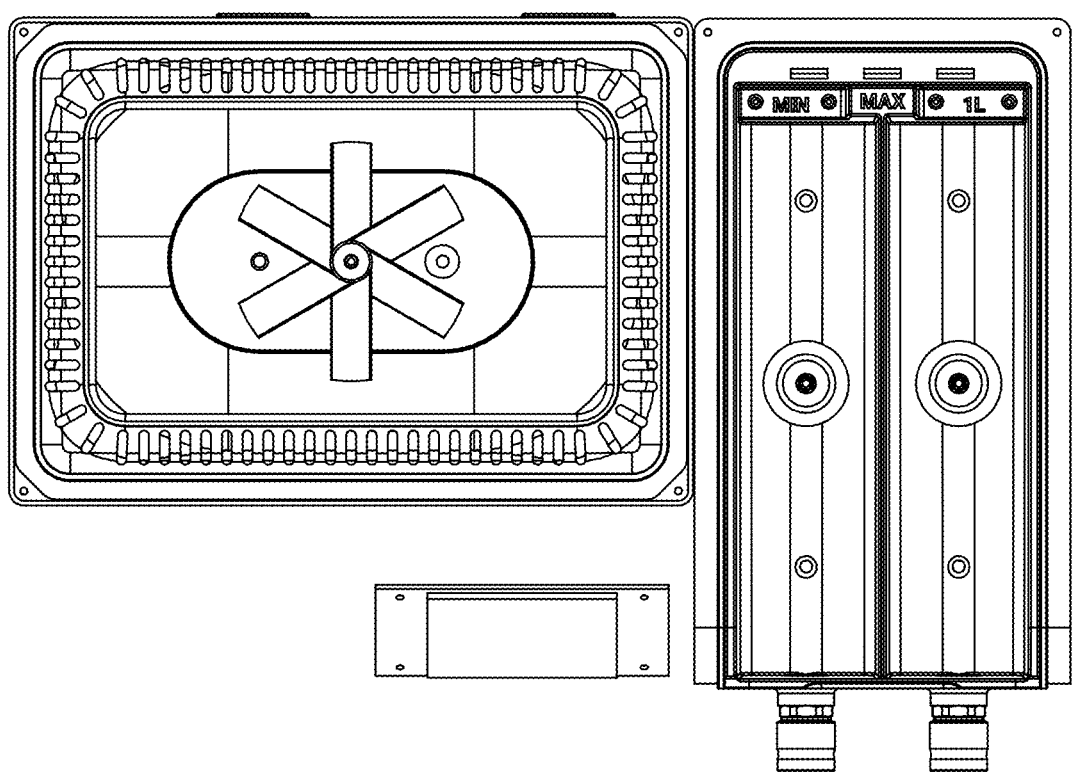
FIG. 38-FIG. 42 depict a top view, and several perspective views of an exemplary embodiment of the present invention in which two removable cartridges serve as repositories for two solutions kept separately adjacent to the washing cavity.
Figure 39:
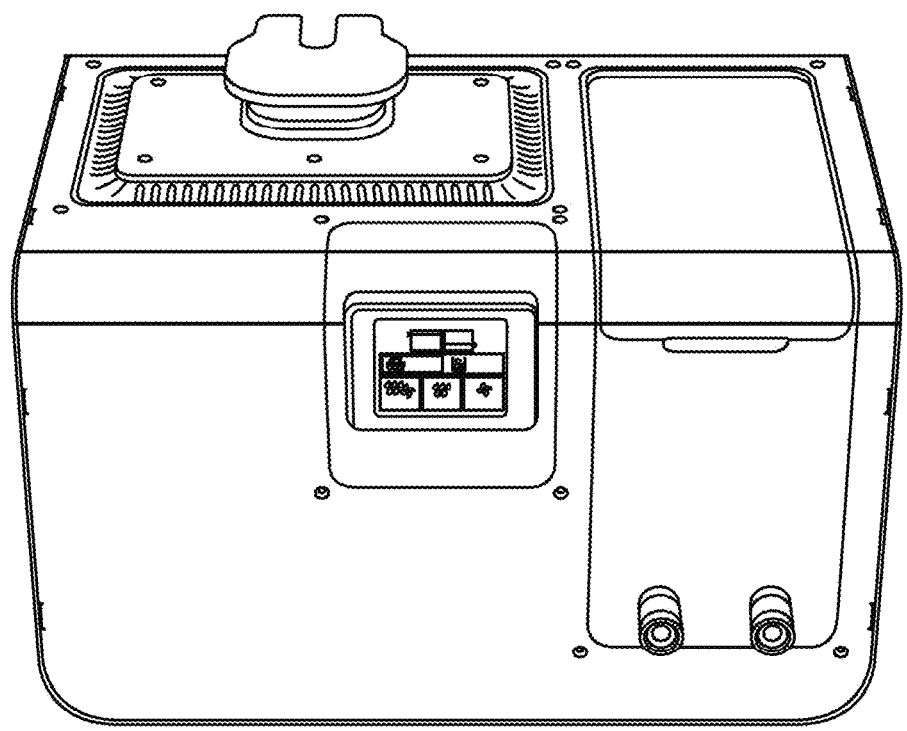
Figure 40:
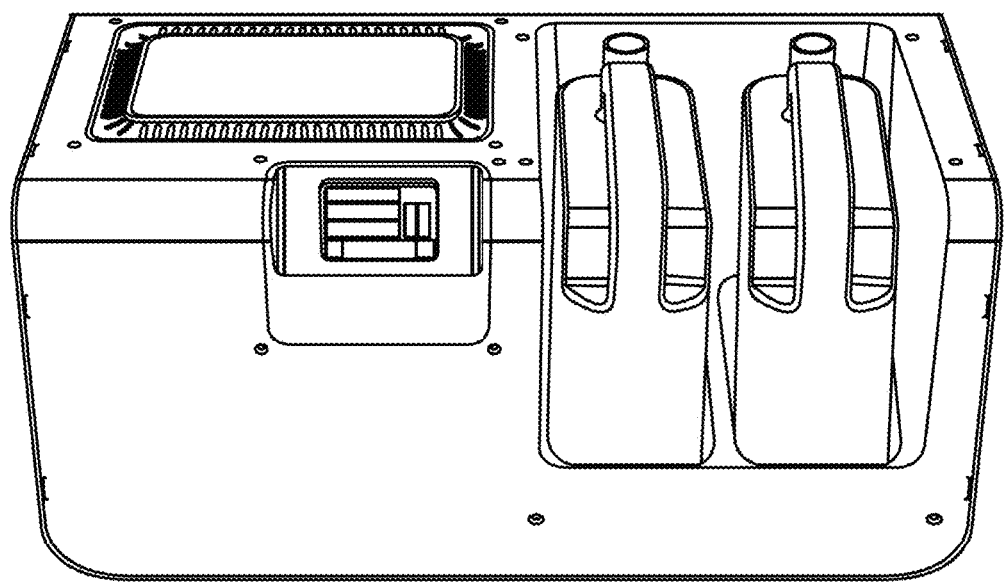
Figure 41:
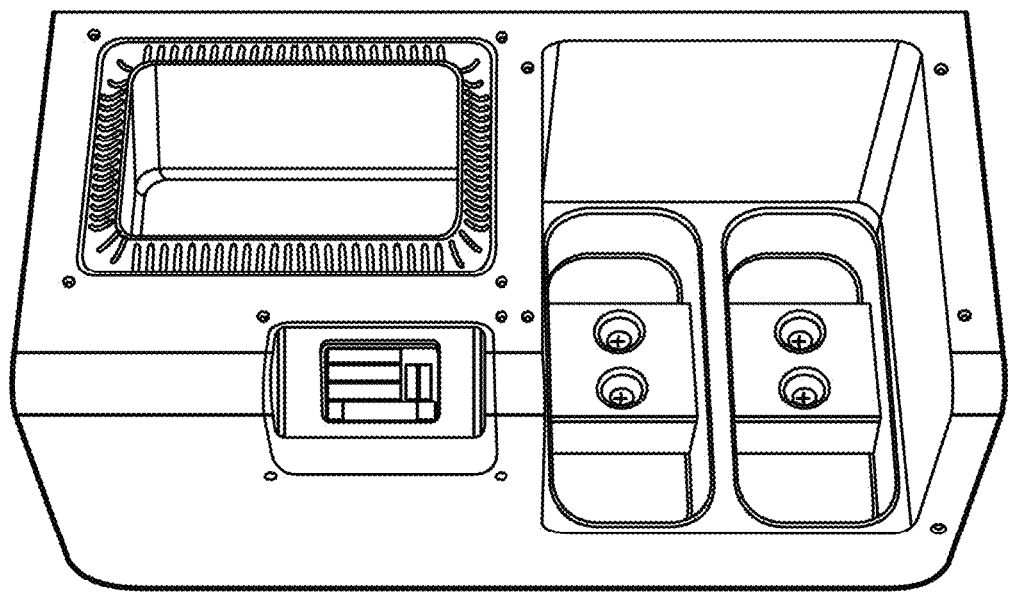
Figure 42:
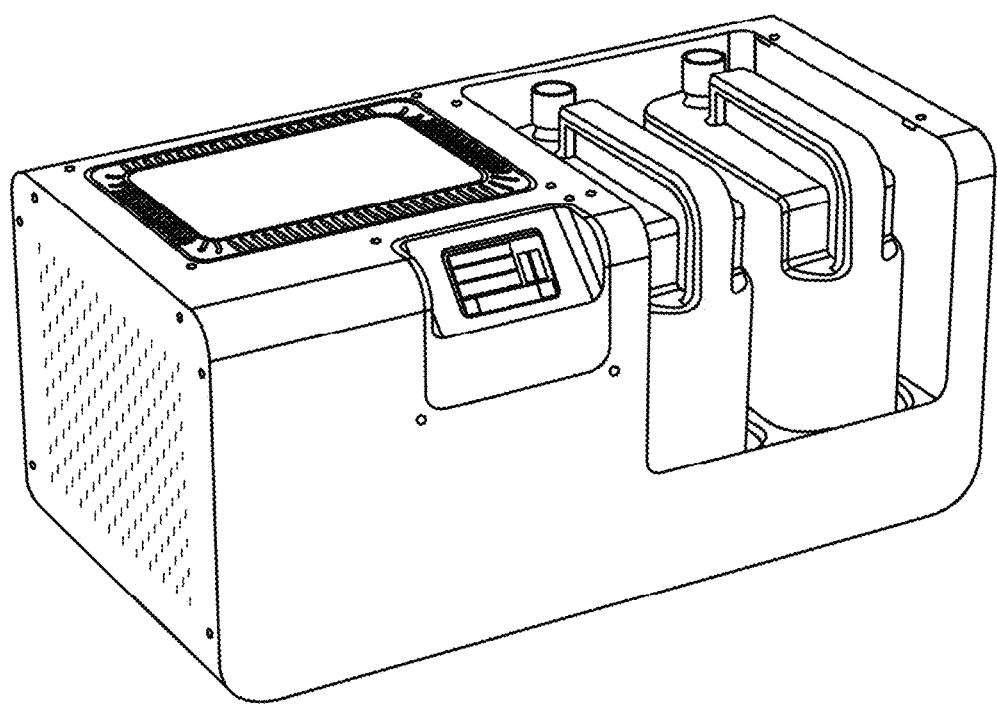

FIG. 36-FIG. 37 depict cross-sectional views along line segments D-D and K-K as shown in FIG. 35A, illustrating the cage within the wash reservoir. As may be appreciated from these views and as described above, during some cycles, the agitator such as a propeller of the washing system may be completely submerged, partially submerged (as in FIG. 29) or completely above a solution or liquid level within the wash reservoir of the system, depending on the cycle (i.e., the different wash cycles, or an air-dry cycle).

FIG. 38-FIG. 42 depict a top view, and several perspective views of an exemplary embodiment of the present invention in which two removable cartridges serve as repositories for two solutions kept separately adjacent to the washing cavity. This design is an exemplary design in accordance with embodiments discussed above, including as described with reference to FIG. 3-4, and FIG. 6.

Figure 43:
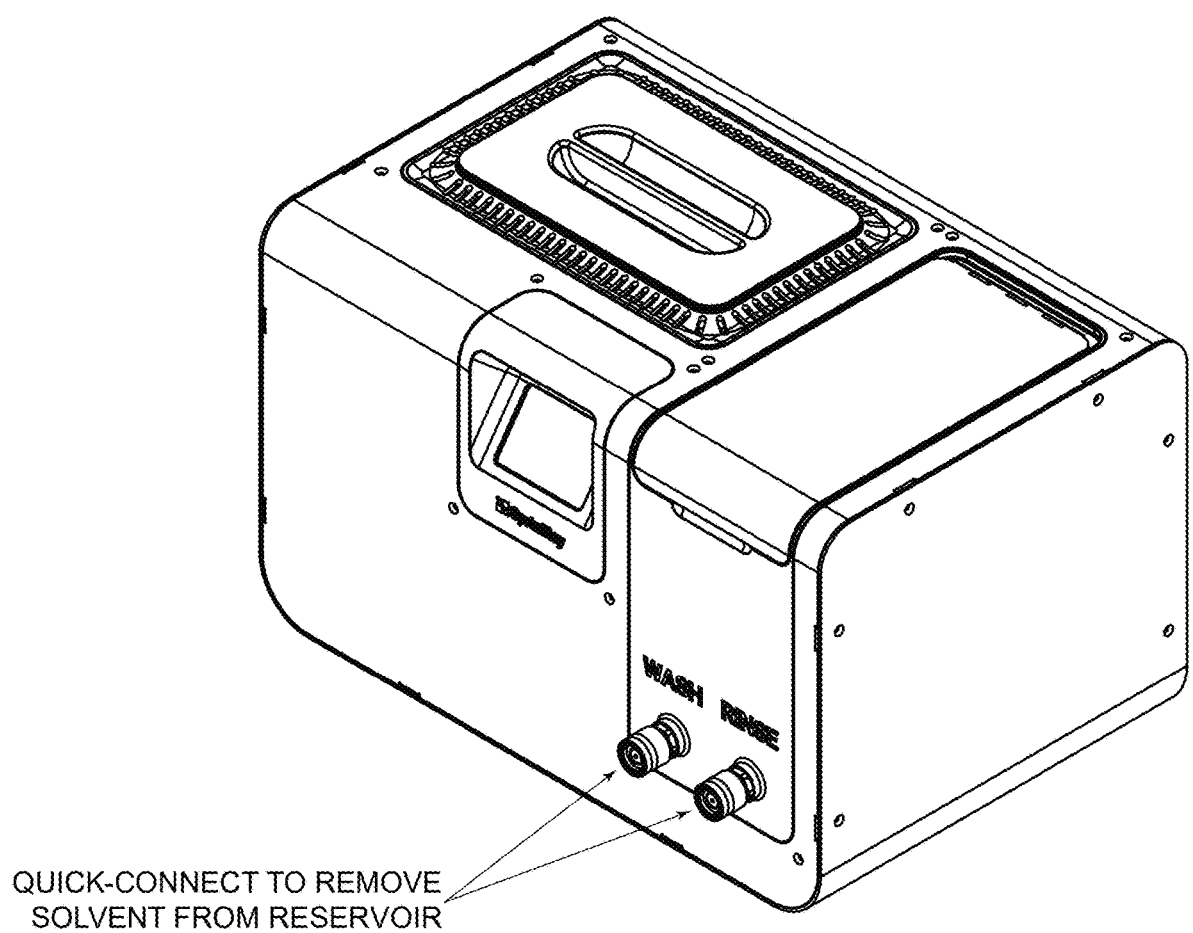
FIG. 43 depicts a perspective view of an exemplary embodiment of the present invention that employs a quick-connect valve system for efficiently removing solvent from one or more solvent reservoirs.

FIG. 43 depicts a perspective view of an exemplary embodiment of the present invention that employs a quick-connect valve system for efficiently removing solvent from one or more solvent reservoirs.

Figure 44A:
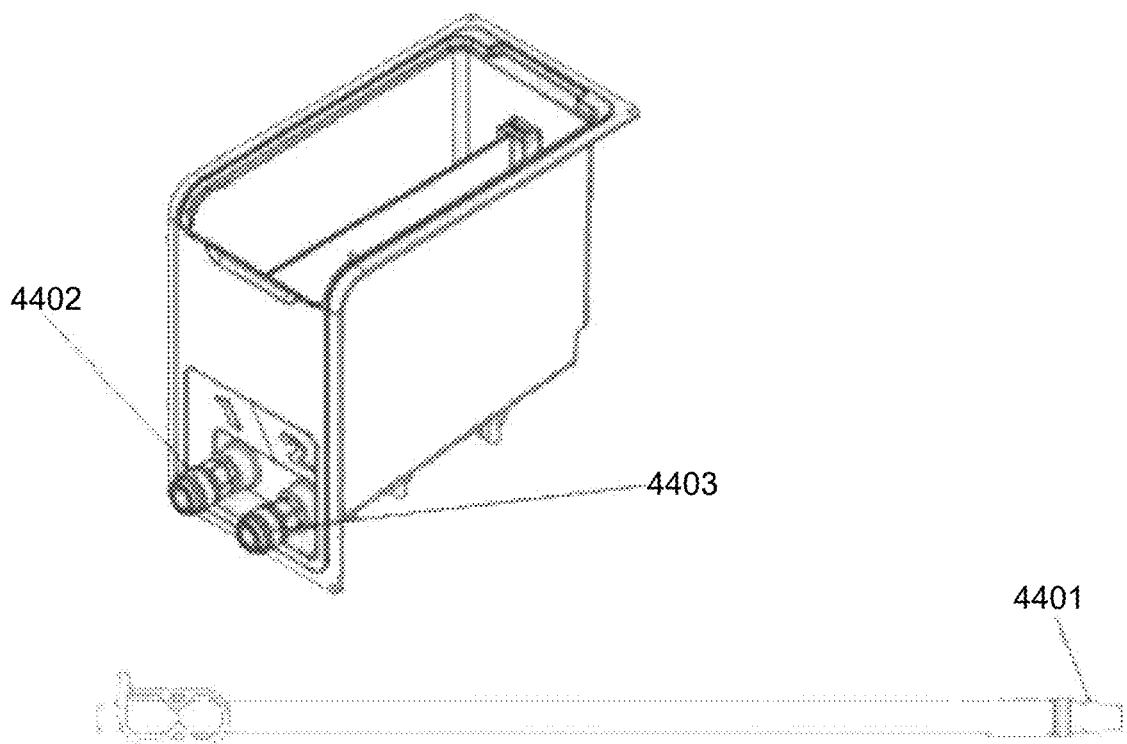
FIG. 44A-44B depict components for a quick-connect valve system in accordance with the present invention.
Figure 44B:
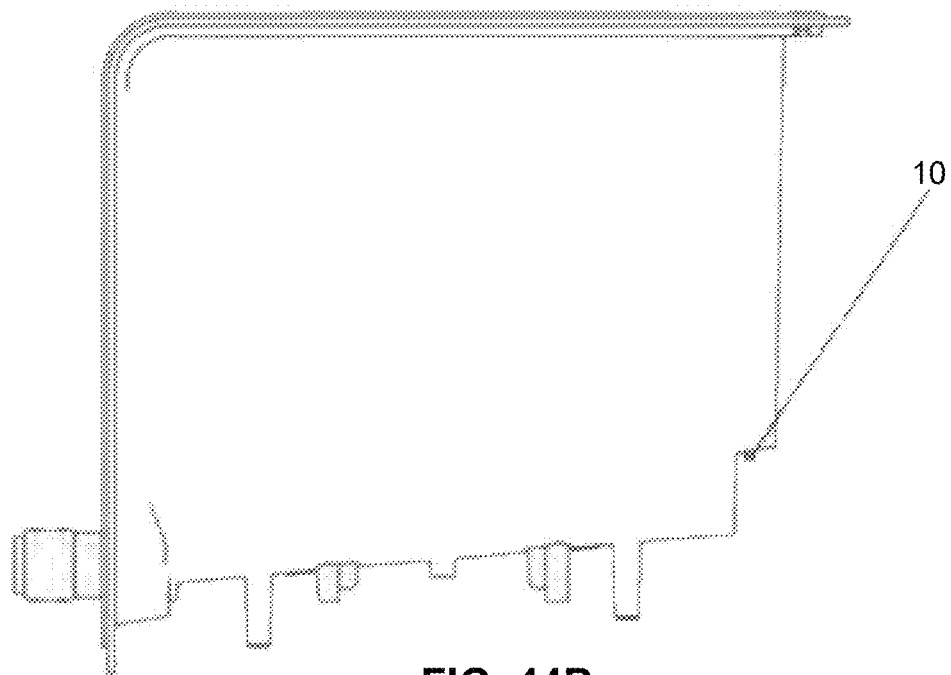

FIG. 44A-44B depict components for a quick-connect valve system in accordance with the present invention. As mentioned above, the quick-connect valves or fittings on an exterior of each reservoir may be used to easily drain or replace each of the solutions therein. Because the quick connect fittings have a release mechanism that prevent liquid from spilling upon shutting off, the components facilitate the draining and replacement of procedure. Accordingly, this design may be desirable to save space and avoid the costs of the cartridges that may be employed in accordance with other exemplary embodiments of the present invention. Notably, in either embodiment, the solutions are kept separated and never mixed outside of the wash reservoir also shown in these views.

In FIG. 44A, a quick disconnect system 4400 is illustrated in three parts: the male quick disconnect 4401, and two female quick disconnect (4402 & 4403). The function of this quick disconnect fitting is to automatically shut-off liquid flow upon disconnection. FIG. 44B depicts a side view of the solvent reservoir 10, which may be slanted for easier cleaning as the slanting surface allows for easier drainage.

Figure 45:
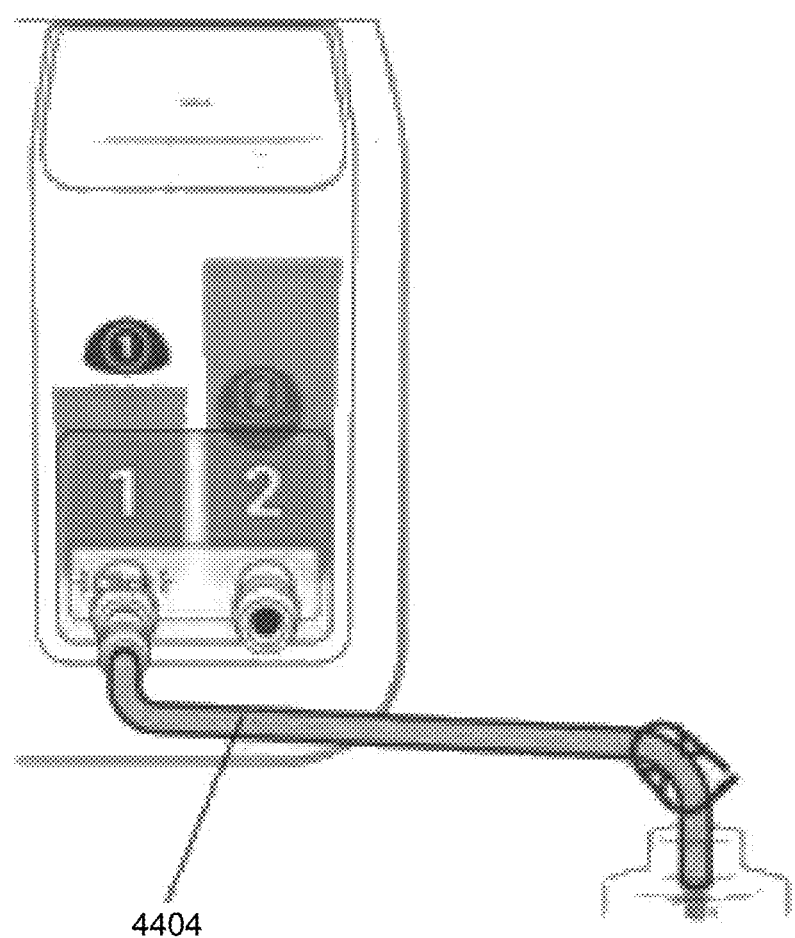
FIG. 45 depicts a quick-connect valve system in use, in accordance with practice of the present invention.

FIG. 45 depicts a quick-connect valve system in use, in accordance with practice of the present invention. In FIG. 45, a flow path 4404 is reestablished when the couplings are connected (for example, male quick disconnect 4401 to a female quick disconnect 4402); this feature allows the users to drain the liquid easily by inserting the quick disconnect, the insert will stay in place until manually push-pull out.

In this disclosure, including in each disclosure previously filed that has been incorporated by reference into the present disclosure, the term "resin" is used. The term may refer to any type of resin suitable for 3D printing, including for example resin suitable for three-dimensional printing employing a vat polymerization-based 3D printing process. As such, the term "resin" may refer to one type of three-dimensional printing (3D-printing) material. Although a primary focus of the present disclosure focuses on the use of resins, the present invention may be used to wash and dry 3D-printing material off of 3D-printed objects that have been formed with other additive materials that may not be necessarily resin. As such, the term 3D-printing material includes, but is not limited to, resins for 3D printing.

Turning now to the next set of figures, FIGS. 46-61 depicts an air-drying feature to remove solvent from the surface of the 3D printed parts post cleaning. The drying is facilitated by placing an air intake. The air intake has two features such as pressure generation and liquid spillage prevention.

Figure 46:
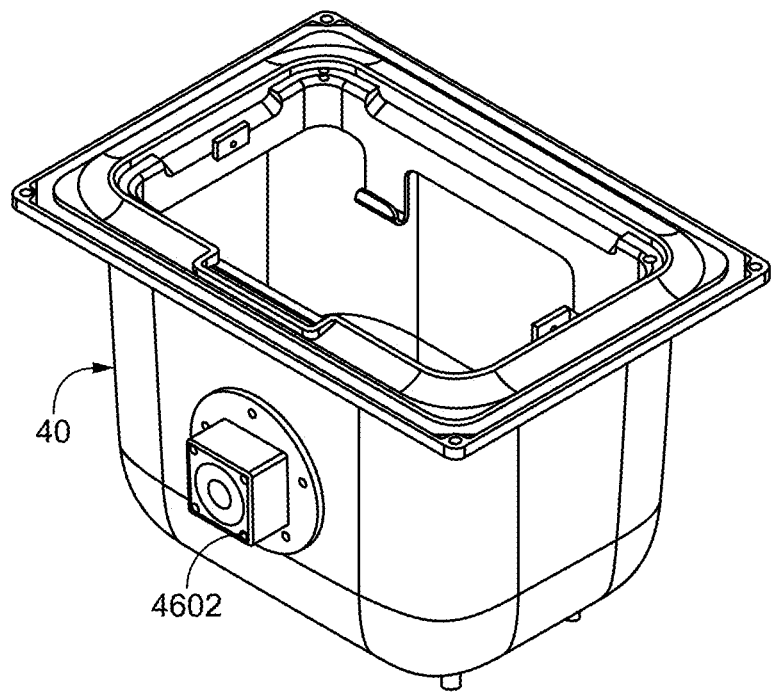
FIG. 46 depicts a fan mounted to a wash reservoir using an adapter according to one embodiment of the present invention.
Figure 47:
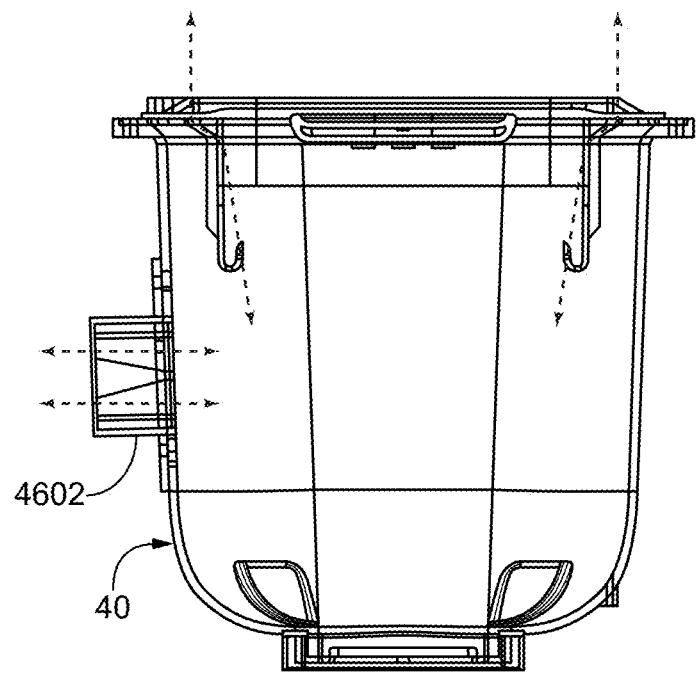
FIG. 47 depicts the airflow into the wash reservoir according to one embodiment of the present invention.

Pressure Generation:

FIGS. 46-49 depicts an arrangement to generate pressure inside a wash reservoir 40 in accordance with the present invention. FIG. 46 depicts a fan module 4602 mounted to the wash reservoir 40 using an adapter according to one embodiment of the present invention. In this arrangement, there is a pressure build within the wash reservoir 40, which may be a positive pressure or a negative pressure. For example, and without limiting the scope of the present invention, in order to move air into the wash reservoir 40, a positive pressure may be applied. This may be achieved by placing the fan module 4602 to create the positive pressure and redirecting the airflow to the wash chamber 40. In some exemplary embodiments, the fan module 4602 may be any one of a centrifugal fan, an axial fan, a blower, and air pump, and/or one or more combustion-based thrusters. In an exemplary embodiment, an axial fan is connected to the wash reservoir 40 through the adapter. The pressure generated outside the compartment is redirected to the wash chamber 40 through a conduit. The fan module 4602 is used to create the positive or negative pressure to move the air into or out of the wash reservoir 40, wherein FIG. 47 shows the direction of the redirected air flow into the wash reservoir 40, in accordance with some exemplary embodiments of the present invention.

Figure 48:
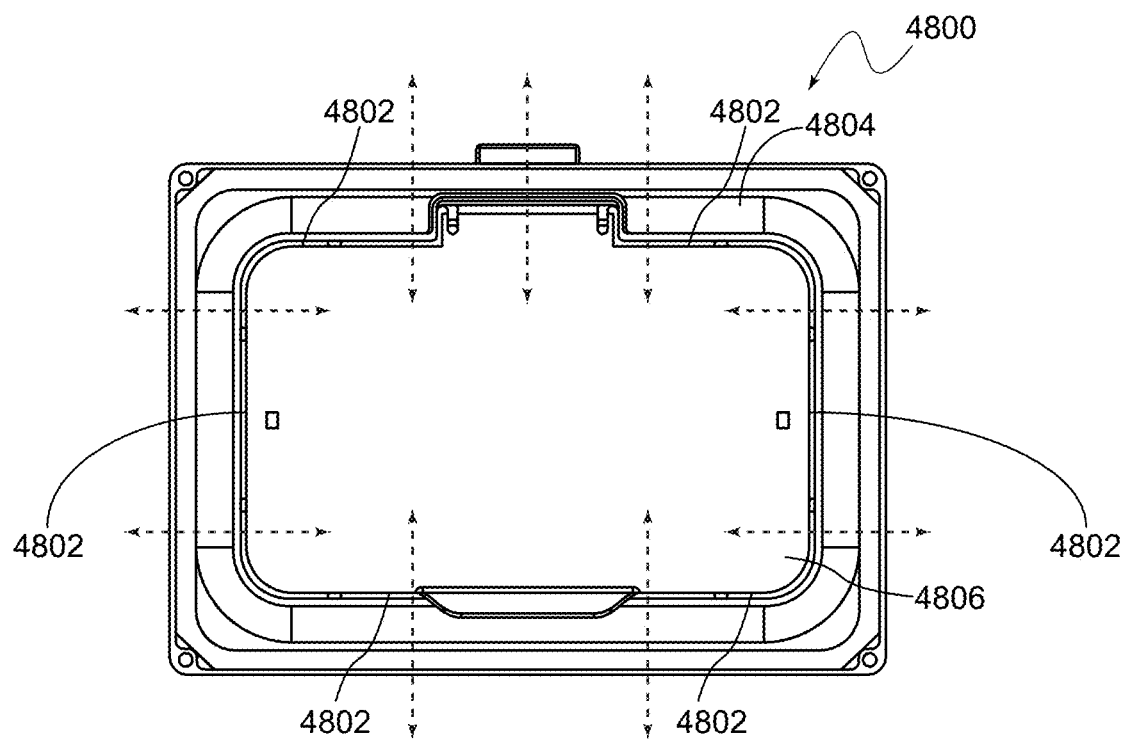
FIG. 48 depicts the air exchange vents of the wash reservoir according to one embodiment of the present invention.

FIG. 48 depicts an arrangement 4800 to modify the air flow in the other way, that is, outside of the wash reservoir 40, in accordance with the present invention. In this orientation, a gap 4802 between a splash guard 4804 and a platform/lid 4806 acts as an air intake. The gap 4802 acts as air exchange vents. The vent acts as an air intake and exhaust vice versa. The vent acts as the air intake when the fan module 4602 is blowing air out of the wash reservoir 40. See also FIG. 32B, which illustrates an exemplary embodiment in which a channel 3203 for providing an airflow or ventilation into and or out of the wash reservoir, is formed between the splash guard and platform lid in accordance with some embodiments of the present invention. Naturally, other means of forming an airway channel may be achieved without deviating from the scope of the present invention. In the exemplary embodiments illustrated in FIG. 32B—as with the embodiments illustrated in FIG. 47 and FIG. 48—a retaining arm may be configured to extend from a bottom portion of the splash guard to form the channel(s). The channel(s) of airflow facilitate a flow of air when, for example, an air-drying cycle is performed by allowing a flow of air into and or out of wash reservoir 40.

Figure 49:
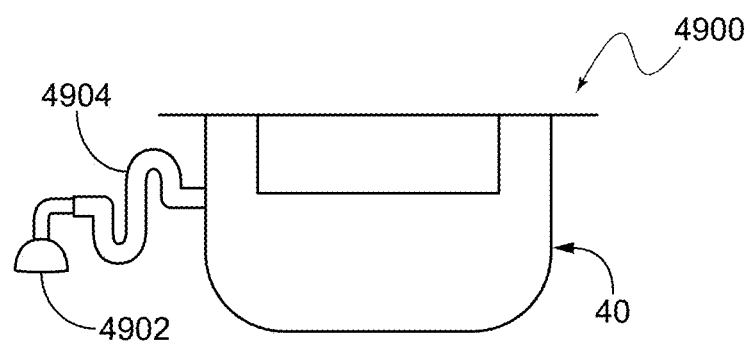
FIGS. 49-50 depicts a centrifugal fan system positioned outside the wash reservoir connected through a conduit according to one embodiment of the present invention.

FIG. 49 depicts an alternate arrangement 4900 that uses a centrifugal fan 4902 in accordance with the present invention. The centrifugal fan 4902 is connected to an outside of the wash reservoir 40 through a conduit 4904. The centrifugal fan 4902 is made for high pressure conditions. The centrifugal fan 4902 may be placed at an alternate location and their airflow is routed to the wash reservoir 40 through the conduit 4904.

In an exemplary embodiment, the arrangement may have the airflow generated through an air blower and air pump to create a positive pressure. In another embodiment, a combination-based method is used to create a positive pressure to facilitate the airflow, the combination-based method would create an exothermic reaction which facilitates the generation of a pressure gradient.

Liquid Spillage Prevention:

Turning now to the next set of figures, FIGS. 50-56 depict various barriers for creating barrier for the liquid in the wash reservoir 40 in some exemplary embodiments of the present invention. These barriers target at creating a barrier for the liquid in the wash reservoir 40, during the cleaning cycle, thereby avoiding the airflow outside of the wash reservoir 40. Such barriers are conduit barrier, valve barrier, air barrier, and flow reducing structures.

Figure 50:
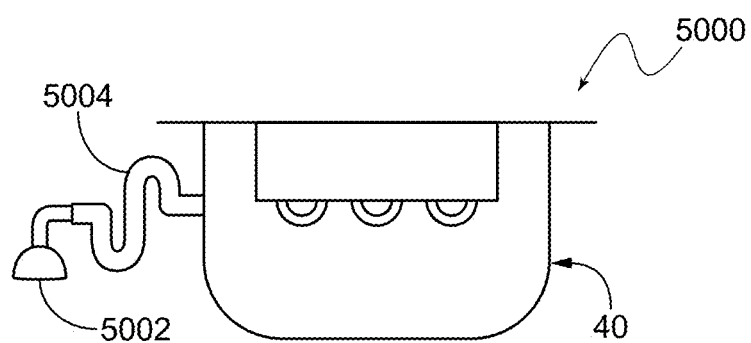

FIG. 50 depicts a conduit barrier 5000 in accordance with the present invention. The conduit barrier method 5000 utilizes a conduit 5004 between a pressure generating device 5002 and the wash reservoir 40. In an embodiment, the pressure generating device 5002 is a fan module. The pressure generating device 5002 is connected to the wash reservoir 40 through the conduit 5004. The pressure generating device 5002 is connected to the wash reservoir 40 through the conduit 5004 in a certain way to avoid IPA from the wash reservoir 40 to move to the fan module 5002. The conduit 5004 is placed in a certain shape such that any airflow outside of the wash reservoir 40 into the conduit 5004 is reduced. The conduit shape takes advantage of an external filed, such as gravity, to force the liquid to flow against the direction of flowing out of the wash reservoir 40. In an embodiment, the conduit 5004 may include one or more in-built filters to impede the flow of IPA.

Figure 51:
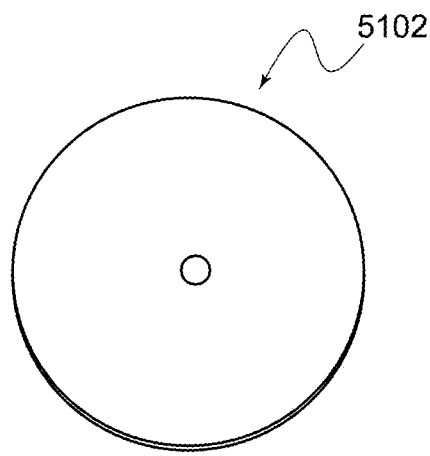
FIG. 51 depicts a top view Figs of an umbrella valve according to one embodiment of the present invention.
Figure 52:
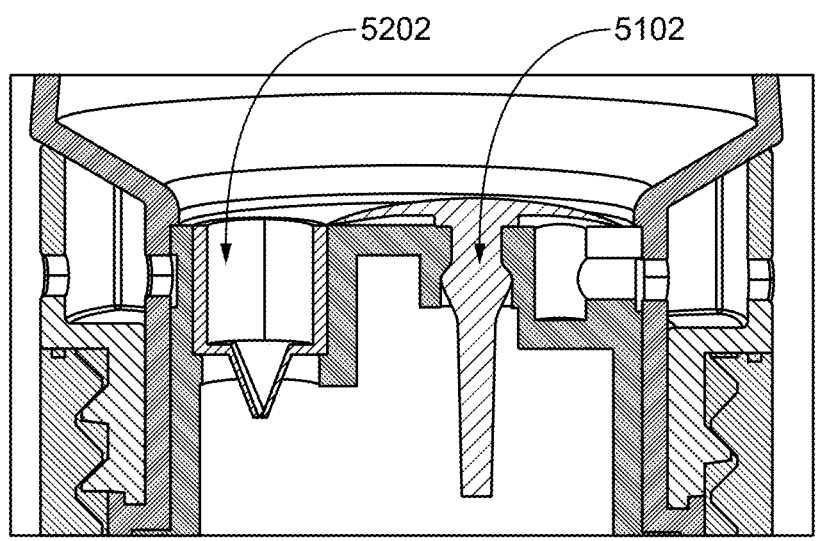
FIG. 52 depicts a duckbill valve positioned next to an umbrella valve according to one embodiment of the present invention.
Figure 53:
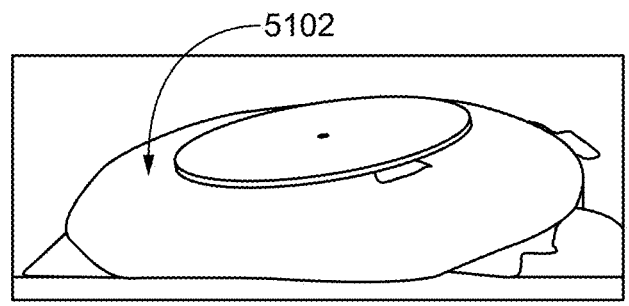
FIG. 53 depicts an open umbrella valve under air pressure according to one embodiment of the present invention.

FIGS. 51-53 depict a valve barrier method in accordance with the present invention. The valve barrier utilizes a one-way flow valve configured to restrict the flow of IPA and support the flow of air into/from the wash reservoir 40. The valve can be, but not limited to, an umbrella valve 5102 as shown in FIG. 51, a sleeved duckbill valve 5202 as shown in FIG. 52, cross opening valve, or any soft material valve, which can be opened through activation using an air flow in accordance with some exemplary embodiments of the present invention. Alternatively, the valve can be activated by another field, like an electric field.

FIG. 53 depicts the umbrella valve 5102 in an open position under air pressure. In an embodiment, the umbrella valve 5102 is made using a silicone rubber elastomer, having a hardness of about 50 A. The umbrella valve 5102 in its natural position, pushes against the opening on a flat sealing surface. When air pressure is applied to the umbrella valve 5102, the air pressure pushes the umbrella valve 5102 to open and facilitates the airflow.

In accordance with air barrier method, the barrier for IPA flowing in is created through an air wall. The air wall may be created in multiple ways. One such way is to use a fan to create positive pressure, where the fan needs to blow air into the wash reservoir. The fan creates a positive pressure that counteracts the IPA/solvent flowing from the wash reservoir to the outside. The pressure needs to be large enough that the highest momentum IPA droplets are restricted from flowing in. The pressure needs to be regulated on the higher end so that the fan does not blow away the IPA through exhaust air vents. Another way is to use an alternate air source to create wall, where the pressure gradient is created from an alternate air source to restrict IPA. The pressure gradient may be perpendicular to the opening for conduit. In this case, the air wall acts similar to the Dyson air dryer, which has a very sharp plane of high-pressure air. This pressure is deactivated when the fan needs to blow the air into the wash reservoir for drying purposes.

Figure 54:
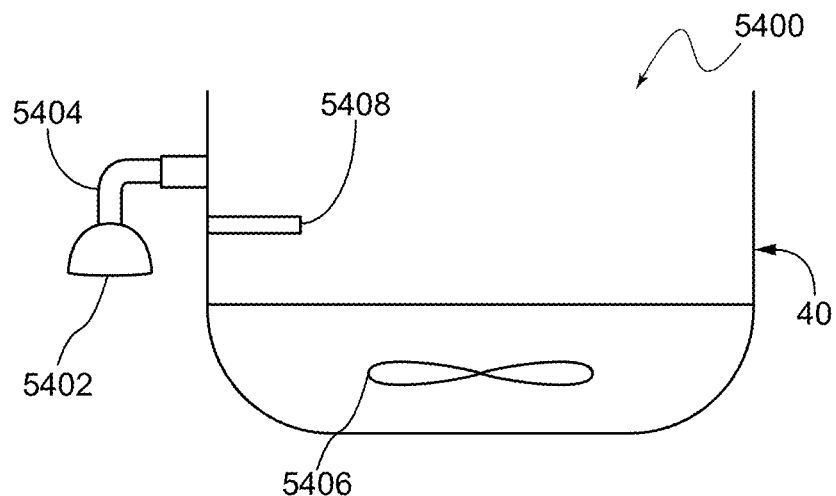
FIG. 54 depicts a structural modification of the wash reservoir for creating the shadow zones according to one embodiment of the present invention.
Figure 55:
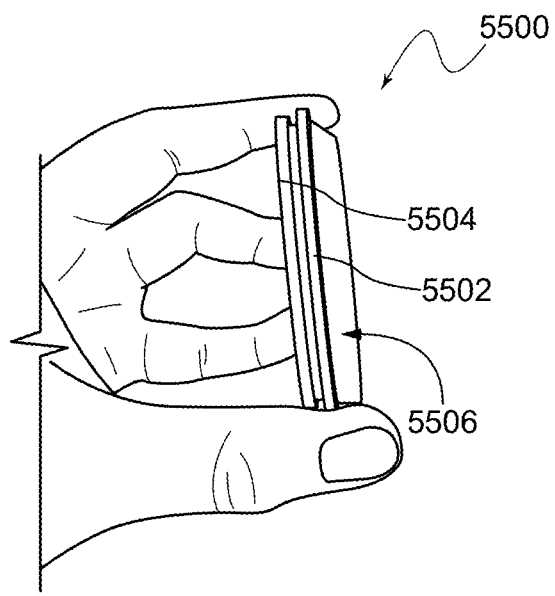
FIG. 55 depicts a flow reducing structure paired with the umbrella valve according to one embodiment of the present invention.

Turning now to the next set of figures, FIGS. 54-55 depict various flow reducing structures in accordance with the present invention. FIG. 54 depicts a structural modification or flow reducing structure 5400 for creating shadow zones 5408, according to one embodiment of the present invention. The flow reducing structure 5400 comprises a fan 5402 connected to the wash reservoir 40 via a conduit 5404. The wash reservoir 40 contains a wash solvent or liquid solvent, for example, IPA. The wash reservoir 40 further comprises a propeller 5406 fully or partially submerged into the wash solvent. The propeller 5406 is configured to splash the IPA upwards in a manner so that plenty of wash solvent will be dispersed on the 3D printed object, largely washing away the resin residue. The flow reducing structure 5400 is made in accordance to the prevalent flow within the wash reservoir 40. In an exemplary embodiment, the flow reducing structure 5400 is configured to create shadow zones 5408 at an outlet of the conduit 5404 to prevent the wash solvent from flowing to the fan 5402.

Figure 56:
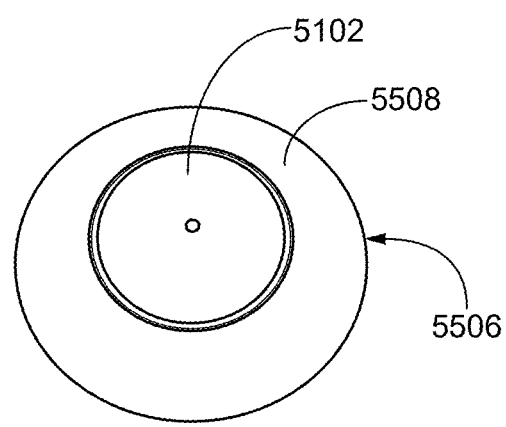
FIG. 56 depicts the umbrella valve with the adapter according to one embodiment of the present invention.

FIG. 55 depicts another flow reducing structure 5500, according to another embodiment of the present invention. The flow reducing structure 5500 is paired with one or more other features for liquid spilling prevention. In an exemplary embodiment, the flow reducing structure 5500 is paired with the umbrella valve 5102. The flow reducing structure 5500 further comprises a first layer or rubber gasket 5502 and a second layer or tension ring 5504. The wash reservoir 40 is pressed between the rubber gasket 5502 and tension ring 5504. The rubber gasket 5502 (which may be Viton®) seals against the wash reservoir 40. In addition, an adapter 5506 holds a fan on the tension ring 5504. Further, the umbrella valve 5102 is positioned on an adapter front end 5508 as shown in FIG. 56 in accordance with the present invention.

Figure 57:
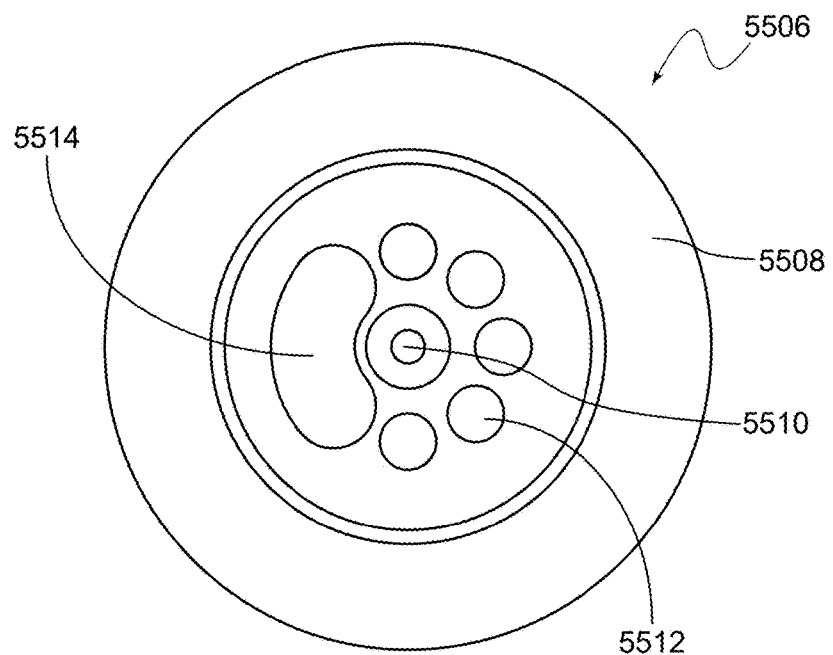
FIG. 57 depicts the adapter with a groove for umbrella valve and slope for IPA to flow down according to one embodiment of the present invention.

FIG. 57 shows an adapter 5506 in accordance with the present invention. The adapter 5506 has a smooth slope at its front end 5508 configured to facilitate the flow of IPA under gravity. In an embodiment, the adapter 5506 comprises a groove 5510 with side walls at its center configured to allow the umbrella valve 5102 to sit. The groove 5510 with the side walls creates a shadow region on the umbrella valve 5102. In one embodiment, the adapter 5506 is provided with no step and a flat surface. In another embodiment, the adapter 5506 is provided with the groove 5510 and slope for IPA to flow down. In an embodiment, the adapter 5506 comprises a plurality of holes 5512 and a larger air opening 5514 for air movement on the adapter 5506 as shown in FIG. 59.

Figure 58:
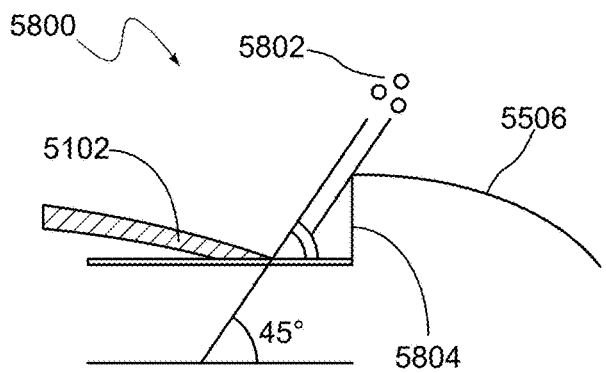
FIG. 58 depicts a relationship between the groove height and the umbrella valve with respect to the IPA droplets incidence angle according to one embodiment of the present invention.

FIG. 58 depicts a relationship 5800 between the groove height and the umbrella valve 5102 with respect to an incidence angle of IPA droplets 5802 in accordance with the present invention. On the adapter 5506 with no slope, it is observed that due to the motion of the IPA, the umbrella valve 5102 is opened due to the shear force from IPA droplets. So, a step depth 5804 is developed in such a way that its relationship with an edge of the umbrella valve 5102 forms an angle of incidence of about 45 degree or more.

Figure 59:
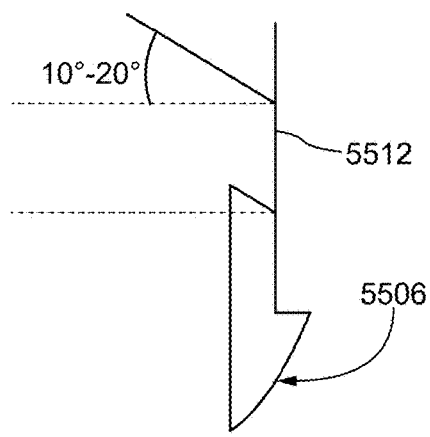
FIG. 59 depicts a shape of one or more holes on the adapter for air movement according to one embodiment of the present invention.

FIG. 59 depicts a shape of the holes 5512 on the adapter 5506 for air movement in accordance with the present invention. The adapter 5506 uses the conduit barrier method 5000 to increase the redundancy of the liquid spilling protection. The holes 5512 in the adapter 5506 are angled horizontally in a way that in the event of leakage from the umbrella valve 5102, the angle creates a flow back into the wash reservoir 40.

Figure 60:
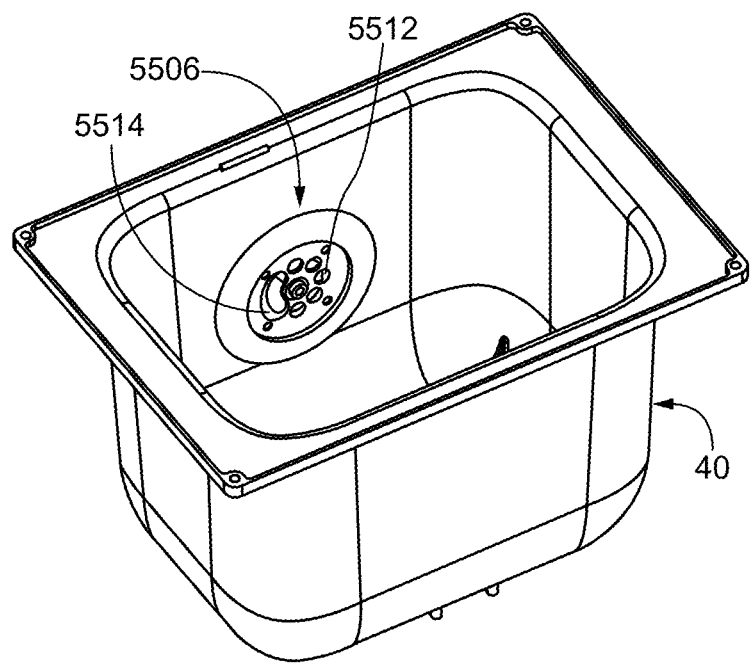
FIG. 60 depicts the orientation of the adapter in the wash reservoir according to one embodiment of the present invention.
Figure 61:
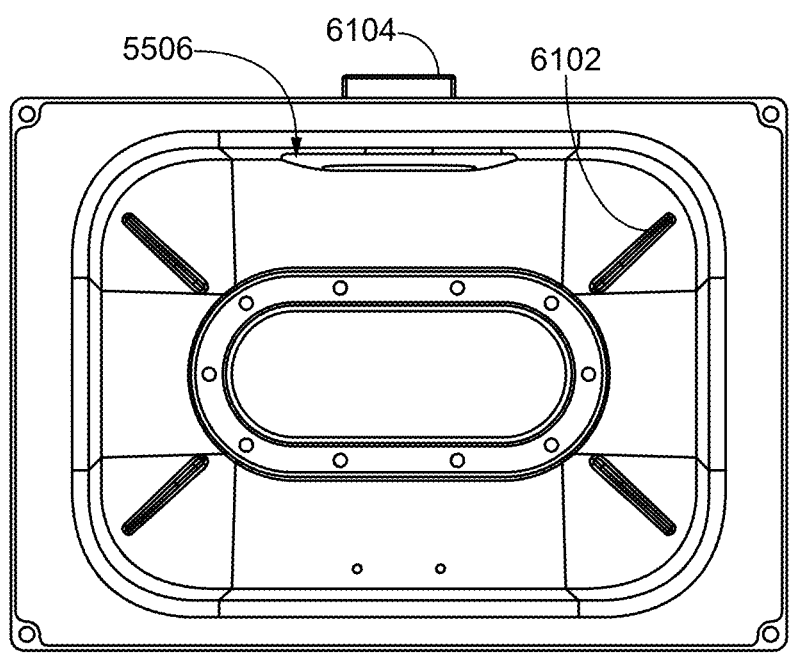
FIG. 61 depicts the directional flow of the air in the wash reservoir according to one embodiment of the present invention.

Turning now to the next set of figures, FIGS. 60-61 depict various views of the wash reservoir 40 for directing the airflow in accordance with the present invention. FIG. 60 depicts the wash reservoir 40 installed with the adapter 5506. The adapter 5506 comprises a plurality of holes 5512. In an exemplary embodiment, the holes 5512 are made in a specific way to facilitate the movement of the air in a specific pattern within the wash reservoir 40. The adapter 5506 further comprises a larger air opening 5514 that is biased on one side of the adapter 5506. The larger air opening 5514 allows for greater airflow from one side of the adapter 5506.

In an exemplary embodiment, the larger air opening 5514 creates a circular airflow in the wash reservoir 40. FIG. 61 depicts a design of the wash reservoir 40 for allowing a directional flow of air inside the wash reservoir 40 in accordance with the present invention. The design provides for ample airflow on the sides of the wash reservoir 40. This is coupled with a propeller 6102 which flows in a direction to bring airflow to the center. The combination of the propeller 6102 and fan 6104 is able to bring uniform airflow to the entire wash reservoir 40. In another embodiment, the larger air opening 5514 of the adapter 5506 is provided along the direction of the flow of IPA. The larger air opening 5514 is in the direction of fluid flow when the propeller 6102 is switched on. Since the umbrella valve 5102 is selectively opened more on the side that does not face the splashing direction for fluid, it is better protected against leaking.

Figure 62:
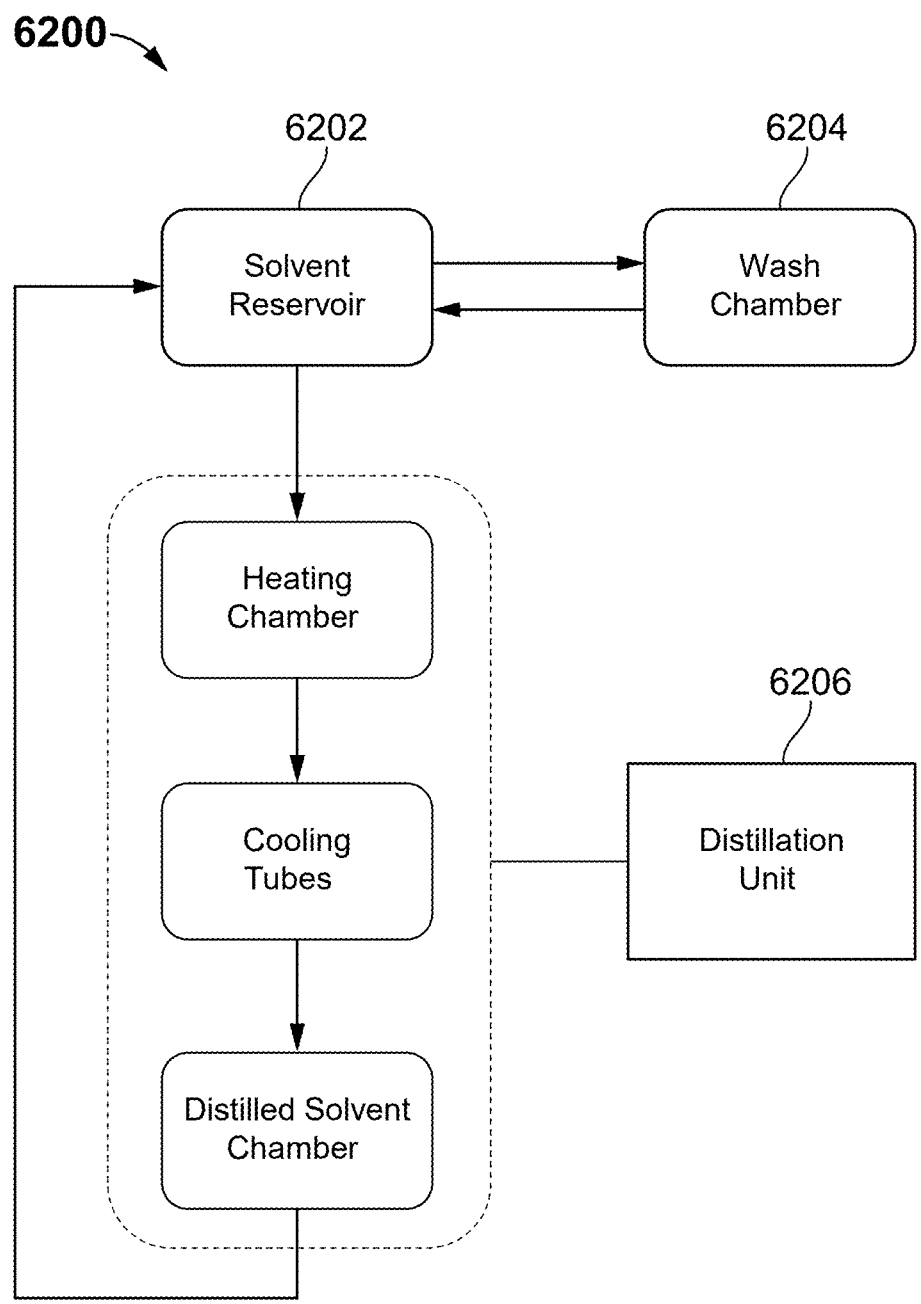
FIG. 62 depicts a block diagram of a system with at least one solvent reservoir for cleaning 3D printed objects according to one embodiment of the present invention.
Figure 63:
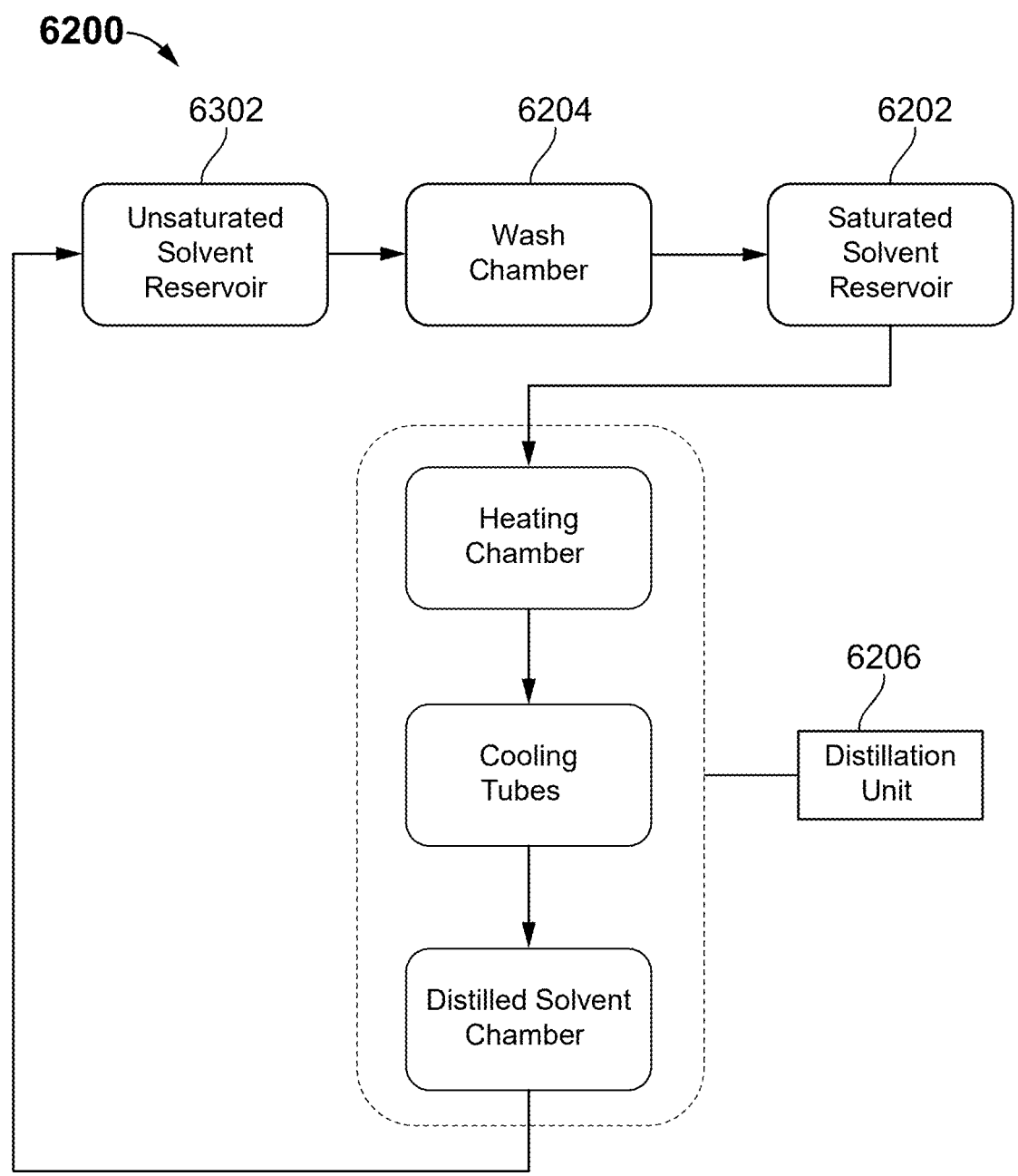
FIG. 63 depicts a block diagram of a system with at least two solvent reservoirs for cleaning 3D printed objects according to one embodiment of the present invention.

Turning now to the next set of figures, FIGS. 62-68 depict recycling of solvents used to remove resin from the surface of 3D-printed objects/models in accordance with the present invention. FIGS. 62-63 depict a block diagram of a system 6200 with one or more solvent reservoirs for cleaning 3D printed objects, according to one embodiment of the present invention. FIG. 62 depicts a block diagram of the system 6200 with at least one solvent reservoir or saturated solvent reservoir 6202. The solvent reservoir 6202 is accessible to a user. The solvent reservoir 6202 stores the solvent. The solvent reservoir 6202 is filled or topped up with the solvent by the user. The system 6200 further comprises a wash chamber 6204 containing the 3D-printed objects to be cleaned. The wash chamber 6204 may be in fluid communication with the solvent reservoir, for example the wash chamber may be connected to one end of the solvent reservoir 6202. The solvent reservoir 6202 supplies solvent to the wash chamber 6204. The solvent interacts with the residual 3D printing material or resin present on the 3D-printed objects in the wash chamber 6204. After a wash cycle is finished, a solution including the 3D printing material and solvent may be pumped back into the solvent reservoir 6202. The solution saturates the solvent reservoir 6202 with 3D printing material, which effectively decreases the wash quality.

In an exemplary embodiment, the system 6200 further comprises a distillation chamber or distillation unit 6206. The distillation chamber 6206 is connected to another end of the solvent reservoir 6202 which contains saturated resin solution to process or recycle the saturated solvent. In an exemplary embodiment, the distillation chamber 6206 acts as a continuous process or batch process for recycling the saturated solvent.

FIG. 63 depicts a block diagram of the system 6200 with two solvent reservoirs including a first solvent reservoir or unsaturated solvent reservoir 6302 and a second solvent reservoir or saturated solvent reservoir 6202. The unsaturated solvent reservoir 6302 is accessible to the user. The unsaturated solvent reservoir 6302 is filled or topped up with the solvent by the user. The solvent in the unsaturated solvent reservoir 6302 is pumped to the wash chamber 6204, where the solvent gets saturated with the resin. The saturated solvent in the wash chamber 6204 is pumped to the second saturated solvent reservoir 6202. The second saturated solvent reservoir 6202 is either accessible or not accessible to the user. The second saturated solvent reservoir 6202 houses the saturated solution and is connected to one end of the distillation chamber 6206. The solvent is pumped to the distillation chamber 6206. The pumping to the distillation chamber 6206 may be continuous process or batch process. Further, the distillation chamber 6206 is connected to the unsaturated solvent reservoir 6302 at another end.

Figure 64:
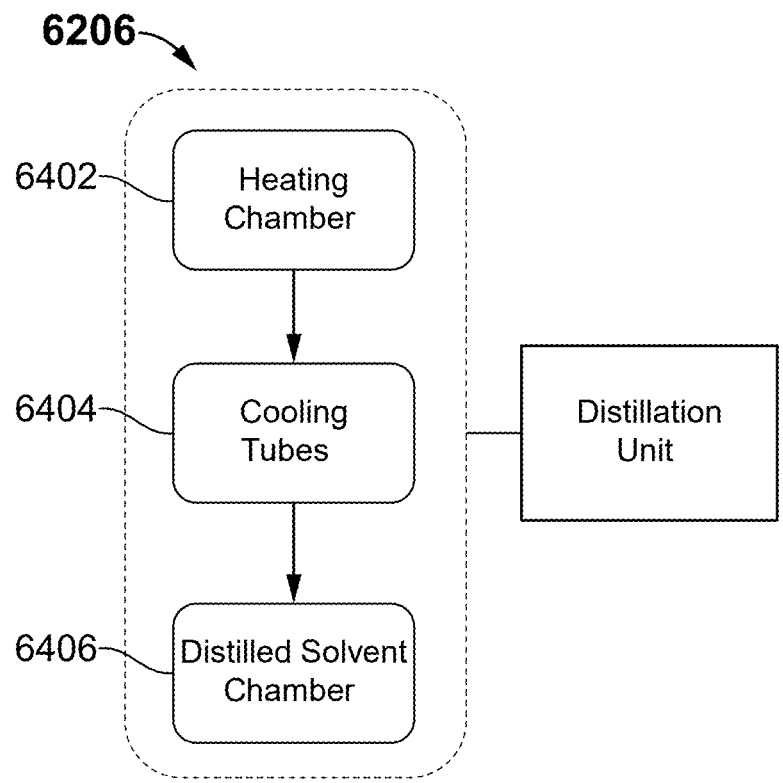
FIG. 64 depicts a block diagram of a distillation chamber according to one embodiment of the present invention.

FIG. 64 depicts a distillation chamber 6206 in accordance with the present invention. The distillation chamber 6206 encompasses three main components including a heating chamber 6402, one or more cooling tubes 6404, and a distilled solvent chamber 6406. The heating chamber 6402 is connected to cooling tubes 6404. The cooling tubes are connected to the distilled solvent chamber 6406.

Figure 65:
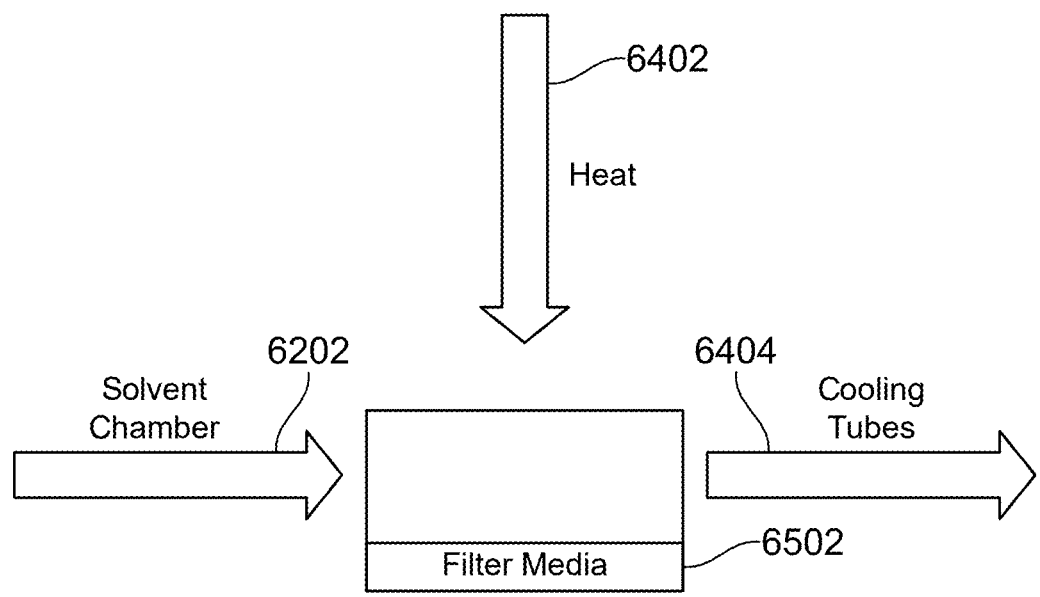
FIG. 65 depicts a heat chamber according to one embodiment of the present invention.

FIG. 65 depicts the heating chamber 6402 in accordance with the present invention. The heating chamber 6402 houses the saturated solvent received from the saturated solvent reservoir 6202. The design of the heating chamber 6402 allows a batch process. For batch process, the heating chamber 6402 accounts for a large volume of saturated solution and heats it up as a batch. In an exemplary embodiment, the heating chamber 6402 is a tube or tube heat exchanger. For continuous process, the tube design of heating chamber 6402 is used, where the heating is done through the tube heat exchanger similar to the shell. The heating chamber 6402 comprises a filter media 6502. In an exemplary embodiment, the heat exchanger comprises three main functionalities such as heating saturated solution, providing volume for phase separation of solvent and resin, and providing filter media 6502 to capture residual resin from the solution.

Heating Saturated Solution:

The heating chamber 6402 is heated to bring the solution temperature above 80-100 Celsius. The temperature supports few of the target solvents such as Isopropyl Alcohol (IPA) and Ethanol. The heating is provided through multiple approaches such as dedicated heating, waste heat recovery, and thermoelectric heater. In dedicated heating approach, the heating chamber 6402 has a dedicated heater. In waste heat recovery approach, the heating is carried out through transferring the waste heat from the device. In thermoelectric heater approach, a special device is used. An input electric power given to the special device creates a thermal gradient. The special device is coupled between the heating chamber 6402 and one or more cooling tubes 6404. The hot side of the device is in contact with the heating chamber 6402 and the cold side is in contact with the cooling tubes 6404.

Figure 66:
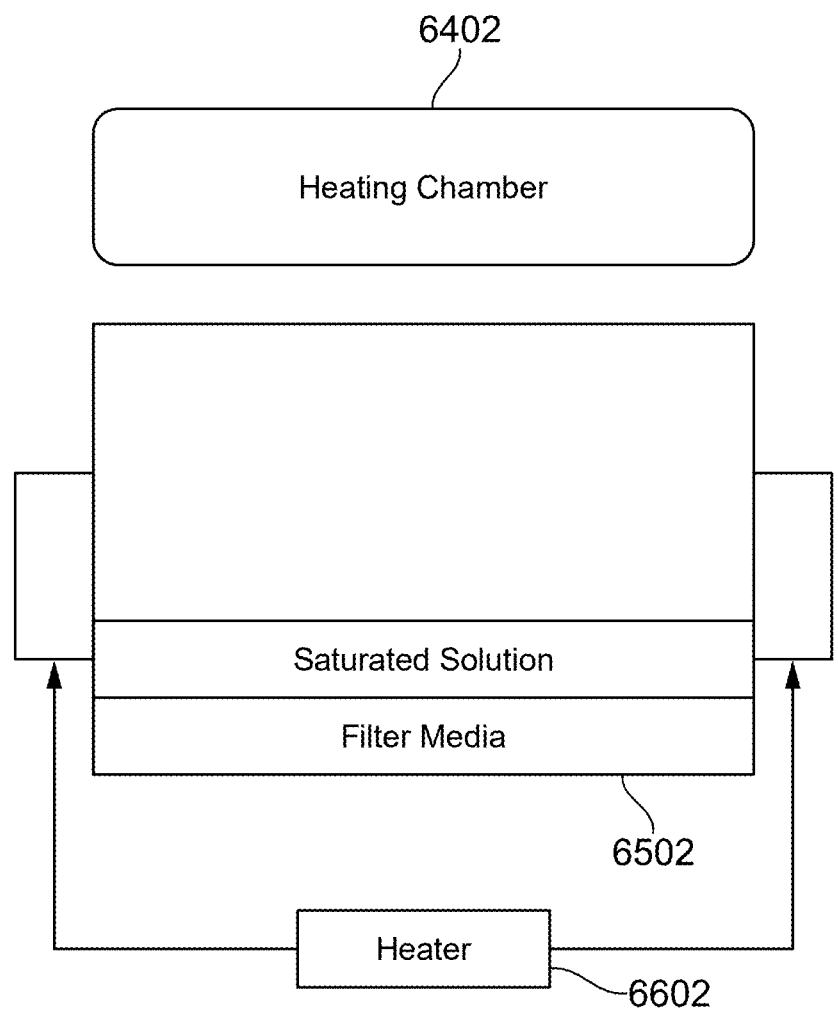
FIG. 66 depicts a heat chamber to provide volume of phase separation according to one embodiment of the present invention.

Volume of Phase Separation:

FIG. 66 depicts the heating chamber 6402 configured to provide volume of phase separation, according to one embodiment of the present invention. The heating chamber 6402 needs to provide volume for the phase separation post heating. In addition, as the solution is heated, the resin is precipitated and settles down. The precipitated resin forms a hard to move semi solid. The heating chamber 6402 comprises an inlet and Celsius outlet. The inlet and outlet are need to be on the top, or need to be shielded from the heavier residue from the distillation process.

In an exemplary embodiment, the heating chamber further comprises a heater 6602 and a filter media 6502. The heater 6602 may be affected by the semi solid remains from the distillation process. The heater 6602 may be placed at the bottom to support the convection within the liquid but risks the blockage of heat transfer when the resin gets collected in the bottom.

Filter Media:

The precipitated resin is collected in the bottom through the filter media 6502. The filter media 6502 is a removable filter media. The filter media 6502 maximizes its surface area for condensing the precipitated resin. The filter has a surface or filling area with higher surface area. This allows higher precipitation of the resin particles on the surface. Further, the condensation for the resin happens onto the filter media 6502, and it is consumable. The user in some systems may have access to the filter media 6502 and are able to remove the filter media 6502 under the non-operation of the heating chamber 6402.

Figure 67:
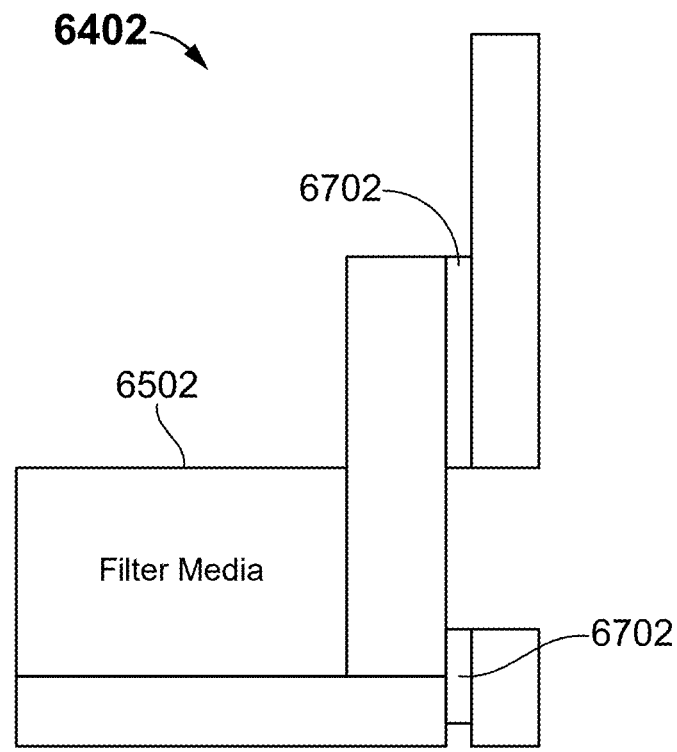
FIG. 67 depicts a self-locking structure of a heating chamber according to one embodiment of the present invention.

FIG. 67 depicts a self-locking structure of the heating chamber 6402, according to one embodiment of the present invention. The heating chamber 6402 is a high-pressure environment, once the solution inside the heating chamber 6402 is heated. The removable filter media 6502 is pressurized against the heating chamber 6402 and it creates a seal while the heating is engaged. In an exemplary embodiment, the heating chamber 6402 comprises one or more gaskets 6702 configured to create a seal.

In another exemplary embodiment, a mechanical locking is used. The mechanical locking comprises a spring-based locking structure. The spring-based locking structure is engaged when the filter media 6502 is inserted into the heating chamber 6402. Upon engagement of the spring-based locking mechanism, a signal is triggered to engage the heating mechanism. The user has access to an ejection button that disengages the spring-based locking mechanism and the heating is stopped.

Figure 68:
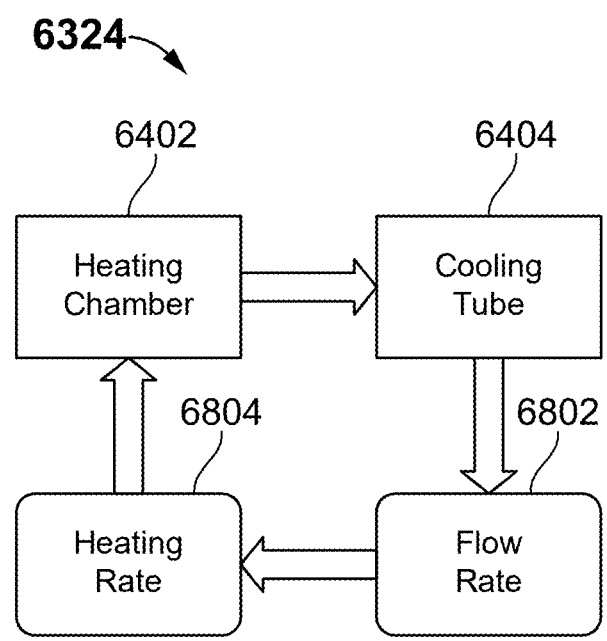
FIG. 68 depicts multiple cooling tubes to condense the evaporated volatile solvent according to one embodiment of the present invention.

FIG. 68 depicts the cooling tubes 6404 of the distillation chamber 6206, according to one embodiment of the present invention. The cooling tubes 6404 receives the evaporated volatile solvent forced outside of the heating chamber 6402. The cooling tubes 6404 enable the condensation of the evaporated volatile solvent and are designed to prevent any back flow of condensed liquid. In an exemplary embodiment, the cooling tube 6404 has a kink. The kink allows vapor to pass through from the heating chamber 6402 to the cooling tubes 6404 but traps any fluid that is condensed beyond the kink. The kink prevents backflow of fluid from the cooling tubes 6404. A flow rate 6802 in the cooling tubes 6404 determines the effectiveness in condensing the distillate. Higher flow rates 6802 need to be controlled to prevent vapor and high heat conditions in the distilled solvent chamber 6406. The flow rate 6802 into the cooling tubes 6404 is measured and controlled through controlling a heating rate 6804 in the heating chamber 6402.

In an exemplary embodiment, the distilled solvent chamber 6406 is placed at a lower level to the cooling tubes 6404. The main function of the distilled solvent chamber 6406 is to capture the condensed distillate and enable the flow into the distilled solvent chamber 6406. The distilled solvent chamber 6406 has an outlet to the customer facing reservoir or unsaturated solvent reservoir 6302. The outlet is placed lower in the distilled solvent chamber 6406 and is connected to a valve. The entire distillation chamber 6206 is a pressurized system, with positive system pressure. The distillation chamber 6206 further comprises a liquid level sensor to ensure that the solvent does not reach the inlet of cooling tubes 6404 and create a backflow into the heating chamber 6402.

Turning now to the next set of figures, FIGS. 69-78 depict a system for cleaning or washing 3D-printed objects, in accordance with the present invention. The washing process includes two competing forces to determine the quality of wash. The quality of wash is defined as a functions f(x,y)

$$f(x,y)=g(\text{field})-h(\text{resin surface adhesion})$$

Hence, effectively any washing system relies on the factors such as increasing the field through which the system can move the resin, decreasing the resin surface adhesion, and combination of increasing the field and decreasing the resin viscosity. Further, the washing process relies on two main things such as force field and resin movement aid.

Force Field:

In washing of 3D-printed objects/models/parts, the fundamental activity that has to be performed is to move the resin away from the surface of the 3D-printed objects. This movement needs a potential gradient and hence a field for the movement. The field can be achieved in multiple ways.

Figure 69:
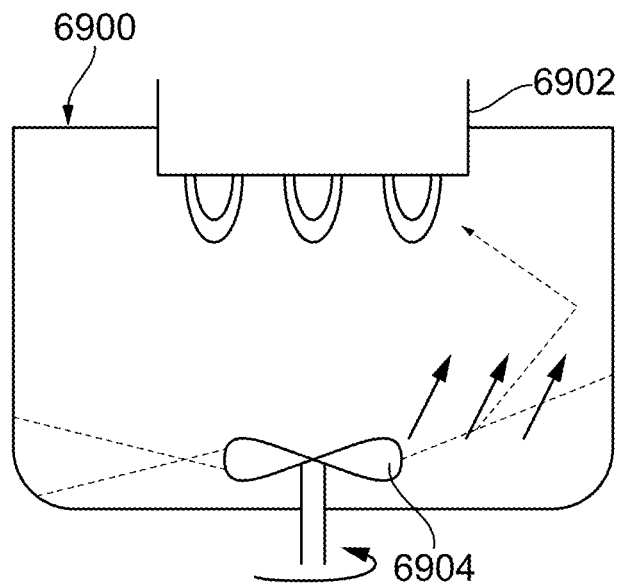
FIG. 69 depicts a wash reservoir to provide liquid momentum for cleaning the resin from the 3D printed objects according to one embodiment of the present invention.

FIG. 69 depicts a wash chamber 6900 to provide liquid momentum for cleaning the resin from 3D-printed objects 6902, according to one embodiment of the present invention. The wash chamber 6900 comprises a propeller 6904. The propeller 6904 is attached at a bottom of the wash chamber 6900 configured to spin at a high momentum thereon creating a plurality of small liquid particles or droplets containing lift and rotational momentum. The lift and rotational momentum of the plurality of small liquid particles creates the force filed. When the liquid with small liquid particles hits the surface of the 3D-printed object 6902, it knocks the resin off of the surface of the 3D-printed object 6902.

The liquid particles include solvent that dissolves the resin from the surface. The liquid particles include solvent with low viscosity that decreases overall viscosity of a solution containing residual resin and solvent. The lift and rotational momentum of the liquid forces the low viscosity solution to move away from the surface of the 3D printed object 6902.

Figure 70:
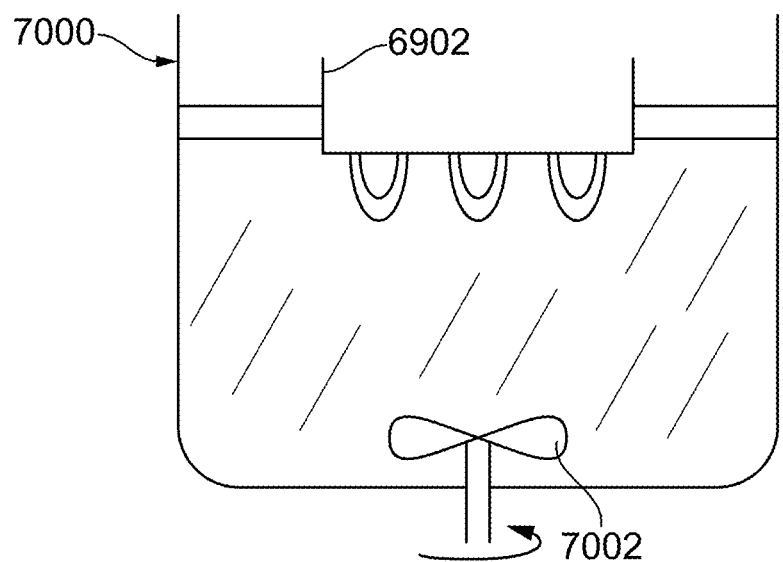
FIGS. 70-71 depict a wash reservoir to provide alternate approaches for liquid momentum according to one embodiment of the present invention.
Figure 71:
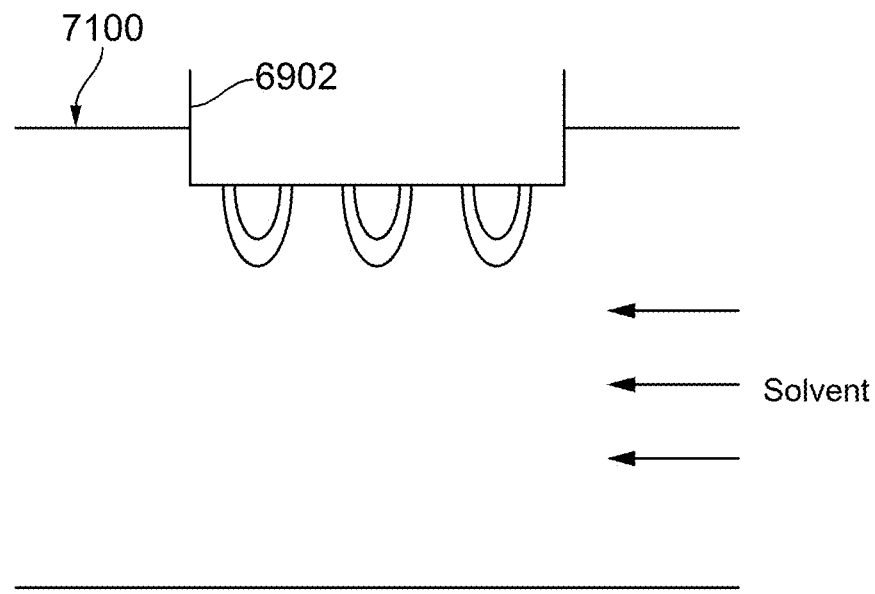

FIGS. 70-71 depict alternate approaches for liquid momentum in accordance with the present invention. FIG. 70 depicts a wash reservoir 7000 having a mixer 7002 submerged into it to create a force field. The mixer 7002 creates a filed which forces the liquid to come out. In an exemplary embodiment, swirling is used to rotate the liquid configured to remove the resin from the surface of the 3D printed object 6902. FIG. 71 depicts a conduit 7100 with flowing liquid to remove the resin from the surface of the 3D-printed object 6902, according to one embodiment of the present invention. The 3D-printed object 6902 is placed in the conduit 7100 with flowing liquid. The force from the flowing liquid causes the resin to be moved off of the surface of the 3D-printed object 6902.

Figure 72:
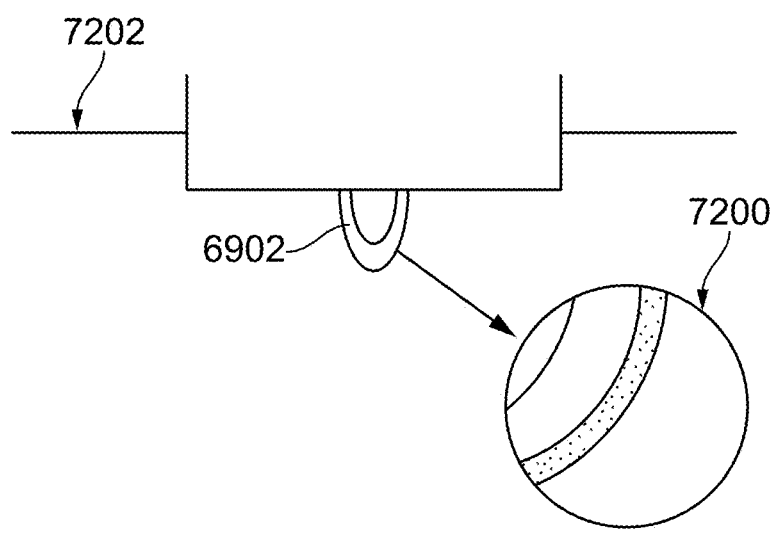
FIG. 72 depicts an implementation of gravity to clean the resin from the 3D printed objects according to one embodiment of the present invention.

FIG. 72 depicts an implementation of gravity field 7200 to clean the resin from 3D printed object 6902, according to one embodiment of the present invention. The 3D-printed object 6902 is placed on a window 7202, which subjects the 3D-printed object 6902 to gravity field. The 3D-printed object 6902 is placed on the window 7202 with gravity, thereby causing the resin to move away or pulled downwards under the non-contact force field from the surface of the 3D printed object 6902. The resin is pulled downwards under the gravity field and hence it moves away from the surface of the 3D-printed object 6902. This gravity field by itself cannot clean all the surface of the 3D-printed object 6902 and the extent to which it can clean depends on the force balance between the surface energy of the liquid and gravity field. The gravity field utilizes a non-contact force field to move the resin away from the surface of the 3D-printed object 6902.

Figure 73:
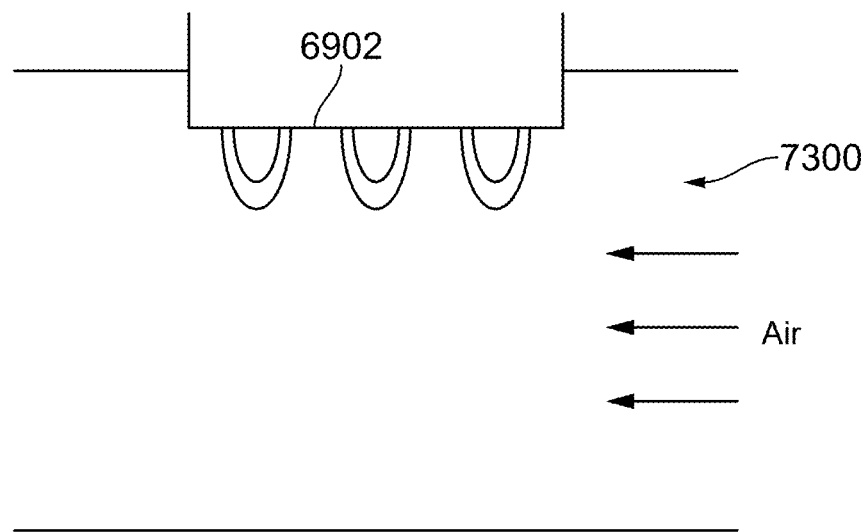
FIG. 73 depicts an implementation of an air-field to clean the resin from the 3D printed objects according to one embodiment of the present invention.

FIG. 73 depicts an implementation of an air-field 7300 to clean the resin from the 3D printed object 6902, according to one embodiment of the present invention. The air-field 7300 is configured to pull or push the resin on the surface of the 3D-printed object 6902 through creating a positive or negative air pressure.

Figure 74:
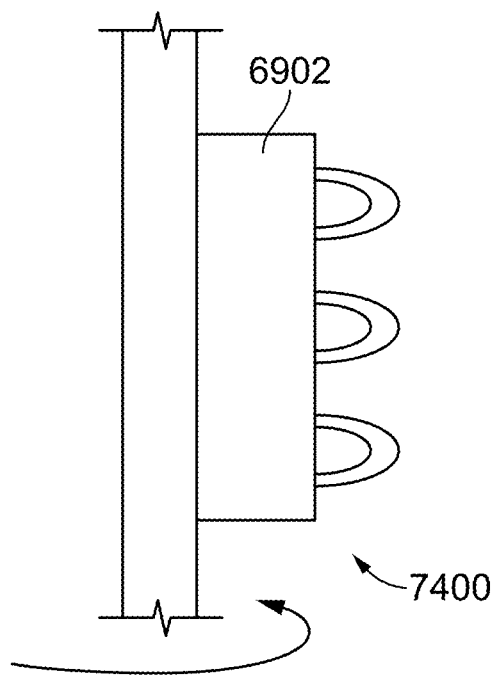
FIG. 74 depicts an implementation of a centrifugal force field to clean the resin from the 3D printed objects according to one embodiment of the present invention.

FIG. 74 depicts an implementation of a centrifugal force field 7400 to clean the resin from the 3D printed object 6902, according to one embodiment of the present invention. The centrifugal force field 7400 is created by rotating the 3D printed object 6902 at very high speeds. Under this movement, the resin is subjected to centrifugal forces which cause it to flow off of the surface of the 3D printed object 6902.

Figure 75:
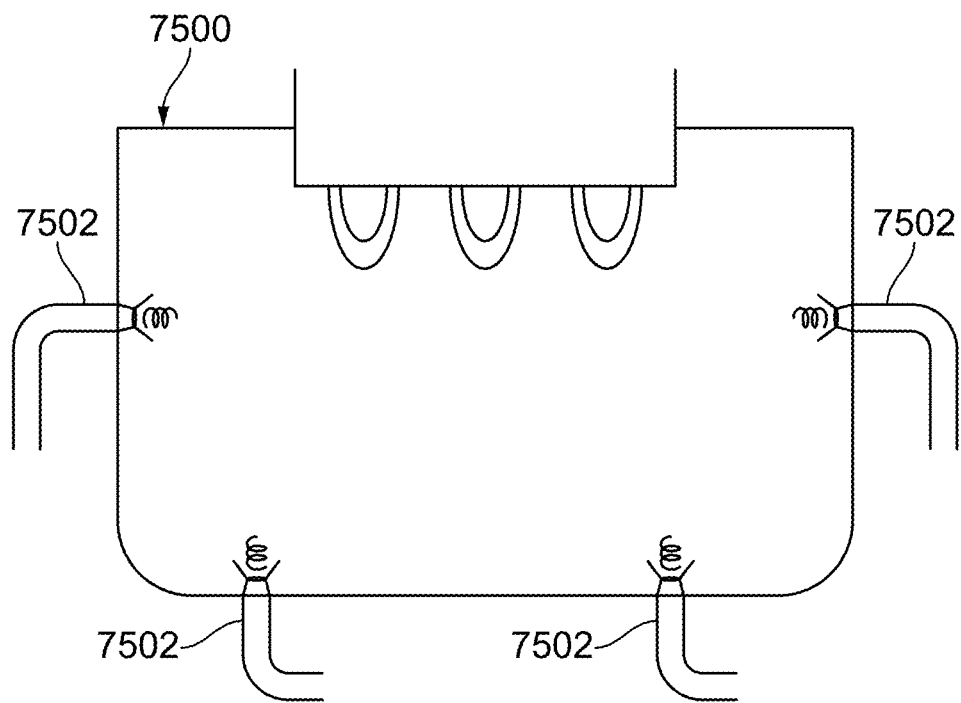
FIG. 75 depicts a nozzle placed on a wash chamber for implementing imparting momentum to clean the resin from the 3D printed objects according to one embodiment of the present invention.
Figure 76:
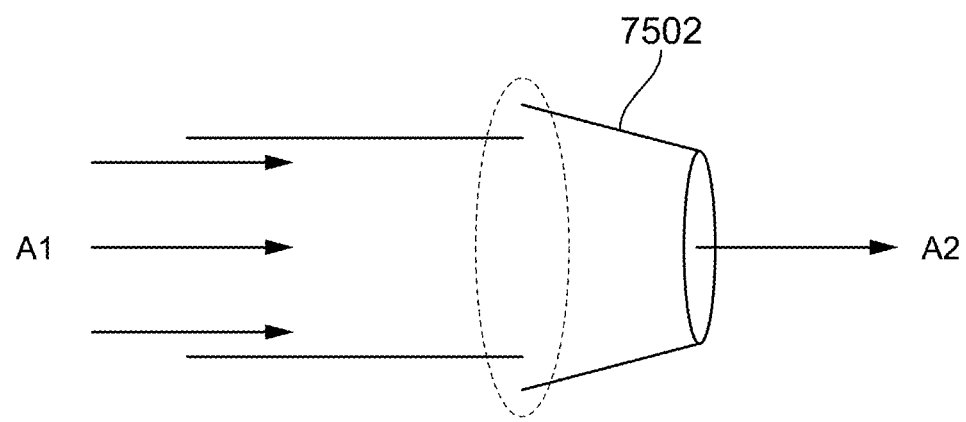
FIG. 76 depicts the working of the nozzle according to one embodiment of the present invention.

Referring to FIGS. 75-76, a wash chamber 7500 with one or more nozzles 7502 for implementing imparting momentum to clean the resin from the 3D printed objects 6902, according to one embodiment of the present invention. The nozzles 7502 are narrow orifices. The nozzles 7502 are placed around the wash chamber 7500. The nozzles 7502 pressurize air or liquid or solvent. The pressurized air or liquid or solvent is passed through the nozzles 7502 at a high velocity, thereby removing the resin from the 3D-printed object 6902 through imparting momentum to the resin on the surface. FIG. 76 depicts the working of the nozzles 7502. The surface area A1 of flowing air or liquid or solvent is larger before entering the nozzle 7502 when compared to the area A2 (A2<A1) after passing the nozzle 7502.

Figure 77:
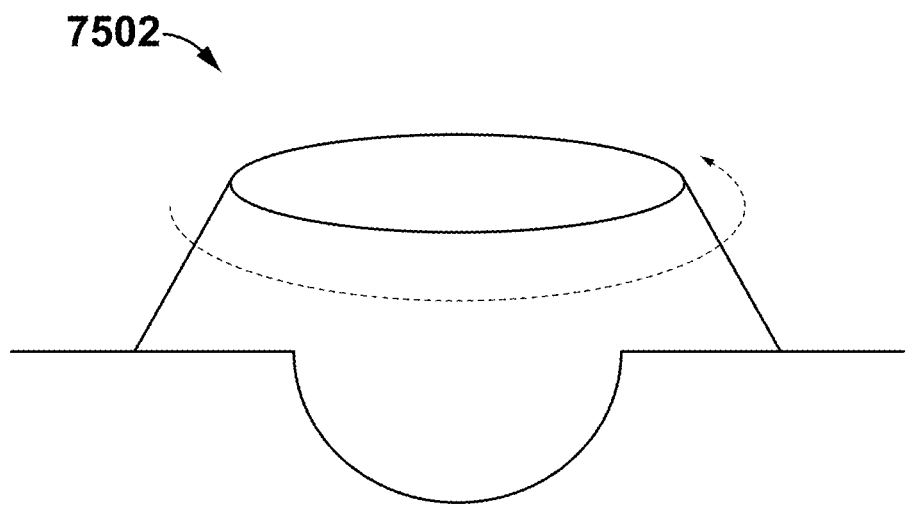
FIG. 77 depicts a rotational motion of the nozzle to accommodate for more flexibility for directing air or liquid according to one embodiment of the present invention.

FIG. 77 depicts a rotational motion of the nozzle 7502 to accommodate for more flexibility for directing air or liquid, according to one embodiment of the present invention. In an exemplary embodiment, the nozzle 7502 is stationary, facing towards the 3D printed object for direct momentum transfer or facing in such a way that the reflection of the motion of air or liquid is directed towards the 3D printed object.

Figure 78:
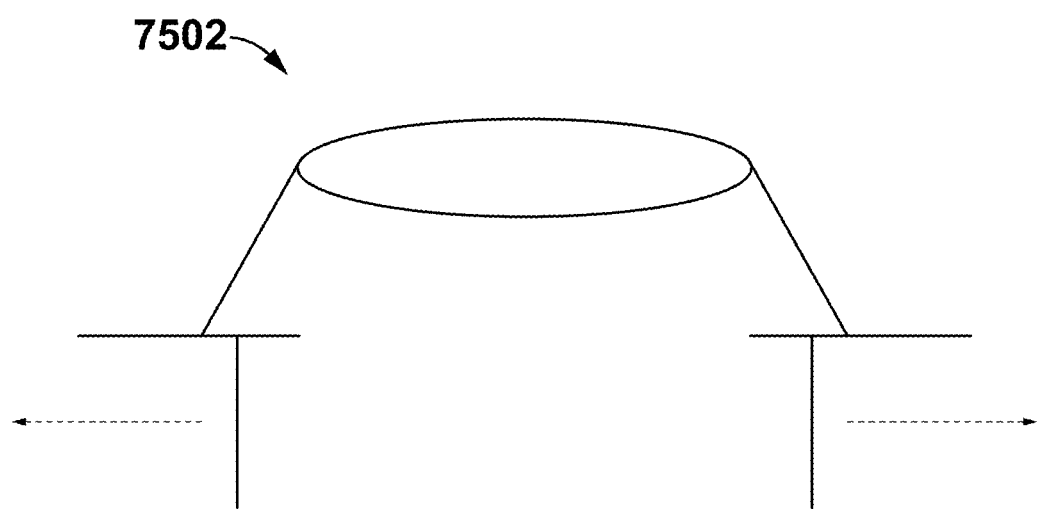
FIG. 78 depicts the linear motion of the nozzle to accommodate for more flexibility for directing air or liquid according to one embodiment of the present invention.

FIG. 78 depicts a linear motion of the nozzle 7502 to accommodate for more flexibility for directing air or liquid, according to one embodiment of the present invention. The nozzles 7502 have motion, which allows the nozzle 7502 to redirect itself towards the 3D printed objects. The motion may be rotational motion, where the nozzle 7502 moves around an axis and the positioning is such that it allows for coverage of 3D printed objects. The motion may be, but not limited to, linear, or a mixture of linear and rotational motion, for imparting momentum transfer to the resin on the surface of the 3D-printed object.

Resin Movement Aid:

In all the washing cases mentioned, the resin is made to flow off the surface of the 3D-printed object through implementation of the external field. The resin can be removed from the surface by either increasing the field or reducing the resin viscosity. This can be achieved using solvent, heat, and sonication.

Solvent

One of the forces that holds the resin on the surface of the model is its high viscosity and surface tension. The high viscosity prevents the flow of resin under a field and thus it reduces the overall wash quality. One approach to improving wash is to reduce the viscosity through mixing the resin with a solvent with lower viscosity. Few solvents such as Isopropyl alcohol (IPA) or Ethyl Alcohols are completely miscible with resin. These solvents can make a solution with the resin at all concentrations. When the resin is mixed with the solvent, the overall viscosity decreases and under the field, the solution moves away from the surface of the 3D-printed surface.

Heat

The viscosity of resin is a function of the temperature. The higher the resin temperature, the lower its viscosity. Under this idea, the model can be subjected to high heat which causes the resin to flow easily under the application of a field.

Sonication

The resin and the 3D-printed object have different inertia, which causes them to vibrate differently. Under this application, the 3D-printed object is subjected to vibration under the ultrasonic frequency range. This causes the resin to separate out of the 3D-printed object by the virtue of differing moment of inertias and under a field causes resin to flow out.

Figure 79:
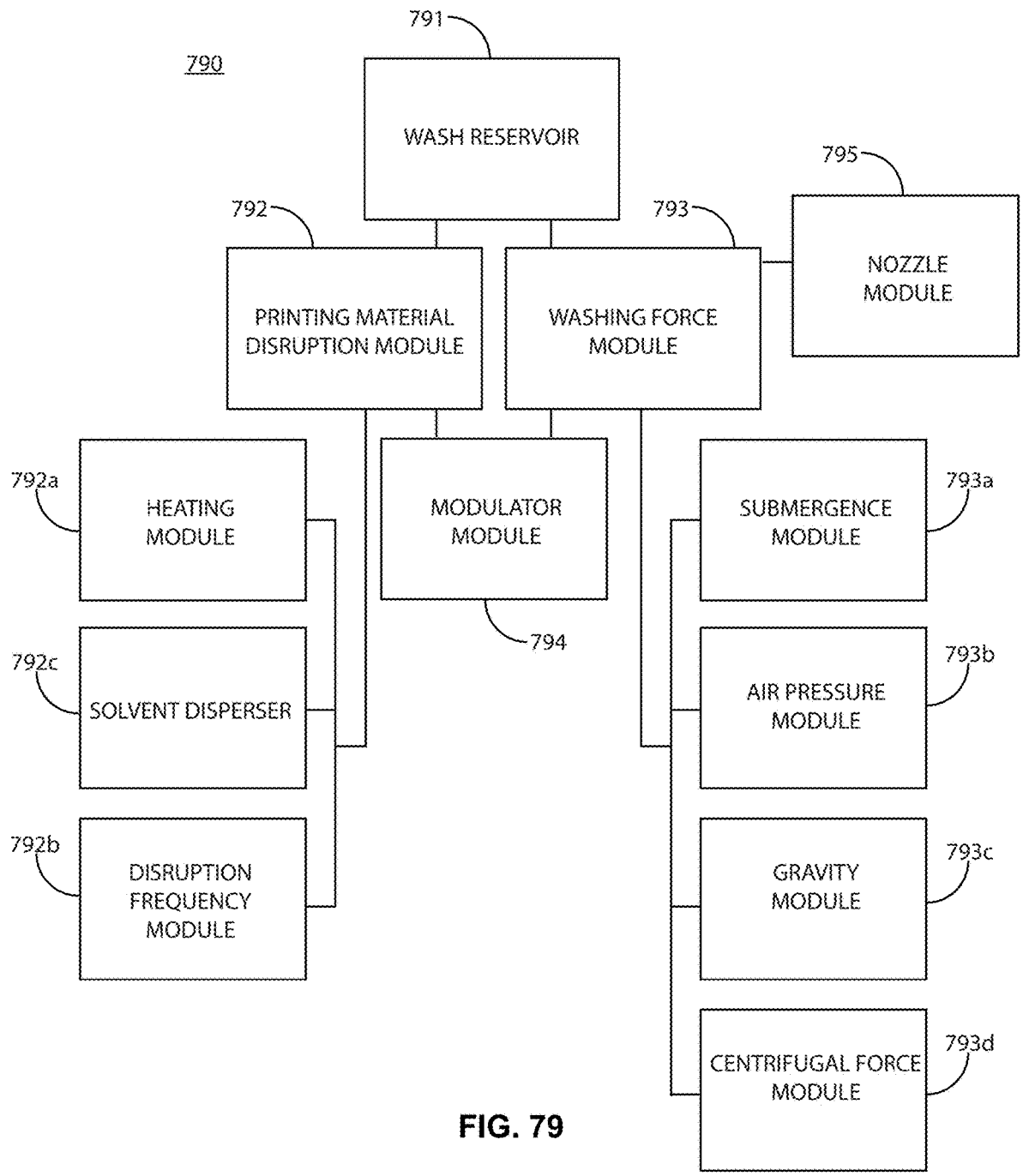
FIG. 79 depicts a block diagram of a wash system in accordance with exemplary embodiments of the present invention.

Turning now to the next figure, FIG. 79 depicts a block diagram of a wash system in accordance with exemplary embodiments of the present invention. More specifically, FIG. 79 illustrates system 790 for washing off residual printing material from a surface of a 3D-printed object, including several components as have been described above and below, which may form part of system 790 in exemplary embodiments of the present invention. System 790 may include a wash reservoir or chamber 791 adapted to receive the 3D-printed object; a printing material disruption module 792 adapted to disrupt a composition of a residual printing material on a surface of the 3D-printed object; and a washing force module 793 adapted to apply a washing force field to the 3D-printed object and wash off the residual printing material.

In some exemplary embodiments, the printing material disruption module 792 disrupts the composition of the residual printing material on the surface of the 3D-printed object by applying heat to the residual printing material. This may be achieved via a heating module 792a, which employs a heating element, including as discussed above with reference to other figures and other exemplary embodiments of the present invention.

In some exemplary embodiments, the printing material disruption module 792 disrupts the composition of the residual printing material on the surface of the 3D-printed object by applying a sonic or ultrasonic frequency to the residual printing material. This may be achieved via a disruption frequency module 792b, which causes the 3D-object to vibrate differently; the module may cause a vibration under the ultrasonic frequency range to cause the printing material to separate out of the 3D-printed object by the virtue of differing moment of inertias and under a field causes resin to flow out.

In some exemplary embodiments, the printing material disruption module 792 disrupts the composition of the residual printing material on the surface of the 3D-printed object by applying a solvent to the residual printing material. This may be achieved via a solvent dispenser module 792c, which may reduce the viscosity of a residual printing material through mixing the material with a solvent with lower viscosity as discussed above. As such, in some exemplary embodiments, the printing material disruption module 792 disrupts the composition of the residual printing material on the surface of the 3D-printed object by altering a viscosity of the residual printing material.

In some exemplary embodiments, the washing force module 793 is configured to generate the washing force field by submerging the 3D-printed object in a washing solution. This may be achieved with a submergence module 793a, that submerges the 3D-object into a washing solution inside the chamber. Mechanical components of the module may physically submerge the 3D-object into a wash solution inside the chamber, or the chamber may be configured to seal and fill up with the wash solution as discussed in this disclosure.

In some exemplary embodiments, the washing force module 793 is configured to generate the washing force field by applying a positive or negative air pressure onto the 3D-printed object. This may be achieved via an air pressure module 793b, which employs the airway and air pressure components discussed above with reference to other figures and other exemplary embodiments of the present invention.

In some exemplary embodiments, the washing force module 793 is configured to generate the washing force field by applying a gravitational force to the 3D-printed object. This may be achieved via a gravity module 793c, which holds or secures the 3D-object and hangs it inside the chamber, including with components discussed above with reference to other figures and other exemplary embodiments of the present invention, in order to allow the 3D-object to drip off any residual printing material for a period of time.

In some exemplary embodiments, the washing force module 793 is configured to generate the washing force field by applying a centrifugal force to the 3D-printed object. This may be achieved via a centrifugal force module 793d, which implements a centrifugal force field to clean the resin from the 3D printed object by rotating the 3D printed object at very high speeds.

In some exemplary embodiments, the washing force module 793 is configured to alter or modulate the washing force field applied to the 3D-printed object. In other words, a modulation module 794 may be adapted to change or alter a force or intensity of any of the printing disruption module 792, washing force module 793, or their sub-modules and components without limiting the scope of the present invention.

In some exemplary embodiments, the washing force module 793 includes a nozzle module 795 adapted to at least partially direct one or more fluid streams to the 3D-printed object. In some exemplary embodiments, the washing force module 793 is configured to generate the washing force field by aligning the 3D-printed object in a conduit with a flowing liquid. In some exemplary embodiments, the washing force module is configured to generate the washing force field by way of a non-contact force field that moves the residual printing material away from the surface of the 3D-printed object.

In some exemplary embodiments, the nozzle module 795 pressurizes and directs air through the one or more nozzles at a high velocity to remove the residue printing material off from the surface of 3D-printed. In some exemplary embodiments, the nozzle module 795 pressurizes and directs a liquid through the one or more nozzles at a high velocity to remove the residue printing material off from the surface of 3D-printed. In some exemplary embodiments, the nozzle module 795 pressurizes and directs a solvent through the one or more nozzles at a high velocity to remove the residue printing material off from the surface of 3D-printed. In some exemplary embodiments, the one or more nozzles are stationery. In some exemplary embodiments, the one or more nozzles are adapted to shift a direction of the one or more fluid streams directed through the one or more nozzles.

In some exemplary embodiments, the system further includes actuators that shift the direction of the one or more fluid streams. In some exemplary embodiments, the system further includes a passive control module coupled to the one or more nozzles and adapted to use a momentum of the fluid flowing through the passive control module to shift the direction of the fluid stream.

Figure 80:
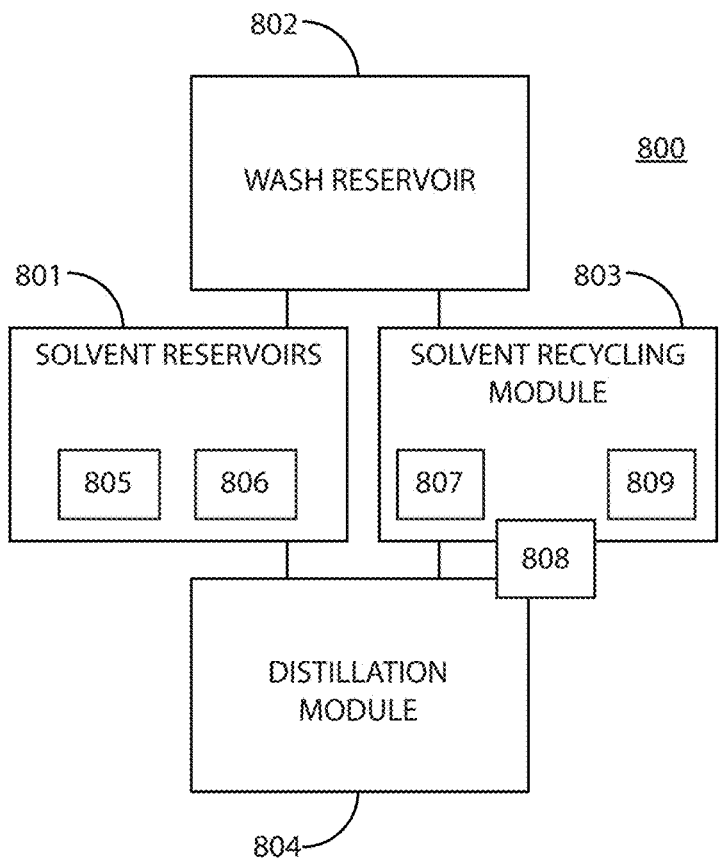
FIG. 80 illustrates a block diagram depicting a system for recycling solvents inside a wash system in accordance with the present invention.

Turning to the next figure, FIG. 80 illustrates a block diagram depicting a system for recycling solvents inside a wash system in accordance with the present invention.

More specifically, FIG. 80 depicts system 800 for recycling solvents used to clean 3D-printed objects. System 800 includes one or more solvent reservoirs 801 configured to store a solvent for cleaning residual 3D-printing material off of 3D-printed objects; a wash chamber 802 adapted to clean the 3D-printed objects, the wash chamber 802 in fluid communication with the one or more solvent reservoirs 801 configured to receive the solvent from the one or more solvent reservoir; and a solvent recycling module 803 in fluid communication with the one or more solvent reservoirs 801, configured to: receive a saturated solvent from the one or more solvent reservoirs 801; evaporate or condense the saturated solvent to remove residual 3D-printing material from the saturated solvent; and return clean solvent to the one or more solvent reservoirs 801. In some exemplary embodiments, system 800 for recycling solvents used to clean 3D-printed objects may include: one or more solvent reservoirs 801 configured to store a solvent for cleaning residual 3D-printing material off of 3D-printed objects; wash chamber 802 adapted to clean the 3D-printed objects, the wash chamber in fluid communication with the one or more solvent reservoirs configured to receive the solvent from the one or more solvent reservoir; and a solvent recycling module 803 in fluid communication with the one or more solvent reservoirs 801, configured to: receive a saturated solvent from the one or more solvent reservoirs; distill the saturated solvent to remove residual 3D-printing material from the saturated solvent; and return clean solvent to the one or more solvent reservoirs.

In some exemplary embodiments, the solvent recycling module 803 is housed in an enclosure externally to a housing of the system or housed in an enclosure integral with the wash chamber or the one or more solvent reservoirs of the system. In some exemplary embodiments, the solvent recycling module 803 comprises a distillation chamber 804 adapted to remove the residual 3D-printing material from the saturated solvent. In some exemplary embodiments, the one or more solvent reservoirs include a saturated solvent reservoir and an unsaturated solvent reservoir.

In some exemplary embodiments, the recycling module 803 is coupled to the saturated solvent reservoir 801. In some exemplary embodiments, the recycling module 803 is adapted to process the saturated solvent as a batch process or as a continuous process. In some exemplary embodiments, the recycling module 803 is adapted to heat and cool the saturated solvent using a Peltier effect. In some exemplary embodiments, the recycling module 803 comprises a heating chamber 807 adapted to collect the saturated solvent. In some exemplary embodiments, the heating chamber 807 is adapted to use waste heat from the system as a heat source or a thermoelectric heater. In some exemplary embodiments, the recycling module 803 comprises a distilled solvent chamber 808 adapted to capture condensed distillate and enable flow into the distilled solvent chamber 808. In some exemplary embodiments, the recycling module comprises a filter media 809 adapted to capture a residue from the saturated solvent or access a cleaning fluid to dissolve the residue.

Figure 81:
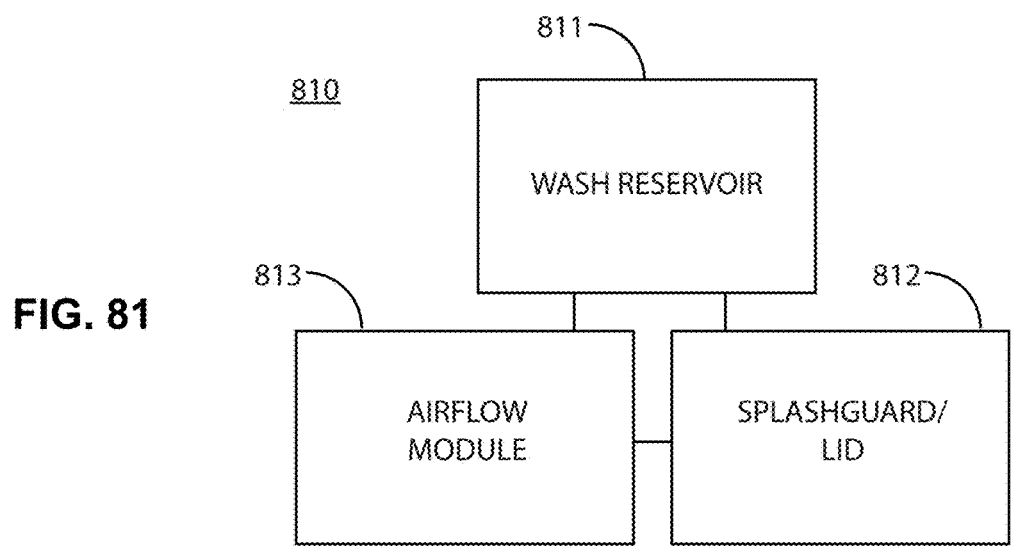
FIG. 81 illustrates a block diagram depicting a system for recycling solvents inside a wash system in accordance with the present invention.

Turning now to the next figure, FIG. 81 illustrates a block diagram depicting a system for recycling solvents inside a wash system in accordance with the present invention.

More specifically, FIG. 81 depicts system 810 for drying off residual resin from 3D-printed objects. System 810 may include: a wash reservoir 811 including a chamber for housing the 3D printed object and containing a wash solvent or liquid solvent adapted to at least partially remove residual residue present in the 3D printer object; one or more air exchange vents provided between a splash guard or a lid 812 of the wash reservoir 811 adapted to act as an air intake or an air exhaust; and an airflow module 813 in fluid communication with the air exchange vents and the chamber, the airflow module 813 adapted to: create a positive or negative air pressure inside the wash reservoir for redirecting airflow to the chamber housing the 3D printed object; and blowing air out of the chamber or blowing air into the chamber to dry the 3D-printed object.

In some exemplary embodiments, the air module 813 includes any one of a centrifugal fan, an axial fan, a blower, an air pump, or a combustion-based thruster. In some exemplary embodiments, the axial fan is connected to the wash chamber via an adapter, thereby redirecting the airflow into the wash reservoir. In some exemplary embodiments, the centrifugal fan is connected to the outside of the wash reservoir via a conduit, thereby redirecting the pressure created at outside to the wash reservoir. In some exemplary embodiments, the combustion-based thruster creates an exothermic reaction configured to facilitate the generation of a pressure gradient. In some exemplary embodiments, the pressure gradient is perpendicular to an opening for the conduit.

In some exemplary embodiments, system 810 further includes one or more barriers adapted to avoid the wash solvent from flowing out of the wash reservoir, including one or more of a conduit barrier, a valve barrier, an air barrier, or one or more flow reducing structures. In some exemplary embodiments, the conduit barrier utilizes a conduit between the air module and the wash reservoir configured to avoid the wash solvent flowing from the wash reservoir to the air module. In some exemplary embodiments, the conduit comprises one or more built-in filters configured to impede the flow of wash solvent. In some exemplary embodiments, the valve barrier utilizes a one-way flow valve configured to restrict the flow of wash solvent and support the flow of air into/from the wash reservoir. In some exemplary embodiments, the one-way flow valve is activated by an external field or electric filed. In some exemplary embodiments, the one-way flow valve is any one of an umbrella valve, a sleeved duckbill valve, a cross-opening valve, or any other soft material valves that are opened through activation using an airflow.

In some exemplary embodiments, the air module 813 creates the positive or negative pressure to act as the air barrier configured to counteract the wash solvent flowing from the wash reservoir to the outside. In some exemplary embodiments, the positive or negative air pressure is regulated on the higher end to avoid the blow off of wash solvent by the air module through the exhaust air vents.

A multi-stage wash system for vat polymerization-based 3D printed parts has been described. The foregoing description of the various exemplary embodiments of the invention has been presented for the purposes of illustration and disclosure. It is not intended to be exhaustive or to limit the invention to the precise form disclosed. Many modifications and variations are possible in light of the above teaching without departing from the spirit of the invention.

What is claimed is:

1. A system for recycling solvents used to clean 3D-printed objects, comprising:
   one or more solvent reservoirs configured to store a solvent for cleaning residual 3D-printing material off of 3D-printed objects coupled to a platform;
   a wash chamber adapted to clean the 3D-printed objects, the wash chamber in fluid communication with the one or more solvent reservoirs configured to receive the solvent from the one or more solvent reservoir;
   an enclosure of the wash chamber adapted to receive the platform in a manner such that receiving the platform substantially seals the enclosure; and
   a solvent recycling module in fluid communication with the one or more solvent reservoirs, configured to:
      receive a saturated solvent from the one or more solvent reservoirs;
      evaporate or condense the saturated solvent to remove residual 3D-printing material from the saturated solvent; and
      return clean solvent to the one or more solvent reservoirs.

2. The system of claim 1, wherein the solvent recycling module is housed in an enclosure externally to a housing of the system or housed in an enclosure integral with the wash chamber or the one or more solvent reservoirs of the system.

3. The system of claim 1, wherein the solvent recycling module comprises a distillation chamber adapted to remove the residual 3D-printing material from the saturated solvent.

4. The system of claim 1, wherein the one or more solvent reservoirs include a saturated solvent reservoir and an unsaturated solvent reservoir.

5. The system of claim 4, wherein the recycling module is coupled to the saturated solvent reservoir.

6. The system of claim 1, wherein the recycling module is adapted to process the saturated solvent as a batch process or as a continuous process.

7. The system of claim 1, wherein the recycling module is adapted to heat and cool the saturated solvent using a Peltier effect.

8. The system of claim 1, wherein the recycling module comprises a heating chamber adapted to collect the saturated solvent.

9. The system of claim 8, wherein the heating chamber is adapted to use waste heat from the system as a heat source or a thermoelectric heater.

10. The system of claim 1, wherein the recycling module comprises a distilled solvent chamber adapted to capture condensed distillate and enable flow into the distilled solvent chamber.

11. The system of claim 1, wherein the recycling module comprises a filter media adapted to capture a residue from the saturated solvent or access a cleaning fluid to dissolve the residue.

12. A system for recycling solvents used to clean 3D-printed objects, comprising:
   one or more solvent reservoirs configured to store a solvent for cleaning residual 3D-printing material off of 3D-printed objects coupled to a platform;
   a wash chamber adapted to clean the 3D-printed objects, the wash chamber in fluid communication with the one or more solvent reservoirs configured to receive the solvent from the one or more solvent reservoir;
   an enclosure of the wash chamber adapted to receive the platform in a manner such that receiving the platform substantially seals the enclosure; and
   a solvent recycling module in fluid communication with the one or more solvent reservoirs, configured to:
      receive a saturated solvent from the one or more solvent reservoirs;
      distill the saturated solvent to remove residual 3D-printing material from the saturated solvent; and
      return clean solvent to the one or more solvent reservoirs.

13. The system of claim 12, wherein the solvent recycling module is housed in an enclosure externally to a housing of the system or housed in an enclosure integral with the wash chamber or the one or more solvent reservoirs of the system.

14. The system of claim 12, wherein the one or more solvent reservoirs include a saturated solvent reservoir and an unsaturated solvent reservoir.

15. The system of claim 12, wherein the recycling module is adapted to process the saturated solvent as a batch process or as a continuous process.

16. The system of claim 12, wherein the recycling module is adapted to heat and cool the saturated solvent using a Peltier effect.

17. The system of claim 12, wherein the recycling module comprises a heating chamber adapted to collect the saturated solvent.

18. The system of claim 17, wherein the heating chamber is adapted to use waste heat from the system as a heat source or a thermoelectric heater.

19. The system of claim 12, wherein the recycling module comprises a filter media adapted to capture a residue from the saturated solvent or access a cleaning fluid to dissolve the residue.

* * * * *